United States Patent
Lu

(10) Patent No.: US 11,257,769 B2
(45) Date of Patent: Feb. 22, 2022

(54) INTEGRATED CIRCUIT LAYOUT, INTEGRATED CIRCUIT, AND METHOD FOR FABRICATING THE SAME

(71) Applicant: Taiwan Semiconductor Manufacturing Company, Ltd., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/869,916

(22) Filed: May 8, 2020

(65) Prior Publication Data
US 2020/0411453 A1 Dec. 31, 2020

Related U.S. Application Data

(60) Provisional application No. 62/868,401, filed on Jun. 28, 2019.

(51) Int. Cl.
| H01L 23/00 | (2006.01) |
| H01L 27/02 | (2006.01) |
| H01L 21/8238 | (2006.01) |
| H01L 27/092 | (2006.01) |
| H01L 23/522 | (2006.01) |

(52) U.S. Cl.
CPC .... *H01L 23/573* (2013.01); *H01L 21/823871* (2013.01); *H01L 23/5226* (2013.01); *H01L 27/0207* (2013.01); *H01L 27/092* (2013.01)

(58) Field of Classification Search
CPC ............ H01L 23/573; H01L 23/5226; H01L 21/823871; H01L 27/0207; H01L 27/092
USPC ........................................................ 257/288
See application file for complete search history.

(56) References Cited

U.S. PATENT DOCUMENTS

| 9,735,242 | B2 * | 8/2017 | Xie ................... H01L 21/76883 |
| 2006/0060926 | A1 | 3/2006 | Christensen et al. |
| 2007/0072385 | A1 | 3/2007 | Donze et al. |
| 2014/0001563 | A1 | 1/2014 | Rashed et al. |
| 2015/0014775 | A1 | 1/2015 | Seo et al. |
| 2017/0110549 | A1 * | 4/2017 | Xie ..................... H01L 27/0886 |
| 2019/0013241 | A1 | 1/2019 | Xie et al. |

FOREIGN PATENT DOCUMENTS

| KR | 10-2015-0007906 A | 1/2015 |
| WO | 03/098692 A1 | 11/2003 |

* cited by examiner

*Primary Examiner* — Tu-Tu V Ho
(74) *Attorney, Agent, or Firm* — Merchant & Gould P.C.

(57) ABSTRACT

An integrated circuit layout is provided. The integrated circuit layout includes: a first active region having a first plurality of field effect transistors (FETs); and an interconnect contacting sources and drains of the first plurality of FETs in the first active region through a first set of contact structures. At least one of the first set of contact structures is electrically non-conductive.

20 Claims, 36 Drawing Sheets

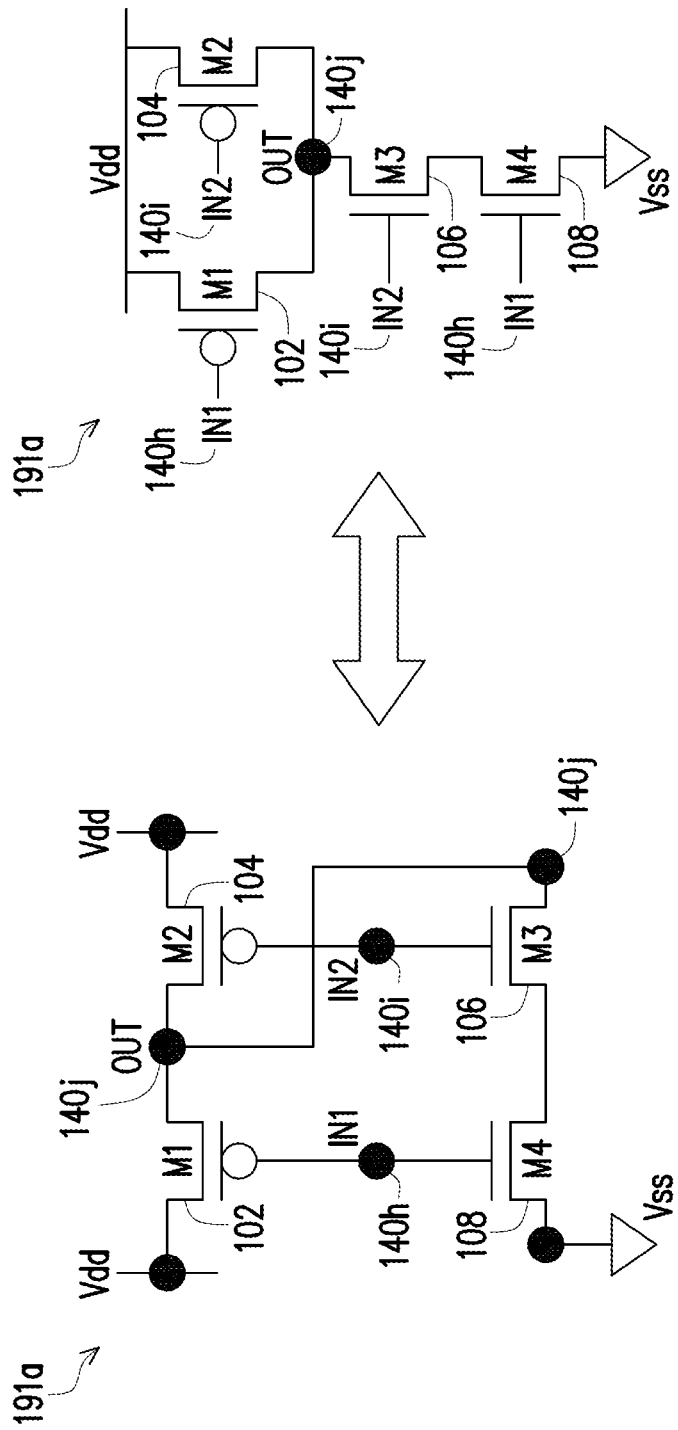

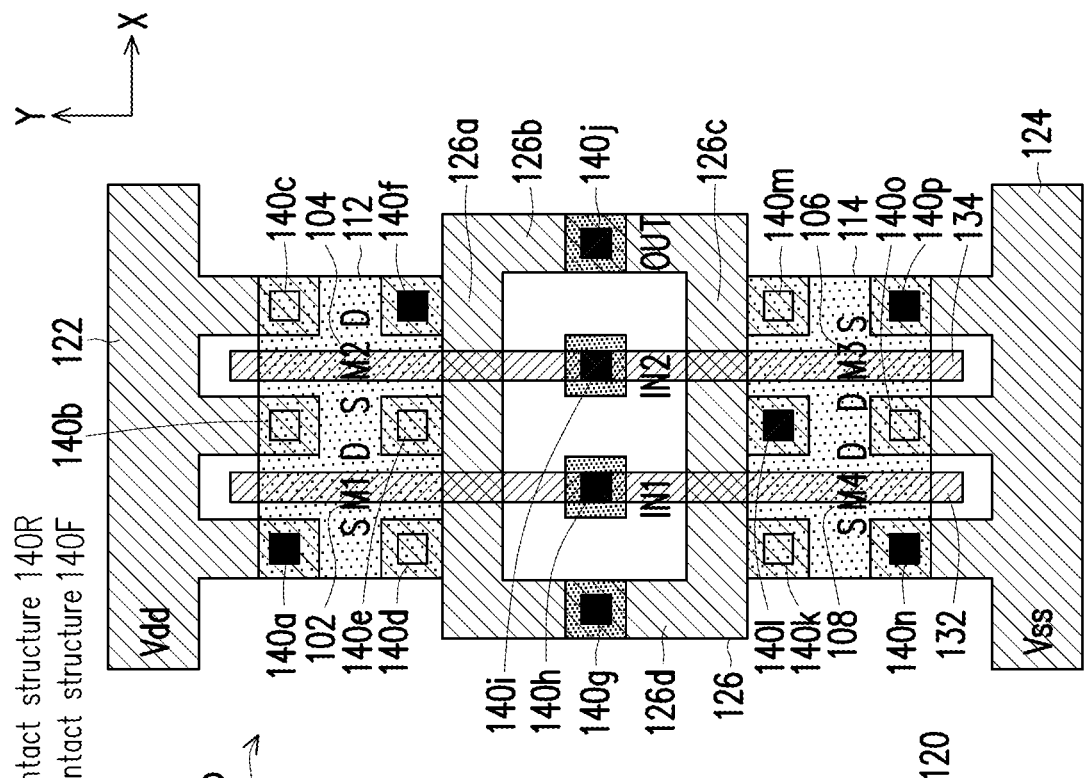
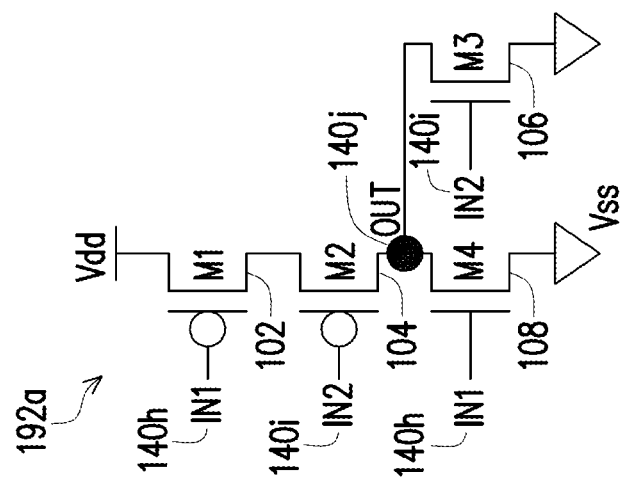
FIG. 2B
FIG. 2A

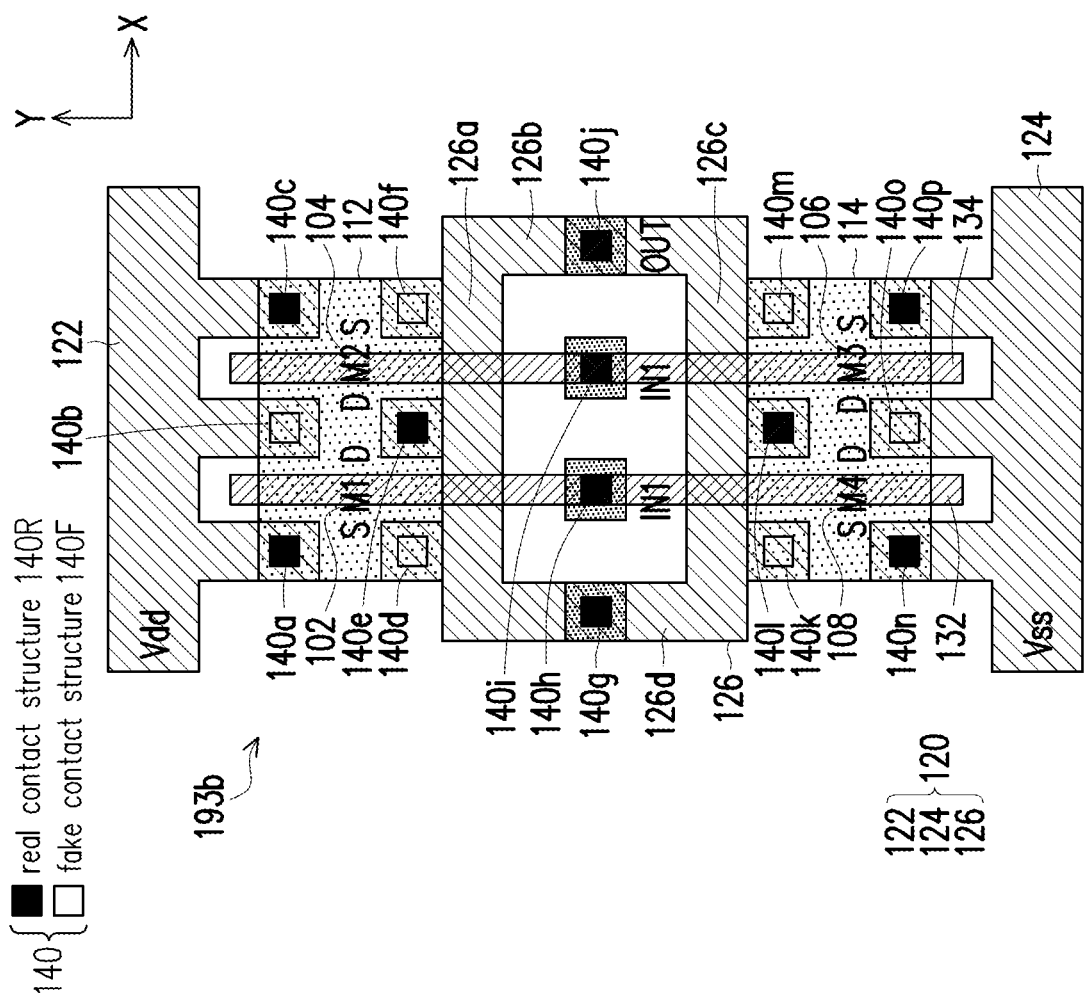
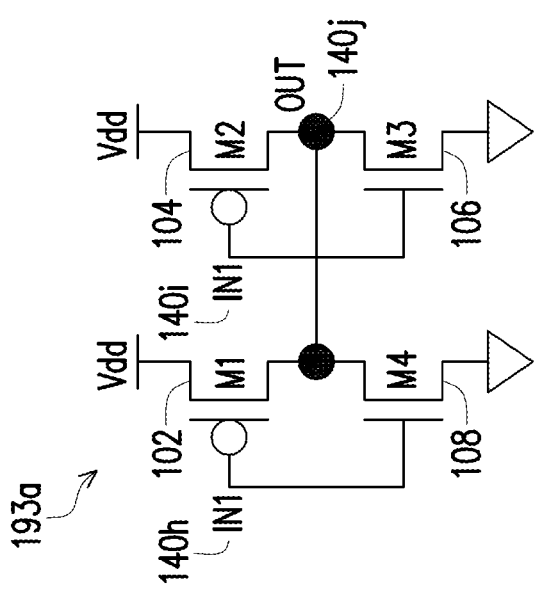
FIG. 3B
FIG. 3A

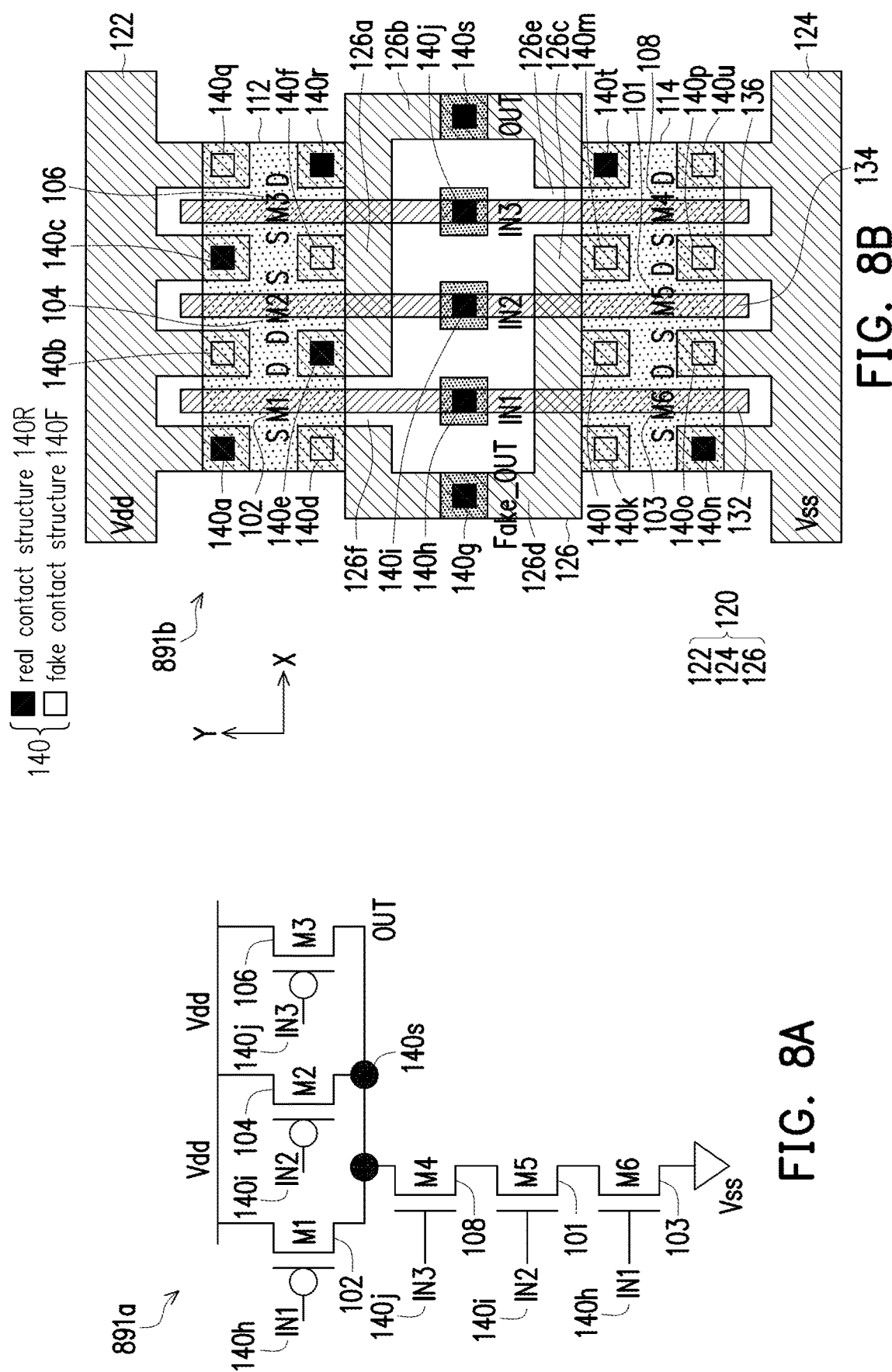

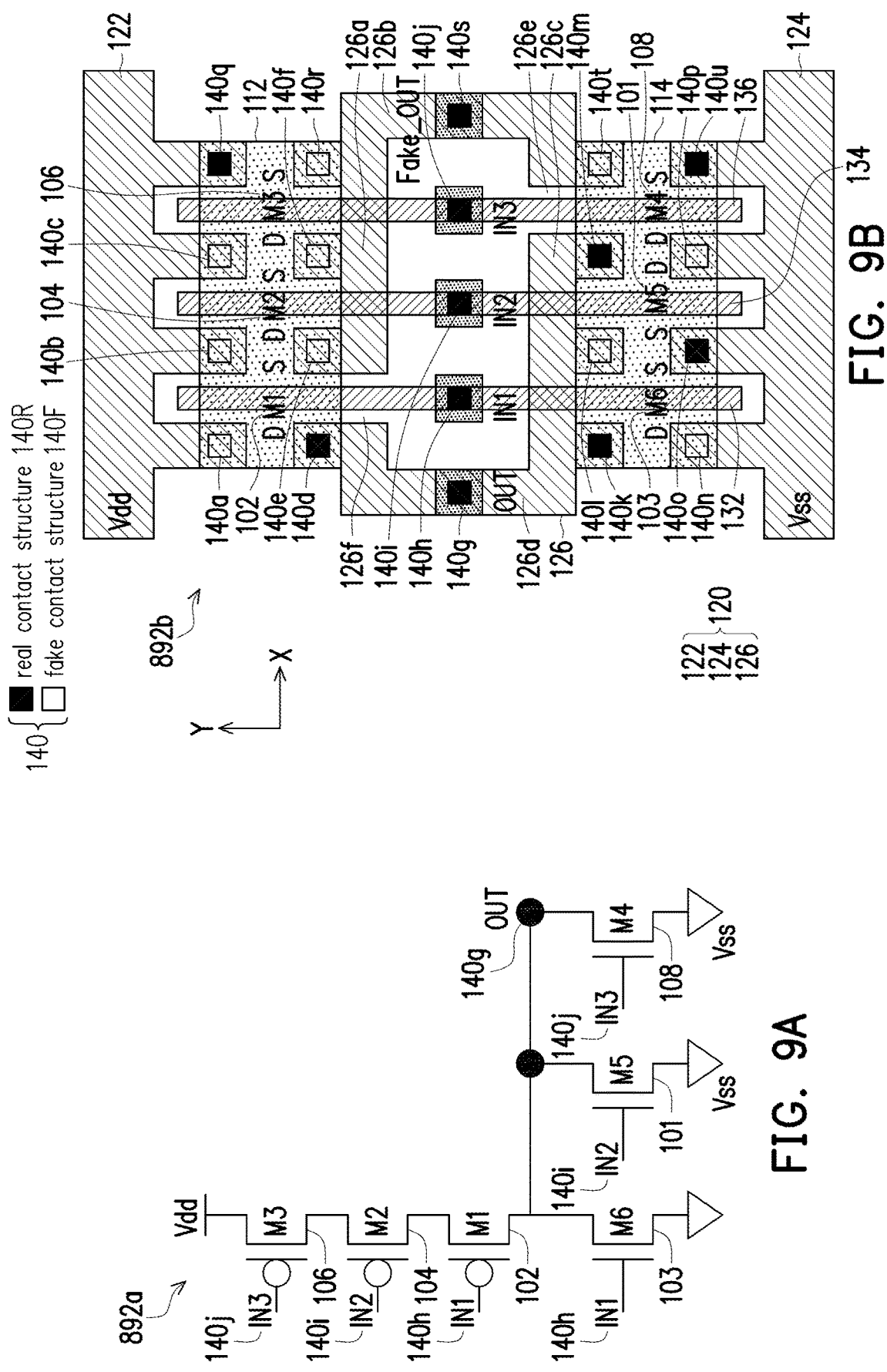

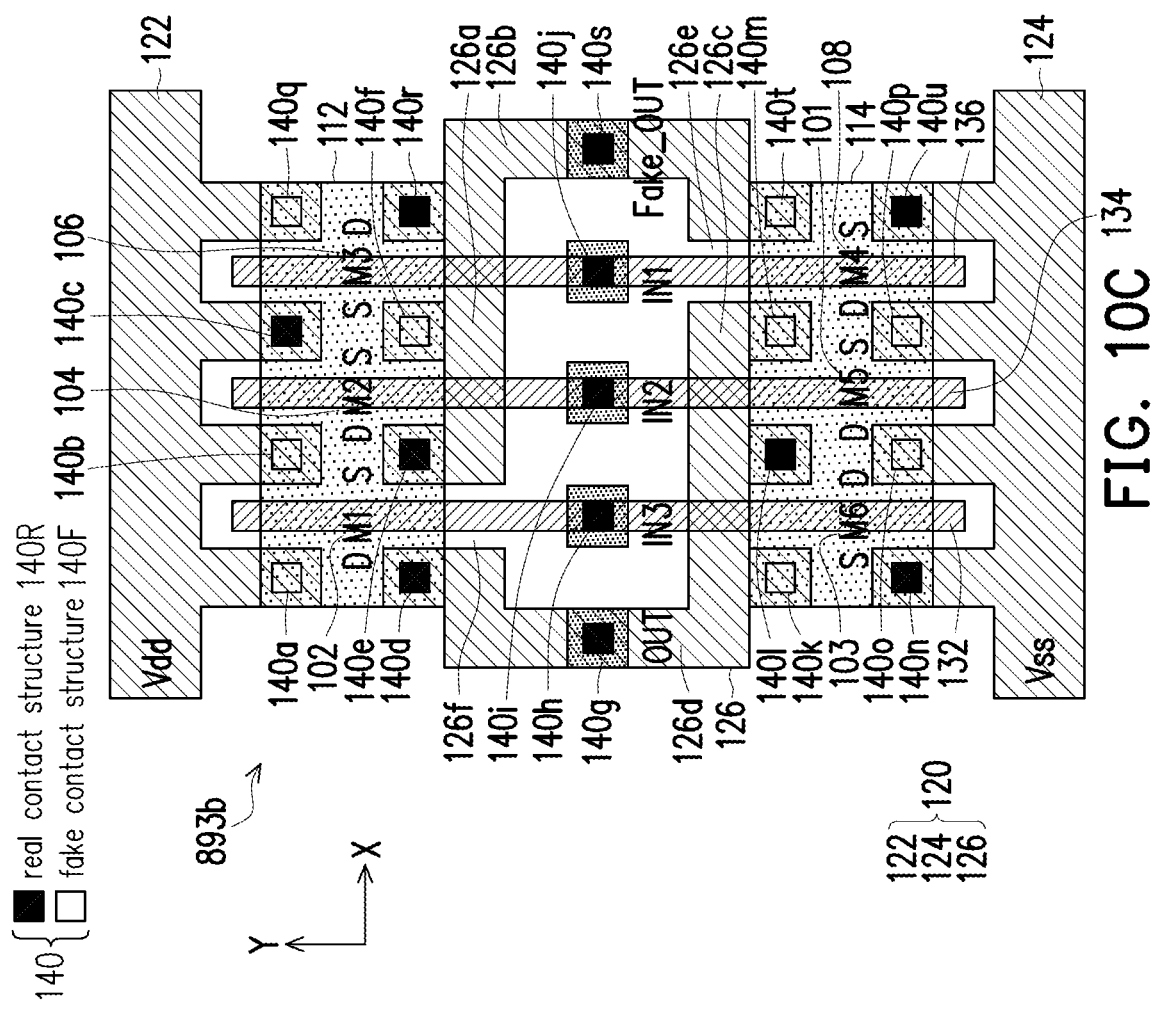
FIG. 10C
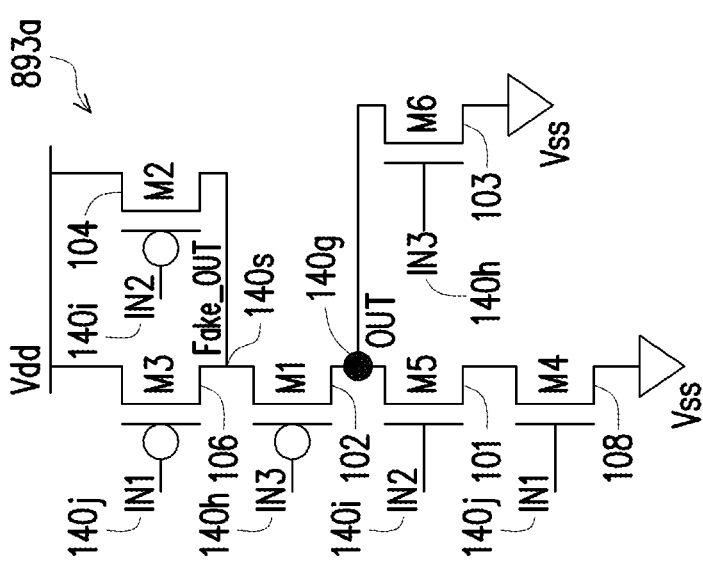
FIG. 10A
FIG. 10B

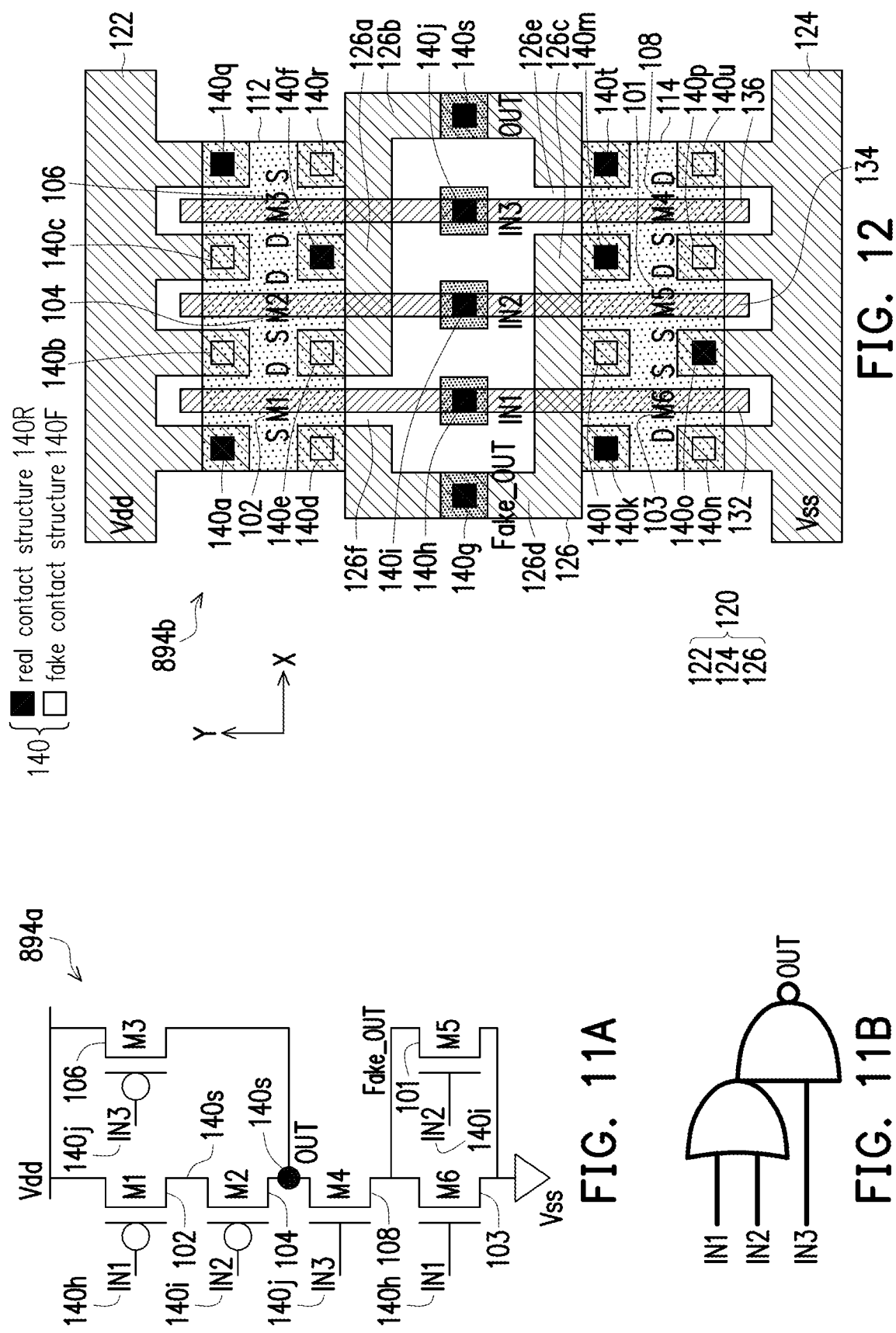

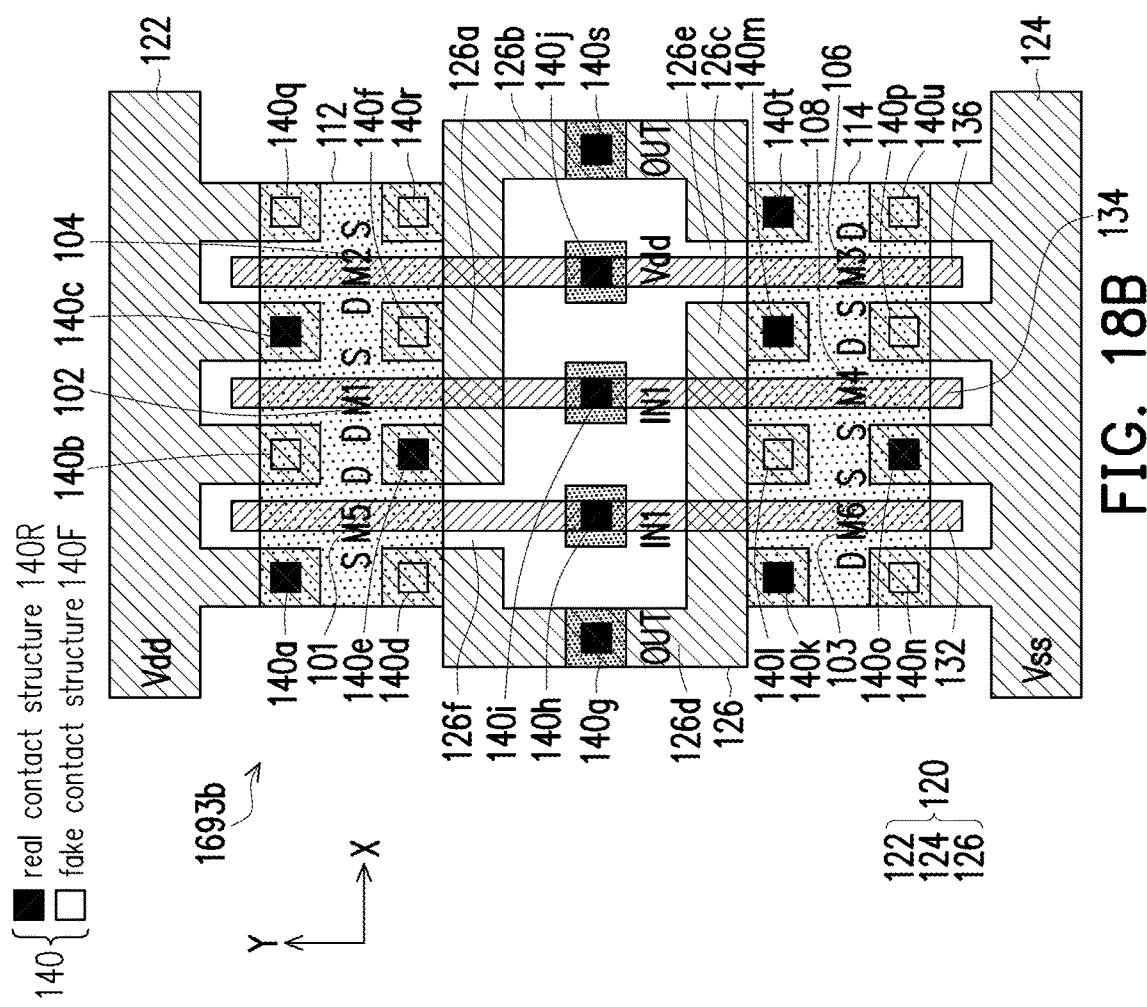
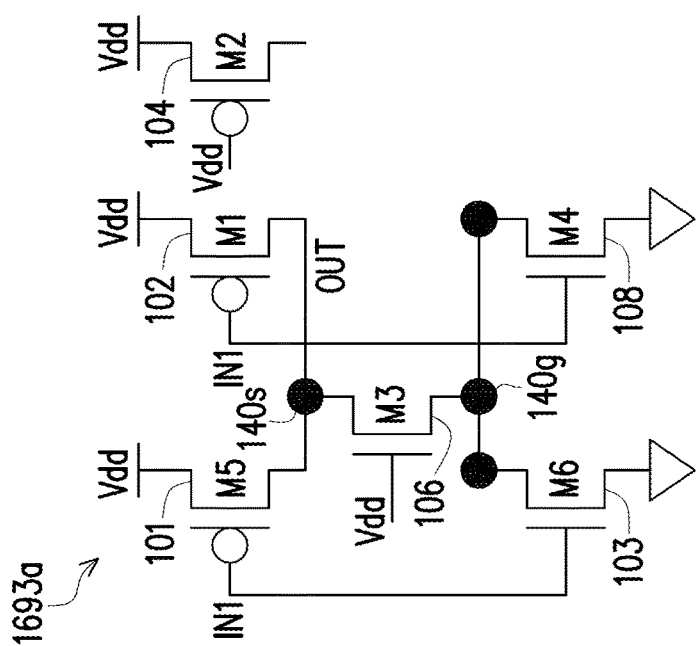
FIG. 18B
FIG. 18A

INTEGRATED CIRCUIT LAYOUT, INTEGRATED CIRCUIT, AND METHOD FOR FABRICATING THE SAME

BACKGROUND

Integrated circuits (IC) are used in a wide variety of electronic devices. Considerable time and expense are spent on design and manufacture of ICs. However, reverse engineering (RE) techniques exist for ICs. RE may be beneficial in some circumstances, such as if used for purposes such as business intelligence, debugging, verification of design and process etc. However, RE can also lead to clones (counterfeits) and IP loss (revenue loss) when RE results in "stealing" designs and intellectual property embedded in ICs. Moreover, RE may lead to security weakness, for example, when counterfeit ICs are produced with added hardware Trojans. If such counterfeit devices are used in a system, potential back-door access may exist. Conventional ICs have no protection against RE, and therefore may be vulnerable to RE attacks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A and FIG. 1B are circuit diagrams of a NAND gate with two inputs in accordance with some embodiments.

FIG. 2A is a circuit diagram of a NOR gate with two inputs in accordance with some embodiments.

FIG. 2B is a layout diagram of the NOR gate of FIG. 2A.

FIG. 3A is a circuit diagram of an inverter with two fingers in accordance with some embodiments.

FIG. 3B is a layout diagram of the inverter of FIG. 3A.

FIG. 8A is a circuit diagram of a NAND gate with three inputs in accordance with some embodiments.

FIG. 8B is a layout diagram of the NAND gate of FIG. 8A.

FIG. 9A is a circuit diagram of a NOR gate with three inputs in accordance with some embodiments.

FIG. 9B is a layout diagram of the NOR gate of FIG. 9A.

FIG. 10A is a circuit diagram of a circuit in accordance with some embodiments.

FIG. 10B is a logical gate equivalent of the circuit of FIG. 10A.

FIG. 10C is a layout diagram of the circuit of FIG. 10A.

FIG. 11A is a circuit diagram of a circuit in accordance with some embodiments.

FIG. 11B is a logical gate equivalent of the circuit of FIG. 11A.

FIG. 12 is a layout diagram of the circuit of FIG. 11A.

FIG. 18A is a circuit diagram of an inverter in accordance with some embodiments.

FIG. 18B is a layout diagram of the inverter of FIG. 18A.

DETAILED DESCRIPTION

Figure 1C:
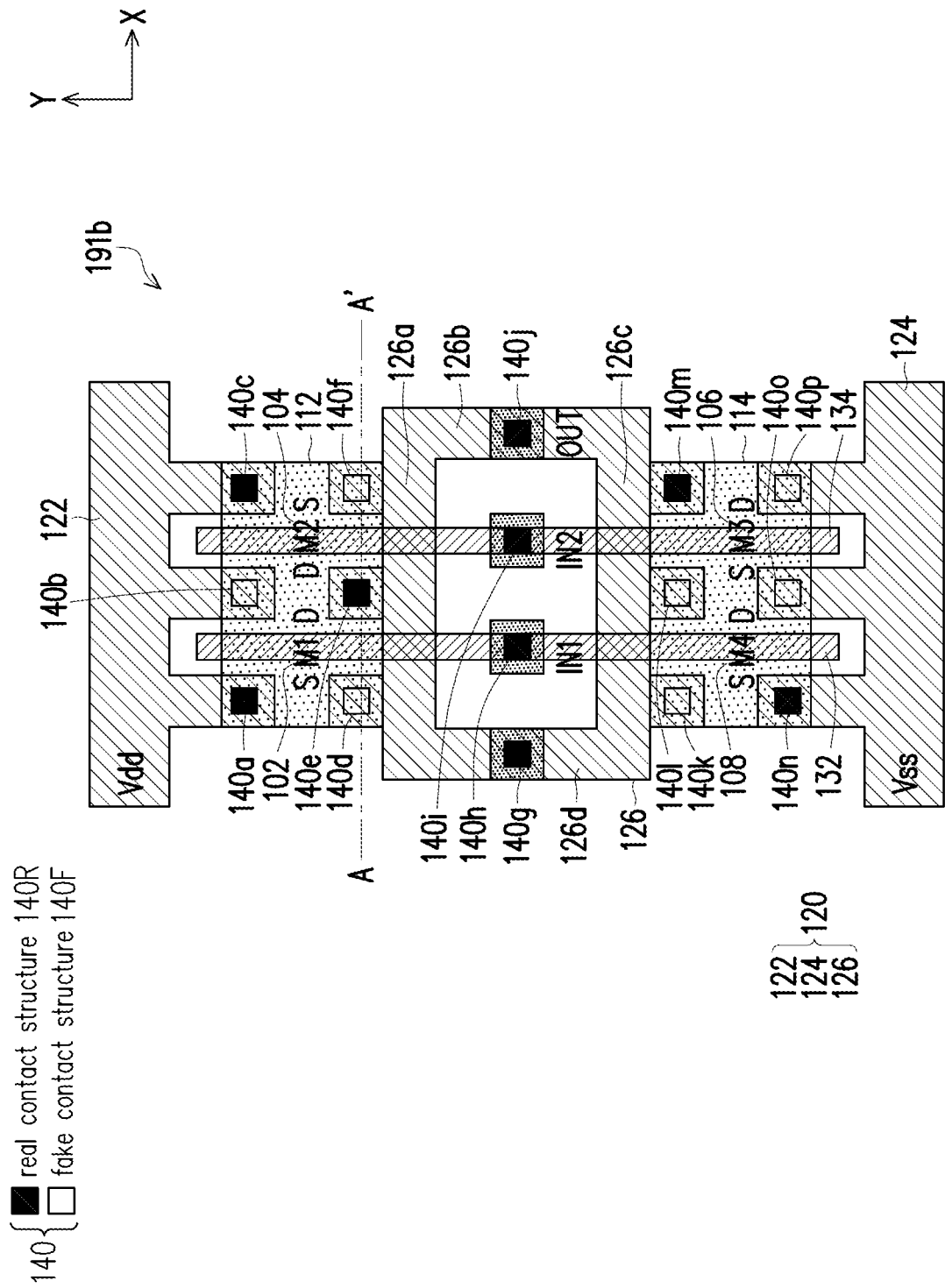
FIG. 1C is a layout diagram of the NAND gate of FIG. 1A and FIG. 1B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some aspects of the present disclosure, reverse engineering (RE) protection is provided by blocking a contact to connect two layers, and by making layout of cells with different functions indistinguishable from each other. Further, for internet of things (IoTs) devices where physical access is easy, cloning may be prevented with back-doors.

Figure 1D:
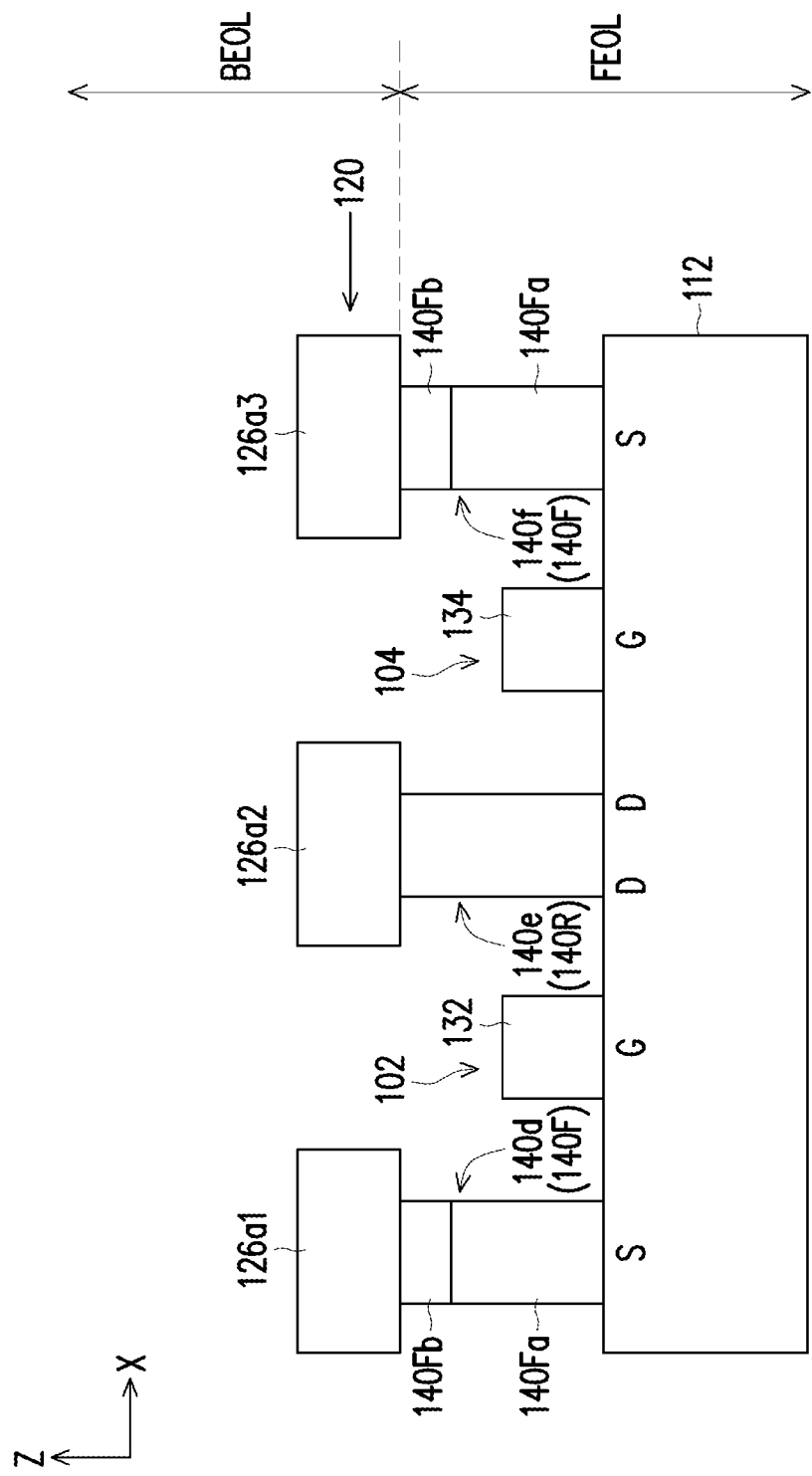
FIG. 1D is a cross sectional diagram corresponding to the line A-A' of the layout of FIG. 1C.

FIGS. 1A to 1D, FIGS. 2A to 2B, and FIGS. 3A to 3B are diagrams illustrating semiconductor devices in accordance with some embodiments. Specifically, FIG. 1A and FIG. 1B are circuit diagrams of a NAND gate with two inputs in accordance with some embodiments. FIG. 1C is a layout diagram of the NAND gate of FIG. 1A and FIG. 1B. FIG. 1D is a cross sectional diagram corresponding to the line A-A' of the layout of FIG. 1C. FIG. 2A is a circuit diagram of a NOR gate with two inputs in accordance with some embodiments. FIG. 2B is a layout diagram of the NOR gate of FIG. 2A. FIG. 3A is a circuit diagram of an inverter with two fingers in accordance with some embodiments. FIG. 3B is a layout diagram of the inverter of FIG. 3A. The layouts shown in FIG. 1C, FIG. 2B, and FIG. 3B are indistinguishable from each other by using a combination of functional contact structures and non-functional contact structures, even though the illustrated devices implement different functionality. Functional contact structures are contact structures that are electrically conductive, whereas non-functional contact structures are contact structures that are electrically non-conductive. The terms "functional contact structure" and "real contact structure" are used interchangeably throughout this document. Likewise, the terms "non-functional contact structure" and "fake contact structure" are used interchangeably throughout this document. It should be noted that any vertical interconnect structure such as any vertical interconnect access (via) structure, which electrically connect two or more metal or interconnect layers, may incorporate the inventive features throughout this document.

Referring to FIGS. 1A to 1B, which are functionally equivalent to one another, a NAND gate 191a with two inputs includes a p-type field-effect transistor (FET) M1 102, a p-type FET M2 104, an n-type FET M3 106, and an n-type FET M4 108. In one example, the p-type FET M1 102 and the p-type FET M2 104 are PMOS FETs, whereas the n-type FET M3 106 and the n-type FET M4 108 are NMOS FETs. In another example, the p-type FET M1 102 and the p-type FET M2 104 are p-type FinFETs, whereas the n-type FET M3 106 and the n-type FET M4 108 are n-type FinFETs.

Sources of the FET M1 102 and the FET M2 104 are coupled to a first power supply (e.g., a Vdd). Drains of the FET M1 102 and the FET M2 104 are coupled together at an output ("OUT") node 140j. A drain of the FET M3 106 is also coupled to the OUT node 140j. A source of the FET M3 106 is coupled to a drain of the FET M4 108. A source of the FET M4 108 is coupled to a second power supply (e.g., a Vss). Gates of the FET M1 102 and the FET M4 108 are coupled together at a first input ("IN1") node 140h. Gates of the FET M2 104 and the FET M3 106 are coupled together at a second input ("IN2") node 140i.

When the IN1 node 140h is at logical low ("0") and the IN2 node 140i is at logical low, the OUT node 140j is at logical high ("1"). When the IN1 node 140h is at logical low and the IN2 node 140i is at logical high, the OUT node 140j is at logical high. When the IN1 node 140h is at logical high and the IN2 node 140i is at logical low, the OUT node 140j is at logical high. When the IN1 node 140h is at logical high and the IN2 node 140i is at logical high, the OUT node 140j is at logical low. Thus, the NAND gate 191a implements a NAND logic operation.

Referring to FIG. 1C, a NAND gate layout 191b includes, among other things, the FET M1 102, the FET M2 104, the FET M3 106, and the FET M4 108. The FET M1 102 and the FET M2 104 are disposed in a p-type active ("POD") region 112. The FET M3 106 and the FET M4 108 are disposed in a n-type active ("NOD") region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140h. The gate strip 134 serves as both the gate of the FET M2 104 and the gate of the FET M3 106. In other words, both the gate of the FET M2 104 and the gate of the FET M3 106 are coupled together at the IN2 node 140i.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. As such, the drains of the FET M1 102 and the FET M2 104 are coupled together.

Likewise, the source of the FET M4 108 is located at the left of the gate strip 132 in the X direction. The drain of the FET M4 108 is located at the right of the gate strip 132 in the X direction. The source of the FET M3 106 is located at the left of the gate strip 134 in the X direction. The drain of the FET M3 106 is located at the right of the gate strip 134 in the X direction. As such, the source of the FET M3 106 is coupled to the drain of the FET M4 108.

A metal track 122, a metal track 124, and an interconnect (e.g., a metal ring) 126 are disposed in a metal layer 120 over the POD region 112, the NOD region 114, and the gate strips 132 and 134. The metal track 122 is capable of providing the Vdd to the sources and/or drains of the FET M1 102 and the FET M2 104 through vertically extended contact structures 140a, 140b, and 140c as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140*n*, 140*o*, and 140*p* as well as metal track fingers of the metal track 124 extending in the Y direction.

In the illustrated example, the metal ring 126 has a rectangular shape and includes four sides 126*a*, 126*b*, 126*c*, and 126*d*. It should be noted that the metal ring 126 may have other shapes. Moreover, in the illustrated example the metal ring 126 is formed in a single metal layer, though in other examples the metal ring 126 may be formed in multiple metal layers. The side 126*a* of the metal ring 126 is capable of connecting the sources and/or drains of the FET M1 102 and the FET M2 104 through vertically extended contact structures 140*d*, 140*e*, and 140*f* as well as metal ring fingers of the metal ring 126 extending in the Y direction. The side 126*c* of the metal ring 126 is capable of connecting the sources and/or drains of the FET M3 106 and the FET M4 108 through vertically extended contact structures 140*k*, 140*l*, and 140*m* as well as metal ring fingers of the metal ring 126 extending in the Y direction. A vertically extended contact structure 140*j* is disposed over the side 126*b* of the metal ring 126 as the OUT node 140*j*. A vertically extended contact structure 140*g* is disposed over the side 126*d* of the metal ring 126.

A vertically extended contact structure 140*h* is disposed over the gate strip 132 as the IN1 node 140*h*. A vertically extended contact structure 140*i* is disposed over the gate strip 134 as the IN2 node 140*i*.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, and 140*p* (collectively as "140") can be classified into real contact structures 140R and fake contact structures 140F. The real contact structures 140R and the fake contact structures 140F are indistinguishable from each other for RE protection. In this illustrated example of FIG. 1C, the real contact structures 140R include the contact structures 140*a*, 140*c*, 140*e*, 140*g*, 140*h*, 140*i*, 140*j*, 140*m*, and 140*n*. The real contact structures 140R are in contact with and electrically conductively connect with the sources and the drains of the FETs (e.g., the source of the FET M1 102). In some embodiments, the real contact structures 140R are conductive vertical interconnect accesses (VIAs). In this illustrated example of FIG. 1C, the fake contact structures 140F include the contact structures 140*b*, 140*d*, 140*f*, 140*k*, 140*l*, 140*o*, and 140*p*. The fake contact structures 140F are in contact with the sources and the drains of the FETs (e.g., the source of the FET M1 102), but they are not electrically conductive. In other words, the fake contact structures 140F may appear the same as the real contact structures 140R but function differently, thus achieving anti-RE camouflage. An example of how fake contact structures 140F are fabricated will be described in detail below with reference to FIG. 28.

Specifically, the sources of the FET M1 102 and the FET M2 104 are coupled to the Vdd because the contact structures 140*a* and 140*c* are real contact structures 140R. The drains of the FET M1 102 and the FET M2 104 are coupled together to the metal ring 126 because the contact structure 140*e* is a real contact structure 140R. The drain of the FET M3 106 is also coupled to the metal ring 126 because the contact structure 140*m* is a real contact structure 140R. The source of the FET M4 108 is coupled to the Vss because the contact structure 140*n* is a real contact structure 140R. As such, the NAND gate layout 191*b* can fulfil the NAND logic operation of the NAND gate 191*a*.

It should be noted that the NAND gate layout 191*b* is for illustration. Each category (e.g., the gate strip 132 and the gate strip 134; the metal track 122, the metal track 124, and the metal ring 126; the POD region 112 and the NOD region 114) of the NAND gate layout 191*b* may correspond to multiple masks. For example, the POD region 112 may correspond to one mask while the NOD region 112 may correspond to another mask.

Referring to FIG. 1D, the FET M1 102 and the FET M2 104 are disposed in the POD region 112. The gate strips 132 and 134 extend in the Y direction and are disposed over the POD region 112. The source of the FET M1 102 is located at the left of the gate strip 132 in the X direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. As such, the drains of the FET M1 102 and the FET M2 104 are coupled together.

The interconnect (e.g., the metal ring) 126 is disposed in the metal layer 120 over the POD region 112. Specifically, the side 126*a* of the metal ring 126 has metal ring fingers 126*a*1, 126*a*2, and 126*a*3 extending in the Y direction. The source of the FET M1 102 is in contact with the metal ring finger 126*a*1 through the contact structure 140*d*. The drains of the FET M1 102 and the FET M2 104 are in contact with the metal ring finger 126*a*2 through the contact structure 140*e*. The source of the FET M2 104 is in contact with the metal ring finger 126*a*3 through the contact structure 140*f*. As stated above, the contact structure 140*e* is a real (i.e., functional) contact structure 140R, whereas the contact structures 140*d* and 140*f* are fake (i.e., non-functional) contact structures 140F. The contact structure 140*e* is electrically conductive, thus the drains of the FET M1 102 and the FET M2 104 are electrically connected to the metal ring finger 126*a*2. The contact structures 140*d* and 140*f* both include a first contact layer 140Fa and a second contact layer 140Fb deposited above the first contact layer 140Fa. The first contact layers 140Fa are electrically conductive, whereas the second contact layers 140Fb are electrically non-conductive. As such, the sources of the FET M1 102 and the FET M2 104 are in contact with but not electrically connected to the metal ring fingers 126*a*1 and 126*a*3, respectively. Therefore, the contact structures 140*d*, 140*e*, and 140*f* are indistinguishable from each other, although only the contact structure 140*e* functions as a real contact structure 140R.

In the illustrated example of FIG. 1D, the gate strips 132 and 134 as well as the contact structures 140*d*, 140*e*, and 140*f* are located in the front-end-of-line (FEOL), while the metal ring fingers 126*a*1, 126*a*2, and 126*a*3 are located in the back-end-of-line (BEOL). It should be noted that FIG. 1D is schematically illustrated to show various components and layers of the NAND gate layout 191*b*, and may not reflect each structure, layer, connection, etc. of the actual NAND gate layout 191*b*. FIG. 1D is not proportional. An example of how fake contact structures 140F are fabricated will be described in detail below with reference to FIG. 28.

The side 126*c* of the metal ring 126 is capable of connecting the sources and/or drains of the FET M3 106 and the FET M4 108 through vertically extended contact structures 140*k*, 140*l*, and 140*m* as well as metal ring fingers of the metal ring 126 extending in the Y direction. A vertically extended contact structure 140*j* is disposed over the side 126*b* of the metal ring 126 as the OUT node 140*j*. A vertically extended contact structure 140*g* is disposed over the side 126*d* of the metal ring 126.

A vertically extended contact structure 140h is disposed over the gate strip 132 as the IN1 node 140h. A vertically extended contact structure 140i is disposed over the gate strip 134 as the IN2 node 140i.

The contact structures 140a, 140b, 140c, 140d, 140e, 140f, 140g, 140h, 140i, 140j, 140k, 140l, 140m, 140n, 140o, and 140p (collectively as "140") can be classified into real contact structures 140R and fake contact structures 140F. The real contact structures 140R and the fake contact structures 140F are indistinguishable from each other for RE protection. In this illustrated example of FIG. 1C, the real contact structures 140R include the contact structures 140a, 140c, 140e, 140g, 140h, 140i, 140j, 140m, and 140n. The real contact structures 140R are in contact with and electrically conductively connect with the sources and the drains of the FETs (e.g., the source of the FET M1 102). In some embodiments, the real contact structures 140R are conductive vertical interconnect accesses (VIAs). In this illustrated example of FIG. 1C, the fake contact structures 140F include the contact structures 140b, 140d, 140f, 140k, 140l, 140o, and 140p. The fake contact structures 140F are in contact with the sources and the drains of the FETs (e.g., the source of the FET M1 102), but they are not electrically conductive. In other words, the fake contact structures 140F may appear the same as the real contact structures 140R but function differently, thus achieving anti-RE camouflage. An example of how fake contact structures 140F are fabricated will be described in detail below with reference to FIG. 28.

Specifically, the sources of the FET M1 102 and the FET M2 104 are coupled to the Vdd because the contact structures 140a and 140c are real contact structures 140R. The drains of the FET M1 102 and the FET M2 104 are coupled together to the metal ring 126 because the contact structure 140e is a real contact structure 140R. The drain of the FET M3 106 is also coupled to the metal ring 126 because the contact structure 140m is a real contact structure 140R. The source of the FET M4 108 is coupled to the Vss because the contact structure 140n is a real contact structure 140R. As such, the NAND gate layout 191b can fulfil the NAND logic operation of the NAND gate 191a.

Referring to FIG. 2A, a NOR gate 192a with two inputs includes a p-type FET M1 102, a p-type FET M2 104, an n-type FET M3 106, and an n-type FET M4 108. In one example, the p-type FET M1 102 and the p-type FET M2 104 are PMOS FETs, whereas the n-type FET M3 106 and the n-type FET M4 108 are NMOS FETs. In another example, the p-type FET M1 102 and the p-type FET M2 104 are p-type FinFETs, whereas the n-type FET M3 106 and the n-type FET M4 108 are n-type FinFETs.

A source of the FET M1 102 is coupled to a first power supply (e.g., a Vdd). A drain of the FET M1 102 is coupled to a source of the FET M2 104. A drain of the FET M2 104 is coupled to an output ("OUT") node 140j. Sources of the FET M3 106 and the FET M4 108 are coupled to a second power supply (e.g., a Vss). Drains of the FET M3 106 and the FET M4 108 are coupled together at the OUT node 140j. Gates of the FET M1 102 and the FET M4 108 are coupled together at a first input ("IN1") node 140h. Gates of the FET M2 104 and the FET M3 106 are coupled together at a second input ("IN2") node 140i.

When the IN1 node 140h is at logical low and the IN2 node 140i is at logical low, the OUT node 140j is at logical high. When the IN1 node 140h is at logical low and the IN2 node 140i is at logical high, the OUT node 140j is at logical low. When the IN1 node 140h is at logical high and the IN2 node 140i is at logical low, the OUT node 140j is at logical low. When the IN1 node 140h is at logical high and the IN2 node 140i is at logical high, the OUT node 140j is at logical low. Thus, the NOR gate 191a implements a NOR logic operation.

Referring to FIG. 2B, a NOR gate layout 192b includes, among other things, the FET M1 102, the FET M2 104, the FET M3 106, and the FET M4 108. The FET M1 102 and the FET M2 104 are disposed in a POD region 112. The FET M3 106 and the FET M4 108 are disposed in a NOD region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140h. The gate strip 134 serves as both the gate of the FET M2 104 and the gate of the FET M3 106. In other words, both the gate of the FET M2 104 and the gate of the FET M3 106 are coupled together at the IN2 node 140i.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. As such, the drain of the FET M1 102 is coupled to the source of the FET M2 104.

Likewise, the source of the FET M4 108 is located at the left of the gate strip 132 in the X direction. The drain of the FET M4 108 is located at the right of the gate strip 132 in the X direction. The source of the FET M3 106 is located at the right of the gate strip 134 in the X direction. The drain of the FET M3 106 is located at the left of the gate strip 134 in the X direction. As such, the drains of the FET M3 106 and the FET M4 108 are coupled together.

A metal track 122, a metal track 124, and a metal ring 126 are disposed in a metal layer 120 over the POD region 112, the NOD region 114, and the gate strips 132 and 134. The metal track 122 is capable of providing the Vdd to the sources and/or drains of the FET M1 102 and the FET M2 104 through vertically extended contact structures 140a, 140b, and 140c as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140n, 140o, and 140p as well as metal track fingers of the metal track 124 extending in the Y direction.

In the illustrated example, the metal ring 126 has a rectangular shape and includes four sides 126a, 126b, 126c, and 126d. It should be noted that the metal ring 126 may have other shapes. The side 126a of the metal ring 126 is capable of connecting the sources and/or drains of the FET M1 102 and the FET M2 104 through vertically extended contact structures 140d, 140e, and 140f as well as metal ring fingers of the metal ring 126 extending in the Y direction. The side 126c of the metal ring 126 is capable of connecting the sources and/or drains of the FET M3 106 and the FET M4 108 through vertically extended contact structures 140k, 140l, and 140m as well as metal ring fingers of the metal ring 126 extending in the Y direction. A vertically extended contact structures 140j is disposed over the side 126b of the metal ring 126 as the OUT node 140j. A vertically extended contact structure 140g is disposed over the side 126d of the metal ring 126.

A vertically extended contact structure 140*h* is disposed over the gate strip 132 as the IN1 node 140*h*. A vertically extended contact structure 140*i* is disposed over the gate strip 134 as the IN2 node 140*i*.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, and 140*p* (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*a*, 140*f*, 140*g*, 140*h*, 140*i*, 140*j*, 140*l*, 140*n*, and 140*p*; the fake contact structures 140F include the contact structures 140*b*, 140*c*, 140*d*, 140*e*, 140*k*, 140*m*, and 140*o*.

Specifically, the source of the FET M1 102 is coupled to the Vdd because the contact structure 140*a* is a real contact structure 140R. The drain of the FET M2 104 is coupled to the metal ring 126 because the contact structure 140*f* is a real contact structure 140R. The drains of the FET M3 106 and the FET M4 108 are coupled together also to the metal ring 126 because the contact structure 140*l* is a real contact structure 140R. The sources of the FET M4 108 and the FET M3 106 are coupled to the Vss because the contact structures 140*n* and 140*p* are real contact structures 140R. As such, the NOR gate layout 192*b* can fulfil the NOR logic operation of the NOR gate 192*a*.

Referring to FIG. 3A, an inverter 193*a* with two input fingers includes a p-type FET M1 102, a p-type FET M2 104, an n-type FET M3 106, and an n-type FET M4 108. In one example, the p-type FET M1 102 and the p-type FET M2 104 are PMOS FETs, whereas the n-type FET M3 106 and the n-type FET M4 108 are NMOS FETs. In another example, the p-type FET M1 102 and the p-type FET M2 104 are p-type FinFETs, whereas the n-type FET M3 106 and the n-type FET M4 108 are n-type FinFETs.

A source of the FET M1 102 is coupled to a first power supply (e.g., a Vdd). A source of the FET M4 108 is coupled to a second power supply (e.g., a Vss). A drain of the FET M1 102 and a drain of the FET M4 108 are coupled together to an output ("OUT") node 140*j*. A gate of the FET M1 102 and a gate of the FET M4 108 are coupled together to a first input ("IN1") node 140*h*. Likewise, a source of the FET M2 104 is coupled to the Vdd. A source of the FET M3 106 is coupled to the Vss. A drain of the FET M2 104 and a drain of the FET M3 106 are coupled together to the OUT node 140*j*. A gate of the FET M2 104 and a gate of the FET M3 106 are coupled together to a second input (also called "IN1") node 140*i*. In other words, signals applied to the first input node 140*h* and the second input node 140*i* are the same.

When the IN1 nodes 140*h* and 140*i* are at logical low, the OUT node 140*j* is at logical high. When the IN1 nodes 140*h* and 140*i* are at logical high, the OUT node 140*j* is at logical low. Thus, the inverter 193*a* implements a NOT logic operation.

Referring to FIG. 3B, an inverter layout 193*b* includes, among other things, the FET M1 102, the FET M2 104, the FET M3 106, and the FET M4 108. The FET M1 102 and the FET M2 104 are disposed in a POD region 112. The FET M3 106 and the FET M4 108 are disposed in a NOD region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140*h*. The gate strip 134 serves as both the gate of the FET M2 104 and the gate of the FET M3 106. In other words, both the gate of the FET M2 104 and the gate of the FET M3 106 are coupled together at the IN1 node 140*i*.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M4 108 is located at the left of the gate strip 132 in the X direction. The drain of the FET M4 108 is located at the right of the gate strip 132 in the X direction.

Likewise, the source of the FET M2 104 is located at the right of the gate strip 134 in the X direction. The drain of the FET M2 104 is located at the left of the gate strip 134 in the X direction. The source of the FET M3 106 is located at the right of the gate strip 134 in the X direction. The drain of the FET M3 106 is located at the left of the gate strip 134 in the X direction.

A metal track 122, a metal track 124, and a metal ring 126 are disposed in a metal layer 120 over the POD region 112, the NOD region 114, and the gate strips 132 and 134. The metal track 122 is capable of providing the Vdd to the sources and/or drains of the FET M1 102 and the FET M2 104 through vertically extended contact structures 140*a*, 140*b*, and 140*c* as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140*n*, 140*o*, and 140*p* as well as metal track fingers of the metal track 124 extending in the Y direction.

In the illustrated example, the metal ring 126 has a rectangular shape and includes four sides 126*a*, 126*b*, 126*c*, and 126*d*. It should be noted that the metal ring 126 may have other shapes. The side 126*a* of the metal ring 126 is capable of connecting the sources and/or drains of the FET M1 102 and the FET M2 104 through vertically extended contact structures 140*d*, 140*e*, and 140*f* as well as metal ring fingers of the metal ring 126 extending in the Y direction. The side 126*c* of the metal ring 126 is capable of connecting the sources and/or drains of the FET M3 106 and the FET M4 108 through vertically extended contact structures 140*k*, 140*l*, and 140*m* as well as metal ring fingers of the metal ring 126 extending in the Y direction. A vertically extended contact structures 140*j* is disposed over the side 126*b* of the metal ring 126 as the OUT node 140*j*. A vertically extended contact structure 140*g* is disposed over the side 126*d* of the metal ring 126.

A vertically extended contact structure 140*h* is disposed over the gate strip 132 as the IN1 node 140*h*. A vertically extended contact structure 140*i* is disposed over the gate strip 134 as the IN1 node 140*i*. In other words, both the vertically extended contact structure 140*h* and the vertically extended contact structure 140*i* are input nodes of the inverter 193*a* with two input fingers.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, and 140*p* (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*a*, 140*c*, 140*e*, 140*g*, 140*h*, 140*i*, 140*j*, 140*l*, 140*n*, and 140*p*; the fake contact structures 140F include the contact structures 140b, 140d, 140f, 140k, 140m, and 140o.

Specifically, the source of the FET M1 102 is coupled to the Vdd because the contact structure 140a is a real contact structure 140R. The source of the FET M2 104 is coupled to the Vdd because the contact structure 140c is a real contact structure 140R. The drains of the FET M1 102 and the FET M2 104 are coupled together to the metal ring 126 because the contact structure 140e is a real contact structure 140R. The sources of the FET M3 106 and the FET M4 108 are coupled to the Vss because the contact structures 140n and 140p are real contact structures 140R. The drains of the FET M3 106 and the FET M4 108 are coupled together to the metal ring 126 because the contact structure 140l is a real contact structure 140R. As such, the inverter layout 193b can fulfil the NOT logic operation of the inverter 193a.

Figure 4:
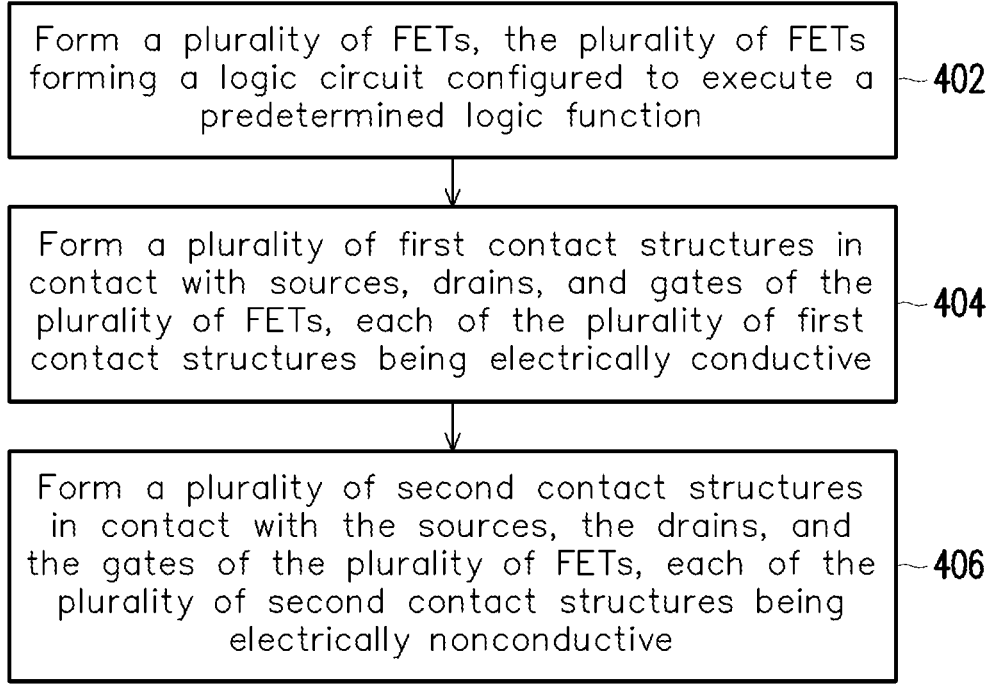
FIG. 4 is a flow diagram illustrating a method for fabricating an integrated circuit.

FIG. 4 is a flow diagram illustrating a method for fabricating an integrated circuit. At step 402, a plurality of FETs (e.g., the FET M1 102, the FET M2 104, the FET M3 106, and the FET M4 108 in FIG. 1C) are formed. At step 404, a plurality of first contact structures (e.g., the real contact structures 140R) are formed. The plurality of first contacts are in contact with sources, drains, and gates of the plurality of FETs. The plurality of first contact structures are electrically conductive. At step 406, a plurality of second contact structures (e.g., the fake contact structures 140F) are formed. The plurality of second contact structures are in contact with the sources, the drains, and the gates of the plurality of FETs. The plurality of second contact structures are electrically non-conductive. It should be noted that although the flow chart provided herein shows a specific order of method steps, it is understood that the order of these steps may differ from what is depicted. Also two or more steps may be performed concurrently or with partial concurrence. It is understood that all such variations are within the scope of the disclosure. For example, in one embodiment, step 404 precedes step 406. In another embodiment, step 406 precedes step 404.

Figure 5B:
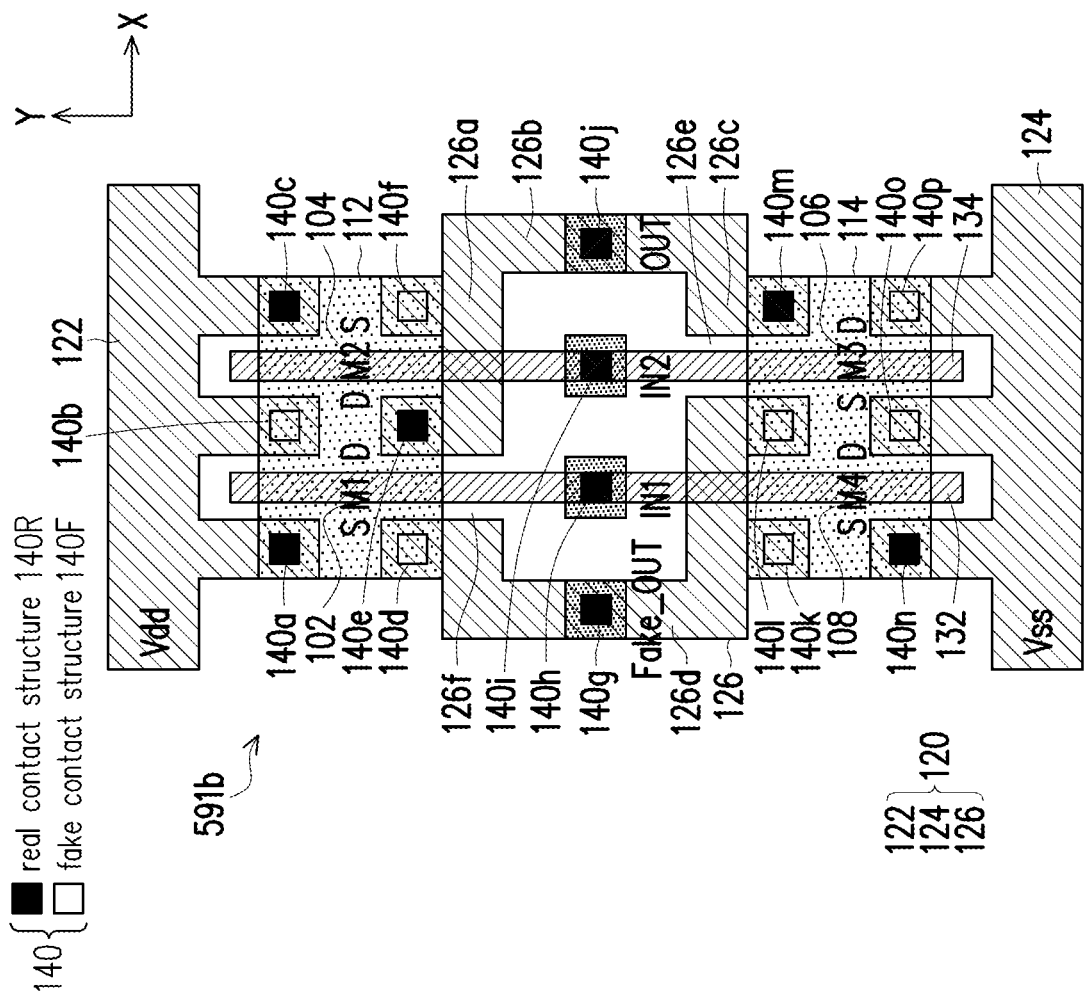
FIG. 5B is a layout diagram of the NAND gate of FIG. 5A.
Figure 5A:
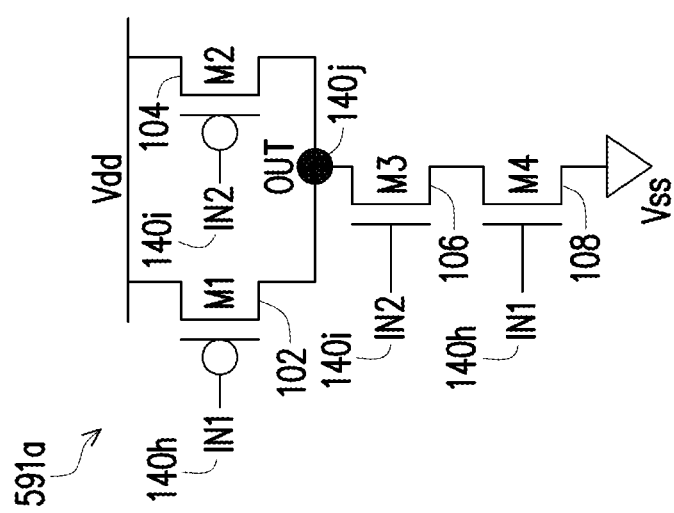
FIG. 5A is a circuit diagram of a NAND gate with two inputs in accordance with some embodiments.
Figure 6B:
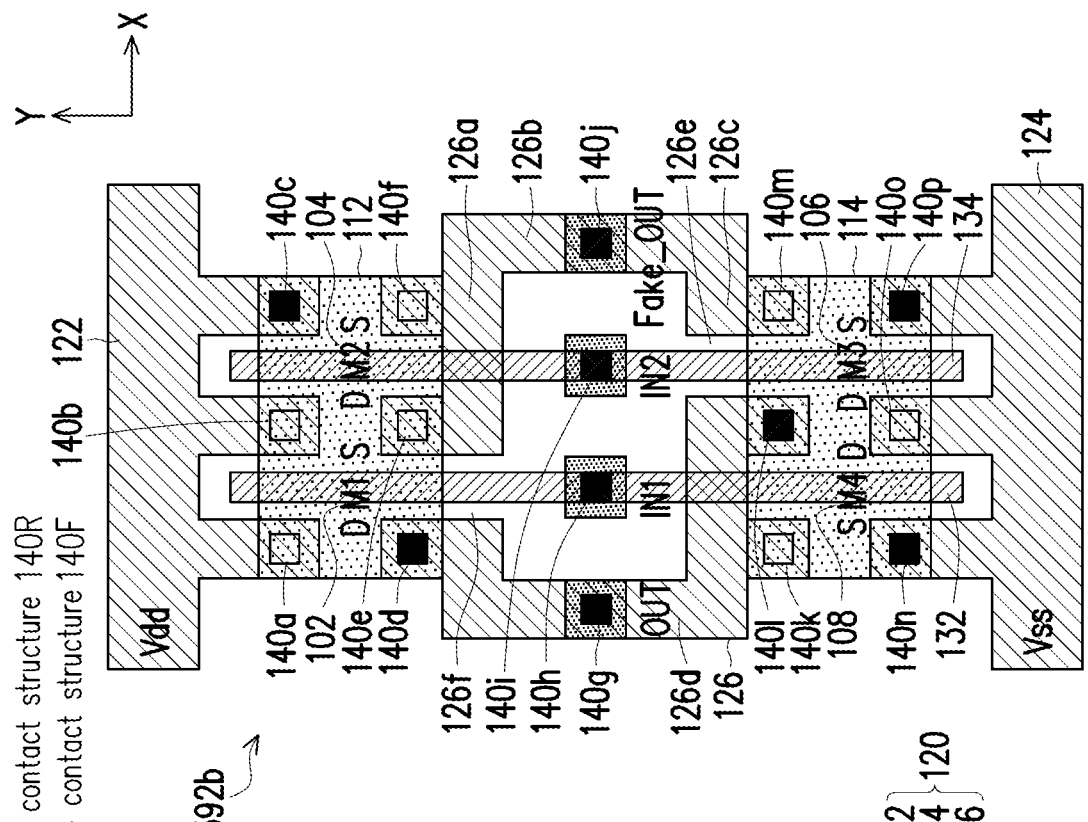
FIG. 6B is a layout diagram of the NOR gate of FIG. 6A.
Figure 6A:
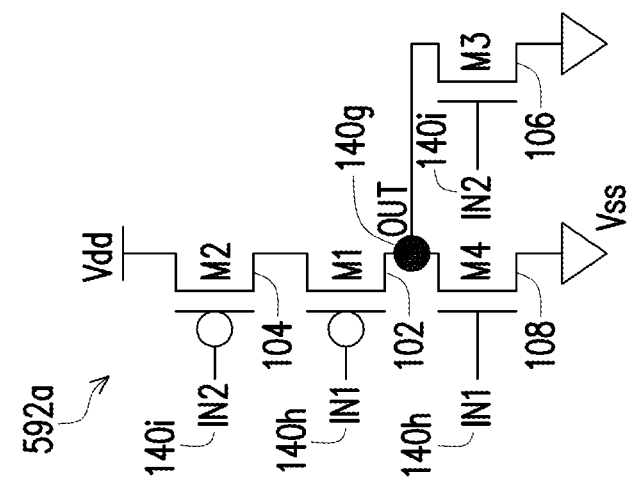
FIG. 6A is a circuit diagram of a NOR gate with two inputs in accordance with some embodiments.
Figure 7B:
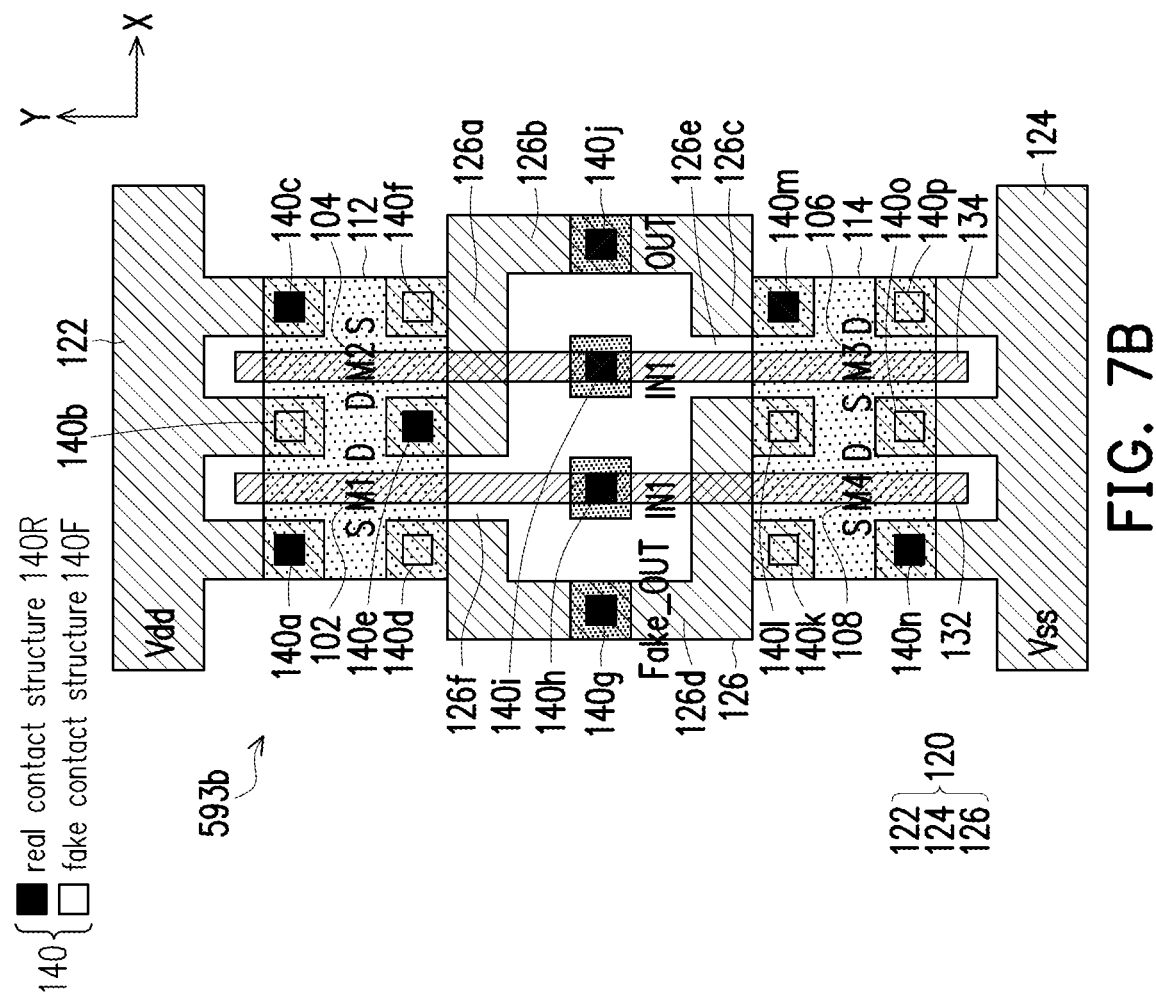
FIG. 7B is a layout diagram of the inverter of FIG. 7A.
Figure 7A:
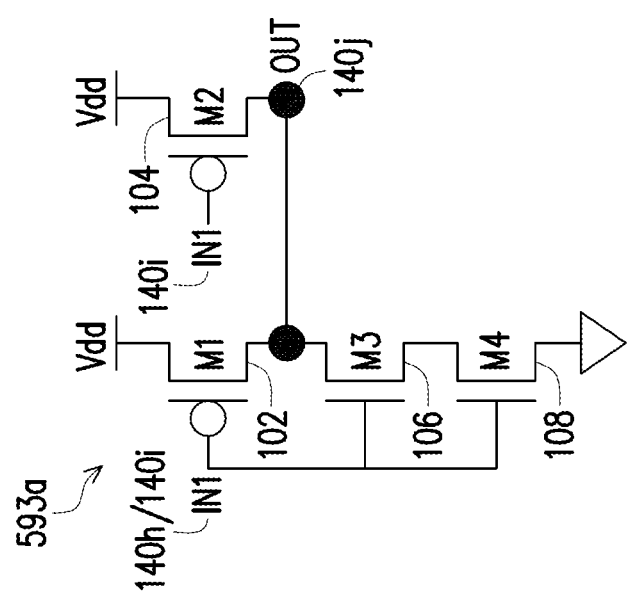
FIG. 7A is a circuit diagram of an inverter in accordance with some embodiments.

FIGS. 5A to 5B, FIGS. 6A to 6B, and FIGS. 7A to 7B are diagrams illustrating semiconductor devices in accordance with some embodiments. Specifically, FIG. 5A is a circuit diagram of a NAND gate with two inputs in accordance with some embodiments. FIG. 5B is a layout diagram of the NAND gate of FIG. 5A. FIG. 6A is a circuit diagram of a NOR gate with two inputs in accordance with some embodiments. FIG. 6B is a layout diagram of the NOR gate of FIG. 6A. FIG. 7A is a circuit diagram of an inverter in accordance with some embodiments. FIG. 7B is a layout diagram of the inverter of FIG. 7A. The layouts shown in FIG. 5B, FIG. 6B, and FIG. 7B are indistinguishable from each other by using a combination of real contact structures and fake contact structures. Additionally, the ring is broken into two pieces which adds complexity to the layout for RE protection.

Referring to FIG. 5A, a NAND gate 591a with two inputs includes a p-type FET M1 102, a p-type FET M2 104, an n-type FET M3 106, and an n-type FET M4 108. In one example, the p-type FET M1 102 and the p-type FET M2 104 are PMOS FETs, whereas the n-type FET M3 106 and the n-type FET M4 108 are NMOS FETs. In another example, the p-type FET M1 102 and the p-type FET M2 104 are p-type FinFETs, whereas the n-type FET M3 106 and the n-type FET M4 108 are n-type FinFETs.

Sources of the FET M1 102 and the FET M2 104 are coupled to a first power supply (e.g., a Vdd). Drains of the FET M1 102 and the FET M2 104 are coupled together at an output ("OUT") node 140j. A drain of the FET M3 106 is also coupled to the OUT node 140j. A source of the FET M3 106 is coupled to a drain of the FET M4 108. A source of the FET M4 108 is coupled to a second power supply (e.g., a Vss). Gates of the FET M1 102 and the FET M4 108 are coupled together at a first input ("IN1") node 140h. Gates of the FET M2 104 and the FET M3 106 are coupled together at a second input ("IN2") node 140i.

When the IN1 node 140h is at logical low ("0") and the IN2 node 140i is at logical low, the OUT node 140j is at logical high ("1"). When the IN1 node 140h is at logical low and the IN2 node 140i is at logical high, the OUT node 140j is at logical high. When the IN1 node 140h is at logical high and the IN2 node 140i is at logical low, the OUT node 140j is at logical high. When the IN1 node 140h is at logical high and the IN2 node 140i is at logical high, the OUT node 140j is at logical low. Thus, the NAND gate 591a implements a NAND logic operation.

Referring to FIG. 5B, a NAND gate layout 591b includes, among other things, the FET M1 102, the FET M2 104, the FET M3 106, and the FET M4 108. The FET M1 102 and the FET M2 104 are disposed in a POD region 112. The FET M3 106 and the FET M4 108 are disposed in a NOD region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140h. The gate strip 134 serves as both the gate of the FET M2 104 and the gate of the FET M3 106. In other words, both the gate of the FET M2 104 and the gate of the FET M3 106 are coupled together at the IN2 node 140i.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. As such, the drains of the FET M1 102 and the FET M2 104 are coupled together.

Likewise, the source of the FET M4 108 is located at the left of the gate strip 132 in the X direction. The drain of the FET M4 108 is located at the right of the gate strip 132 in the X direction. The source of the FET M3 106 is located at the left of the gate strip 134 in the X direction. The drain of the FET M3 106 is located at the right of the gate strip 134 in the X direction. As such, the source of the FET M3 106 is coupled to the drain of the FET M4 108.

A metal track 122, a metal track 124, and a metal ring 126 are disposed in a metal layer 120 over the POD region 112, the NOD region 114, and the gate strips 132 and 134. The metal track 122 is capable of providing the Vdd to the sources and/or drains of the FET M1 102 and the FET M2 104 through vertically extended contact structures 140a, 140b, and 140c as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140n, 140o, and 140p as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102 and the FET M2 104 through vertically extended contact structures 140d, 140e, and 140f as well as metal ring fingers of the metal ring 126 extending in the Y direction. The side 126c of the metal ring 126 is capable of connecting the sources and/or drains of the FET M3 106 and the FET M4 108 through vertically extended contact structures 140k, 140l, and 140m as well as metal ring fingers of the metal ring 126 extending in the Y direction. A vertically extended contact structures 140j is disposed over the side 126b of the metal ring 126 as the OUT node 140j. A vertically extended contact structure 140g is disposed over the side 126d of the metal ring 126 as a Fake_OUT node 140g. The OUT node 140j and the Fake_OUT node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i.

The contact structures 140a, 140b, 140c, 140d, 140e, 140f, 140g, 140h, 140i, 140j, 140k, 140l, 140m, 140n, 140o, and 140p (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140c, 140e, 140g, 140h, 140i, 140j, 140m, and 140n; the fake contact structures 140F include the contact structures 140b, 140d, 140f, 140k, 140l, 140o, and 140p.

Specifically, the sources of the FET M1 102 and the FET M2 104 are coupled to the Vdd because the contact structures 140a and 140c are real contact structures 140R. The drains of the FET M1 102 and the FET M2 104 are coupled together to the metal ring 126 because the contact structure 140e is a real contact structure 140R. The drain of the FET M3 106 is also coupled to the metal ring 126 because the contact structure 140m is a real contact structure 140R. The source of the FET M4 108 is coupled to the Vss because the contact structure 140n is a real contact structure 140R. As such, the NAND gate layout 591b can fulfil the NAND logic operation of the NAND gate 591a. Additionally, since the contact structures 140d, 140k, and 140l are fake contact structures 140F, the Fake_OUT node 140g does not have a real output signal.

Referring to FIG. 6A, a NOR gate 592a with two inputs includes a p-type FET M2 104, a p-type FET M1 102, an n-type FET M3 106, and an n-type FET M4 108. In one example, the p-type FET M2 104 and the p-type FET M1 102 are PMOS FETs, whereas the n-type FET M3 106 and the n-type FET M4 108 are NMOS FETs. In another example, the p-type FET M2 104 and the p-type FET M1 102 are p-type FinFETs, whereas the n-type FET M3 106 and the n-type FET M4 108 are n-type FinFETs.

A source of the FET M2 104 is coupled to a first power supply (e.g., a Vdd). A drain of the FET M2 104 is coupled to a source of the FET M1 102. A drain of the FET M1 102 is coupled to an output ("OUT") node 140g. Sources of the FET M3 106 and the FET M4 108 are coupled to a second power supply (e.g., a Vss). Drains of the FET M3 106 and the FET M4 108 are coupled together at the OUT node 140g. Gates of the FET M2 104 and the FET M3 106 are coupled together at a second input ("IN2") node 140i. Gates of the FET M1 102 and the FET M4 108 are coupled together at a first input ("IN1") node 140h.

When the IN1 node 140h is at logical low and the IN2 node 140i is at logical low, the OUT node 140g is at logical high. When the IN1 node 140h is at logical low and the IN2 node 140i is at logical high, the OUT node 140g is at logical low. When the IN1 node 140h is at logical high and the IN2 node 140i is at logical low, the OUT node 140g is at logical low. When the IN1 node 140h is at logical high and the IN2 node 140i is at logical high, the OUT node 140g is at logical low. Thus, the NOR gate 592a implements a NOR logic operation.

Referring to FIG. 6B, a NOR gate layout 592b includes, among other things, the FET M2 104, the FET M1 102, the FET M3 106, and the FET M4 108. The FET M2 104 and the FET M1 102 are disposed in a POD region 112. The FET M3 106 and the FET M4 108 are disposed in a NOD region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140h. The gate strip 134 serves as both the gate of the FET M2 104 and the gate of the FET M3 106. In other words, both the gate of the FET M2 104 and the gate of the FET M3 106 are coupled together at the IN2 node 140i. The OUT node 140j and the Fake_OUT node 140g are separated from each other and indistinguishable from each other for RE protection.

The source of the FET M2 104 is located at the right of the gate strip 134 in an X direction. In this illustrated example, the X direction is perpendicular to the Y direction. The drain of the FET M2 104 is located at the left of the gate strip 134 in the X direction. The source of the FET M1 102 is located at the right of the gate strip 132 in the X direction. The drain of the FET M1 102 is located at the left of the gate strip 132 in the X direction. As such, the drain of the FET M2 104 is coupled to the source of the FET M1 102.

Likewise, the source of the FET M4 108 is located at the left of the gate strip 132 in the X direction. The drain of the FET M4 108 is located at the right of the gate strip 132 in the X direction. The source of the FET M3 106 is located at the right of the gate strip 134 in the X direction. The drain of the FET M3 106 is located at the left of the gate strip 134 in the X direction. As such, the drains of the FET M3 106 and the FET M4 108 are coupled together.

A metal track 122, a metal track 124, and a metal ring 126 are disposed in a metal layer 120 over the POD region 112, the NOD region 114, and the gate strips 132 and 134. The metal track 122 is capable of providing the Vdd to the sources and/or drains of the FET M2 104 and the FET M1 102 through vertically extended contact structures 140a, 140b, and 140c as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140n, 140o, and 140p as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M2 104 and the FET M1 102 through vertically extended contact structures 140d, 140*e*, and 140*f* as well as metal ring fingers of the metal ring 126 extending in the Y direction. The side 126*c* of the metal ring 126 is capable of connecting the sources and/or drains of the FET M3 106 and the FET M4 108 through vertically extended contact structures 140*k*, 140*l*, and 140*m* as well as metal ring fingers of the metal ring 126 extending in the Y direction. A vertically extended contact structure 140*j* is disposed over the side 126*b* of the metal ring 126 as a Fake_OUT node 140*j*. A vertically extended contact structure 140*g* is disposed over the side 126*d* of the metal ring 126 as the OUT node 140*g*. The OUT node 140*g* and the Fake_OUT node 140*j* are separated from each other and indistinguishable from each other for RE protection.

A vertically extended contact structure 140*h* is disposed over the gate strip 132 as the IN1 node 140*h*. A vertically extended contact structure 140*i* is disposed over the gate strip 134 as the IN2 node 140*i*.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, and 140*p* (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*c*, 140*d*, 140*g*, 140*h*, 140*i*, 140*j*, 140*l*, 140*n*, and 140*p*; the fake contact structures 140F include the contact structures 140*a*, 140*b*, 140*e*, 140*f*, 140*k*, 140*m*, and 140*o*.

Specifically, the source of the FET M2 104 is coupled to the Vdd because the contact structure 140*c* is a real contact structure 140R. The drain of the FET M1 102 is coupled to the metal ring 126 because the contact structure 140*d* is a real contact structure 140R. The drains of the FET M3 106 and the FET M4 108 are coupled together also to the metal ring 126 because the contact structure 140*k* is a real contact structure 140R. The sources of the FET M4 108 and the FET M3 106 are coupled to the Vss because the contact structures 140*n* and 140*p* are real contact structures 140R. As such, the NOR gate layout 592*b* can fulfil the NOR logic operation of the NOR gate 592*a*. Additionally, since the contact structures 140*e*, 140*f*, and 140*m* are fake contact structures 140F, the Fake_OUT node 140*j* does not have a real output signal.

Referring to FIG. 7A, an inverter 593*a* includes a p-type FET M1 102, a p-type FET M2 104, an n-type FET M3 106, and an n-type FET M4 108. In one example, the p-type FET M1 102 and the p-type FET M2 104 are PMOS FETs, whereas the n-type FET M3 106 and the n-type FET M4 108 are NMOS FETs. In another example, the p-type FET M1 102 and the p-type FET M2 104 are p-type FinFETs, whereas the n-type FET M3 106 and the n-type FET M4 108 are n-type FinFETs.

A source of the FET M1 102 is coupled to a first power supply (e.g., a Vdd). A source of the FET M2 104 is coupled to the Vdd. A drain of the FET M1 102 and a drain of the FET M2 104 are coupled together to an output ("OUT") node 140*j*. A source of the FET M4 108 is coupled to a second power supply (e.g., a Vss). A drain of the FET M4 108 is coupled to a source of the FET M3 106. A drain of the FET M3 106 is also coupled to the OUT node 140*j*. A gate of the FET M1 102 and a gate of the FET M4 108 are coupled together to a first input ("IN1") node 140*h*. A gate of the FET M2 104 and a gate of the FET M3 106 are coupled together to a second input (also called "IN1") node 140*i*. In other words, signals applied to the first input node 140*h* and the second input node 140*i* are the same.

When the IN1 nodes 140*h* and 140*i* are at logical low, the OUT node 140*j* is at logical high. When the IN1 nodes 140*h* and 140*i* are at logical high, the OUT node 140*j* is at logical low. Thus, the inverter 593*a* implements a NOT logic operation.

Referring to FIG. 7B, an inverter layout 593*b* includes, among other things, the FET M1 102, the FET M3 106, the FET M2 104, and the FET M4 108. The FET M1 102 and the FET M2 104 are disposed in a POD region 112. The FET M3 106 and the FET M4 108 are disposed in a NOD region 114. Two gate strips 132 and 134 extend in a Y direction and are disposed over both the POD region 112 and the NOD region 114. The gate strip 132 serves as both the gate of the FET M1 102 and the gate of the FET M4 108. In other words, both the gate of the FET M1 102 and the gate of the FET M4 108 are coupled together at the IN1 node 140*h*. The gate strip 134 serves as both the gate of the FET M2 104 and the gate of the FET M3 106. In other words, both the gate of the FET M2 104 and the gate of the FET M3 106 are coupled together at the IN1 node 140*i*.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M4 108 is located at the left of the gate strip 132 in the X direction. The drain of the FET M4 108 is located at the right of the gate strip 132 in the X direction.

Likewise, the source of the FET M2 104 is located at the right of the gate strip 134 in the X direction. The drain of the FET M2 104 is located at the left of the gate strip 134 in the X direction. The source of the FET M3 106 is located at the left of the gate strip 134 in the X direction. The drain of the FET M3 106 is located at the right of the gate strip 134 in the X direction.

A metal track 122, a metal track 124, and a metal ring 126 are disposed in a metal layer 120 over the POD region 112, the NOD region 114, and the gate strips 132 and 134. The metal track 122 is capable of providing the Vdd to the sources and/or drains of the FET M1 102 and the FET M2 104 through vertically extended contact structures 140*a*, 140*b*, and 140*c* as well as metal track fingers of the metal track 122 extending in the Y direction. The vertical direction is perpendicular to the X-Y plane. The metal track 124 is capable of providing the Vss to the sources and/or drains of the FET M3 106 and the FET M4 108 through vertically extended contact structures 140*n*, 140*o*, and 140*p* as well as metal track fingers of the metal track 124 extending in the Y direction.

In the illustrated example, the metal ring 126 has a rectangular shape and includes four sides 126*a*, 126*b*, 126*c*, and 126*d*. The metal ring 126 has an opening 126*e* at the side 126*c* and an opening 126*f* at the side 126*a*. In other words, the metal ring 126 are broken into two half rings. It should be noted that the metal ring 126 may have other shapes. The side 126*a* of the metal ring 126 is capable of connecting the sources and/or drains of the FET M1 102 and the FET M2 104 through vertically extended contact structures 140*d*, 140*e*, and 140*f* as well as metal ring fingers of the metal ring 126 extending in the Y direction. The side 126*c* of the metal ring 126 is capable of connecting the sources and/or drains of the FET M3 106 and the FET M4 108 through vertically extended contact structures 140*k*, 140*l*, and 140*m* as well as metal ring fingers of the metal ring 126 extending in the Y direction. A vertically extended contact structure 140*j* is disposed over the side 126*b* of the metal ring 126 as the OUT node 140*j*. A vertically extended contact structure 140*g* is disposed over the side 126*d* of the metal ring 126 as a Fake_OUT node 140*g*. The OUT node 140*j* and the Fake- _OUT node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN1 node 140i. In other words, both the vertically extended contact structure 140h and the vertically extended contact structure 140i are input nodes of the inverter 593a.

The contact structures 140a, 140b, 140c, 140d, 140e, 140f, 140g, 140h, 140i, 140j, 140k, 140l, 140m, 140n, 140o, and 140p (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140c, 140e, 140g, 140h, 140i, 140j, 140m, and 140n; the fake contact structures 140F include the contact structures 140b, 140d, 140f, 140k, 140l, 140o, and 140p.

Specifically, the source of the FET M1 102 is coupled to the Vdd because the contact structure 140a is a real contact structure 140R. The source of the FET M2 104 is coupled to the Vdd because the contact structure 140c is a real contact structure 140R. The drains of the FET M1 102 and the FET M2 104 are coupled together to the metal ring 126 because the contact structure 140e is a real contact structure 140R. The source of the FET M4 108 is coupled to the Vss because the contact structure 140n is a real contact structure 140R. The drain of the FET M3 106 is coupled to the metal ring 126 because the contact structure 140m is a real contact structure 140R. As such, the inverter layout 593b can fulfil the NOT logic operation of the inverter 593a.

FIGS. 8A to 8B, FIGS. 9A to 9B, FIGS. 10A to 10C, FIGS. 11A to 11B, and FIG. 12 are diagrams illustrating semiconductor devices in accordance with some embodiments. Specifically, FIG. 8A is a circuit diagram of a NAND gate with three inputs in accordance with some embodiments. FIG. 8B is a layout diagram of the NAND gate of FIG. 8A. FIG. 9A is a circuit diagram of a NOR gate with three inputs in accordance with some embodiments. FIG. 9B is a layout diagram of the NOR gate of FIG. 9A. FIG. 10A is a circuit diagram of a circuit in accordance with some embodiments. FIG. 10B is a logical gate equivalent of the circuit of FIG. 10A. FIG. 10C is a layout diagram of the circuit of FIG. 10A. FIG. 11A is a circuit diagram of a circuit in accordance with some embodiments. FIG. 11B is a logical gate equivalent of the circuit of FIG. 11A. FIG. 12 is a layout diagram of the circuit of FIG. 11A. The layouts shown in FIG. 8B, FIG. 9B, FIG. 10C, and FIG. 12 are indistinguishable from each other by using a combination of real contact structures and fake contact structures.

Referring to FIG. 8A, a NAND gate 891a with three inputs includes a p-type FET M1 102, a p-type FET M2 104, a p-type FET M3 106, an n-type FET M4 108, an n-type FET M5 101, and an n-type FET M6 103. In one example, the p-type FET M1 102, the p-type FET M2 104, and the p-type FET M3 106 are PMOS FETs, whereas the n-type FET M4 108, the n-type FET M5 101, and the n-type FET M6 103 are NMOS FETs. In another example, the p-type FET M1 102, the p-type FET M2 104, and the p-type FET M3 106 are p-type FinFETs, whereas the n-type FET M4 108, the n-type FET M5 101, and the n-type FET M6 103 are n-type FinFETs.

Sources of the FET M1 102, the FET M2 104, and the FET M3 106 are coupled to a first power supply (e.g., a Vdd). Drains of the FET M1 102, the FET M2 104, and the FET M3 106 are coupled together at an output ("OUT") node 140s. A drain of the FET M4 108 is also coupled to the OUT node 140s. A source of the FET M4 108 is coupled to a drain of the FET M5 101. A source of the FET M5 101 is coupled to a drain of the FET M6 103. A source of the FET M6 103 is coupled to a second power supply (e.g., a Vss). Gates of the FET M1 102 and the FET M6 103 are coupled together at a first input ("IN1") node 140h. Gates of the FET M2 104 and the FET M5 101 are coupled together at a second input ("IN2") node 140i. Gates of the FET M3 106 and the FET M4 108 are coupled together at a third input ("IN3") node 140j.

When the IN1 node 140h is at logical high, the IN2 node 140i is at logical high, and the IN3 node 140j is at logical high, the OUT node 140s is at logical low. In other situations, the OUT node 140s is at logical high. Thus, the NAND gate 891a implements a NAND logic operation.

Referring to FIG. 8B, a NAND gate layout 891b includes, among other things, the FET M1 102, the FET M2 104, the FET M3 106, the FET M4 108, the FET M5 101, and the FET M6 103. The FET M1 102, the FET M2 104, and the FET M3 106 are disposed in a POD region 112. The FET M4 108, the FET M5 101, and the FET M6 103 are disposed in a NOD region 114. Three gate strips 132, 134, and 136 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140h. The gate strip 134 serves as both the gate of the FET M2 104 and the gate of the FET M5 101. In other words, both the gate of the FET M2 104 and the gate of the FET M5 101 are coupled together at the IN2 node 140i. The gate strip 136 serves as both the gate of the FET M3 106 and the gate of the FET M4 108. In other words, both the gate of the FET M3 106 and the gate of the FET M4 108 are coupled together at the IN3 node 140j.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. The source of the FET M3 106 is located at the left of the gate strip 136 in the X direction. The drain of the FET M3 106 is located at the right of the gate strip 136 in the X direction.

Likewise, the source of the FET M6 103 is located at the left of the gate strip 132 in the X direction. The drain of the FET M6 103 is located at the right of the gate strip 132 in the X direction. The source of the FET M5 101 is located at the left of the gate strip 134 in the X direction. The drain of the FET M5 101 is located at the right of the gate strip 134 in the X direction. The source of the FET M4 108 is located at the left of the gate strip 136 in the X direction. The drain of the FET M4 108 is located at the right of the gate strip 136 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M2 104, and the FET M3 106 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M6 103, the FET M5 101, and the FET M4 108 through vertically extended contact structures 140*n*, 140*o*, 140*p*, and 140*u* as well as metal track fingers of the metal track 124 extending in the Y direction.

In the illustrated example, the metal ring 126 has a rectangular shape and includes four sides 126*a*, 126*b*, 126*c*, and 126*d*. The metal ring 126 has an opening 126*e* at the side 126*c* and an opening 126*f* at the side 126*a*. In other words, the metal ring 126 are broken into two half rings. It should be noted that the metal ring 126 may have other shapes. The side 126*a* of the metal ring 126 is capable of connecting the sources and/or drains of the FET M1 102, the FET M2 104, and the FET M3 106 through vertically extended contact structures 140*d*, 140*e*, 140*f*, and 140*r* as well as metal ring fingers of the metal ring 126 extending in the Y direction. The side 126*c* of the metal ring 126 is capable of connecting the sources and/or drains of the FET M6 103, the FET M5 101, and the FET M4 108 through vertically extended contact structures 140*k*, 140*l*, 140*m*, and 140*t* as well as metal ring fingers of the metal ring 126 extending in the Y direction. A vertically extended contact structures 140*s* is disposed over the side 126*b* of the metal ring 126 as the OUT node 140*s*. A vertically extended contact structure 140*g* is disposed over the side 126*d* of the metal ring 126 as a Fake_OUT node 140*g*. The OUT node 140*s* and the Fake_OUT node 140*g* are separated from each other and indistinguishable from each other for RE protection.

A vertically extended contact structure 140*h* is disposed over the gate strip 132 as the IN1 node 140*h*. A vertically extended contact structure 140*i* is disposed over the gate strip 134 as the IN2 node 140*i*. A vertically extended contact structure 140*j* is disposed over the gate strip 136 as the IN3 node 140*j*.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, 140*p*, 140*q*, 140*r*, 140*s*, 140*t*, and 140*u* (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*a*, 140*c*, 140*e*, 140*r*, 140*g*, 140*h*, 140*i*, 140*j*, 140*s*, 140*t*, and 140*n*; the fake contact structures 140F include the contact structures 140*b*, 140*q*, 140*d*, 140*f*, 140*k*, 140*l*, 140*m*, 140*o*, 140*p*, and 140*u*.

Specifically, the sources of the FET M1 102, the FET M2 104, and the FET M3 106 are coupled to the Vdd because the contact structures 140*a* and 140*c* are real contact structures 140R. The drains of the FET M1 102, the FET M2 104, and the FET M3 106 are coupled together to the metal ring 126 because the contact structures 140*e* and 140*r* are real contact structures 140R. The drain of the FET M4 108 is also coupled to the metal ring 126 because the contact structure 140*t* is a real contact structure 140R. The source of the FET M6 103 is coupled to the Vss because the contact structure 140*n* is a real contact structure 140R. As such, the NAND gate layout 891*b* can fulfil the NAND logic operation of the NAND gate 891*a*. Additionally, since the contact structures 140*d*, 140*k*, 140*l*, and 140*m* are fake contact structures 140F, the Fake_OUT node 140*g* does not have a real output signal.

Referring to FIG. 9A, a NOR gate 892*a* with three inputs includes a p-type FET M1 102, a p-type FET M2 104, a p-type FET M3 106, an n-type FET M6 103, an n-type FET M5 101, and an n-type FET M4 108. In one example, the p-type FET M1 102, the p-type FET M2 104, and the p-type FET M3 106 are PMOS FETs, whereas the n-type FET M6 103, the n-type FET M5 101, and the n-type FET M4 108 are NMOS FETs. In another example, the p-type FET M1 102, the p-type FET M2 104, and the p-type FET M3 106 are p-type FinFETs, whereas the n-type FET M6 103, the n-type FET M5 101, and the n-type FET M4 108 are n-type FinFETs.

A source of the FET M3 106 is coupled to a first power supply (e.g., a Vdd). A drain of the FET M3 106 is coupled to a source of the FET M2 104. A drain of the FET M2 104 is coupled to a source of the FET M1 102. A drain of the FET M1 102 is coupled to an output ("OUT") node 140*g*. Drains of the FET M6 103, the FET M5 101, and the FET M4 108 are also coupled to the OUT node 140*g*. Sources of the FET M6 103, the FET M5 101, and the FET M4 108 are coupled to a second power supply (e.g., a Vss). Gates of the FET M1 102 and the FET M6 103 are coupled together at a first input ("IN1") node 140*h*. Gates of the FET M2 104 and the FET M5 101 are coupled together at a second input ("IN2") node 140*i*. Gates of the FET M3 106 and the FET M4 108 are coupled together at a third input ("IN3") node 140*j*.

When the IN1 node 140*h* is at logical low, the IN2 node 140*i* is at logical low, and the IN3 node 140*j* is at logical low, the OUT node 140*s* is at logical high. In other situations, the OUT node 140*s* is at logical low. Thus, the NOR gate 892*a* implements a NOR logic operation.

Referring to FIG. 9B, a NOR gate layout 892*b* includes, among other things, the FET M1 102, the FET M2 104, the FET M3 106, the FET M6 103, the FET M5 101, and the FET M4 108. The FET M1 102, the FET M2 104, and the FET M3 106 are disposed in a POD region 112. The FET M6 103, the FET M5 101, and the FET M4 108 are disposed in a NOD region 114. Three gate strips 132, 134, and 136 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140*h*. The gate strip 134 serves as both the gate of the FET M2 104 and the gate of the FET M5 101. In other words, both the gate of the FET M2 104 and the gate of the FET M5 101 are coupled together at the IN2 node 140*i*. The gate strip 136 serves as both the gate of the FET M3 106 and the gate of the FET M4 108. In other words, both the gate of the FET M3 106 and the gate of the FET M4 108 are coupled together at the IN3 node 140*j*.

The source of the FET M1 102 is located at the right of the gate strip 132 in an X direction. In this illustrated example, the X direction is perpendicular to the Y direction. The drain of the FET M1 102 is located at the left of the gate strip 132 in the X direction. The source of the FET M2 104 is located at the right of the gate strip 134 in the X direction. The drain of the FET M2 104 is located at the left of the gate strip 134 in the X direction. The source of the FET M3 106 is located at the right of the gate strip 136 in the X direction. The drain of the FET M3 106 is located at the left of the gate strip 136 in the X direction.

Likewise, the source of the FET M6 103 is located at the right of the gate strip 132 in the X direction. The drain of the FET M6 103 is located at the left of the gate strip 132 in the X direction. The source of the FET M5 101 is located at the left of the gate strip 134 in the X direction. The drain of the FET M5 101 is located at the right of the gate strip 134 in the X direction. The source of the FET M4 108 is located at the right of the gate strip 136 in the X direction. The drain of the FET M4 108 is located at the left of the gate strip 136 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M2 104, and the FET M3 106 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M4 108, the FET M5 101, and the FET M6 103 through vertically extended contact structures 140n, 140o, 140p, and 140u as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M2 104, and the FET M3 106 through vertically extended contact structures 140d, 140e, 140f, and 140r as well as metal ring fingers of the metal ring 126 extending in the Y direction. The side 126c of the metal ring 126 is capable of connecting the sources and/or drains of the FET M4 108, the FET M5 101, and the FET M6 103 through vertically extended contact structures 140k, 140l, 140m, and 140t as well as metal ring fingers of the metal ring 126 extending in the Y direction. A vertically extended contact structure 140s is disposed over the side 126b of the metal ring 126 as a Fake_OUT node 140s. A vertically extended contact structure 140g is disposed over the side 126d of the metal ring 126 as the OUT node 140g. The OUT node 140g and the Fake_OUT node 140s are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j.

The contact structures 140a, 140b, 140c, 140d, 140e, 140f, 140g, 140h, 140i, 140j, 140k, 140l, 140m, 140n, 140o, 140p, 140q, 140r, 140s, 140t, and 140u (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140q, 140d, 140g, 140h, 140i, 140j, 140s, 140k, 140m, 140o, and 140u; the fake contact structures 140F include the contact structures 140a, 140b, 140c, 140e, 140f, 140r, 140l, 140t, 140n, and 140p.

Specifically, the sources of the FET M6 103, the FET M5 101, and the FET M4 108 are coupled to the Vss because the contact structures 140o and 140u are real contact structures 140R. The drain of the FET M4 108, the FET M5 101, and the FET M6 103 are coupled to the OUT node 140g because the contact structures 140k and 140m are real contact structures 140R. The drain of the FET M1 102 is also coupled to the OUT node 140g because the contact structure 140d is a real contact structure 140R. The source of the FET M3 106 is coupled to the Vdd because the contact structure 140q is a real contact structure 140R. As such, the NOR gate layout 892b can fulfil the NOR logic operation of the NOR gate 892a.

Referring to FIG. 10A, a circuit 893a includes a p-type FET M3 106, a p-type FET M2 104, a p-type FET M1 102, an n-type FET M4 108, an n-type FET M5 101, and an n-type FET M6 103. In one example, the p-type FET M3 106, the p-type FET M2 104, and the p-type FET M1 102 are PMOS FETs, whereas the n-type FET M4 108, the n-type FET M5 101, and the n-type FET M6 103 are NMOS FETs. In another example, the p-type FET M3 106, the p-type FET M2 104, and the p-type FET M1 102 are p-type FinFETs, whereas the n-type FET M4 108, the n-type FET M5 101, and the n-type FET M6 103 are n-type FinFETs.

Sources of the FET M3 106 and the FET M2 104 are coupled to a first power supply (e.g., a Vdd). Drains of the FET M3 106 and the FET M2 104 are coupled to a source of the FET M1 102 at a Fake_OUT node 140s. A drain of the FET M1 102 is coupled to an output ("OUT") node 140g. Sources of the FET M4 108 and the FET M6 103 are coupled to a second power supply (e.g., a Vss). A drain of the FET M4 108 is coupled to a source of the FET M5 101. Drains of the FET M6 103 and the FET M5 101 are coupled to the OUT node 140g. Gates of the FET M3 106 and the FET M4 108 are coupled together at a first input ("IN1") node 140j. Gates of the FET M2 104 and the FET M5 101 are coupled together at a second input ("IN2") node 140i. Gates of the FET M1 102 and the FET M6 103 are coupled together at a third input ("IN3") node 140h.

When the IN1 node 140j is at logical low, the IN2 node 140i is at logical low, and the IN3 node 140h is at logical low, the OUT node 140g is at logical high. When the IN1 node 140j is at logical low, the IN2 node 140i is at logical high, and the IN3 node 140h is at logical low, the OUT node 140g is at logical high. When the IN1 node 140j is at logical high, the IN2 node 140i is at logical low, and the IN3 node 140h is at logical low, the OUT node 140g is at logical high. In other situations, the OUT node 140g is at logical low. Thus, the circuit 893a implements a logic operation ("AND plus NOR") as shown in FIG. 10B.

Referring to FIG. 10C, a circuit layout 893b includes, among other things, the FET M3 106, the FET M2 104, the FET M1 102, the FET M4 108, the FET M5 101, and the FET M6 103. The FET M3 106, the FET M2 104, and the FET M1 102 are disposed in a POD region 112. The FET M4 108, the FET M5 101, and the FET M6 103 are disposed in a NOD region 114. Three gate strips 132, 134, and 136 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN3 node 140h. The gate strip 134 serves as both the gate of the FET M2 104 and the gate of the FET M5 101. In other words, both the gate of the FET M2 104 and the gate of the FET M5 101 are coupled together at the IN2 node 140i. The gate strip 136 serves as both the gate of the FET M3 106 and the gate of the FET M4 108. In other words, both the gate of the FET M3 106 and the gate of the FET M4 108 are coupled together at the IN1 node 140j.

The source of the FET M3 106 is located at the left of the gate strip 136 in an X direction. In this illustrated example, the X direction is perpendicular to the Y direction. The drain of the FET M3 106 is located at the right of the gate strip 136 in the X direction. The source of the FET M2 104 is located at the right of the gate strip 134 in the X direction. The drain of the FET M2 104 is located at the left of the gate strip 134 in the X direction. The source of the FET M1 102 is located at the right of the gate strip 132 in the X direction. The drain of the FET M1 102 is located at the left of the gate strip 132 in the X direction.

Likewise, the source of the FET M4 108 is located at the right of the gate strip 136 in the X direction. The drain of the FET M4 108 is located at the left of the gate strip 136 in the X direction. The source of the FET M5 101 is located at the right of the gate strip 134 in the X direction. The drain of the FET M5 101 is located at the left of the gate strip 134 in the X direction. The source of the FET M6 103 is located at the left of the gate strip 132 in the X direction. The drain of the FET M6 103 is located at the right of the gate strip 132 in the X direction.

A metal track 122, a metal track 124, and a metal ring 126 are disposed in a metal layer 120 over the POD region 112, the NOD region 114, and the gate strips 132, 134 and 136. The metal track 122 is capable of providing the Vdd to the sources and/or drains of the FET M3 106, the FET M2 104, and the FET M1 102 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M6 103, the FET M5 101, and the FET M4 108 through vertically extended contact structures 140n, 140o, 140p, and 140u as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M3 106, the FET M2 104, and the FET M1 102 through vertically extended contact structures 140d, 140e, 140f, and 140r as well as metal ring fingers of the metal ring 126 extending in the Y direction. The side 126c of the metal ring 126 is capable of connecting the sources and/or drains of the FET M6 103, the FET M5 101, and the FET M4 108 through vertically extended contact structures 140k, 140l, 140m, and 140t as well as metal ring fingers of the metal ring 126 extending in the Y direction. A vertically extended contact structure 140s is disposed over the side 126b of the metal ring 126 as a Fake_OUT node 140s. A vertically extended contact structure 140g is disposed over the side 126d of the metal ring 126 as the OUT node 140g. The OUT node 140g and the Fake_OUT node 140s are separated from each other and indistinguishable from each other for RE protection.

A vertically extended contact structure 140h is disposed over the gate strip 132 as the IN3 node 140h. A vertically extended contact structure 140i is disposed over the gate strip 134 as the IN2 node 140i. A vertically extended contact structure 140j is disposed over the gate strip 136 as the IN1 node 140j.

The contact structures 140a, 140b, 140c, 140d, 140e, 140f, 140g, 140h, 140i, 140j, 140k, 140l, 140m, 140n, 140o, 140p, 140q, 140r, 140s, 140t, and 140u (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140c, 140d, 140e, 140r, 140g, 140h, 140i, 140j, 140s, 140l, 140n, and 140u; the fake contact structures 140F include the contact structures 140a, 140b, 140q, 140f, 140k, 140m, 140t, 140o, and 140p.

Specifically, the sources of the FET M3 106 and the FET M2 104 are coupled to the Vdd because the contact structure 140c is a real contact structure 140R. The drains of the FET M3 106 and the FET M2 104 are coupled to the Fake_OUT node 140s because the contact structures 140e and 140r are real contact structures 140R. The drain of the FET M1 102 is coupled to the OUT node 140g because the contact structure 140d is a real contact structure 140R. The sources of the FET M4 108 and the FET M6 103 are coupled to the Vss because the contact structures 140n and 140u are real contact structures 140R. The drains of the FET M5 101 and the FET M6 103 are also coupled to the OUT node 140g because the contact structure 140l is a real contact structure 140R. As such, the circuit layout 893b can fulfil the logic operation of the circuit 893a.

Referring to FIG. 11A, a circuit 894a includes a p-type FET M1 102, a p-type FET M3 106, a p-type FET M2 104, an n-type FET M6 103, an n-type FET M4 108, and an n-type FET M5 101. In one example, the p-type FET M1 102, the p-type FET M3 106, and the p-type FET M2 104 are PMOS FETs, whereas the n-type FET M6 103, the n-type FET M4 108, and the n-type FET M5 101 are NMOS FETs. In another example, the p-type FET M1 102, the p-type FET M3 106, and the p-type FET M2 104 are p-type FinFETs, whereas the n-type FET M6 103, the n-type FET M4 108, and the n-type FET M5 101 are n-type FinFETs.

Sources of the FET M1 102 and the FET M3 106 are coupled to a first power supply (e.g., a Vdd). A drain of the FET M3 106 is coupled to an OUT node 140s. A source of the FET M2 104 is coupled to a drain of the FET M1 102. A drain of the FET M2 104 is also coupled to the OUT node 140s. Sources of the FET M6 103 and the FET M5 101 are coupled to a second power supply (e.g., a Vss). Drains of the FET M6 103 and the FET M5 101 are coupled together at an Fake_OUT node 140g. A source of the FET M4 108 is coupled to the Fake_OUT node 140g. A drain of the FET M4 108 is coupled to the OUT node 140s. Gates of the FET M1 102 and the FET M6 103 are coupled together at a first input ("IN1") node 140h. Gates of the FET M2 104 and the FET M5 101 are coupled together at a second input ("IN2") node 140i. Gates of the FET M3 106 and the FET M4 108 are coupled together at a third input ("IN3") node 140j.

When the IN1 node 140h is at logical low, the IN2 node 140i is at logical high, and the IN3 node 140j is at logical high, the OUT node 140g is at logical low. When the IN1 node 140h is at logical high, the IN2 node 140i is at logical low, and the IN3 node 140j is at logical high, the OUT node 140g is at logical low. When the IN1 node 140h is at logical high, the IN2 node 140i is at logical high, and the IN3 node 140j is at logical high, the OUT node 140g is at logical low. In other situations, the OUT node 140g is at logical high. Thus, the circuit 894a implements a logic operation ("OR plus NAND") as shown in FIG. 11B.

Referring to FIG. 12, a circuit layout 894b includes, among other things, the FET M1 102, the FET M3 106, the FET M2 104, the FET M6 103, the FET M4 108, and the FET M5 101. The FET M1 102, the FET M3 106, and the FET M2 104 are disposed in a POD region 112. The FET M6 103, the FET M4 108, and the FET M5 101 are disposed in a NOD region 114. Three gate strips 132, 134, and 136 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140h. The gate strip 134 serves as both the gate of the FET M2 104 and the gate of the FET M5 101. In other words, both the gate of the FET M2 104 and the gate of the FET M5 101 are coupled together at the IN2 node 140i. The gate strip 136 serves as both the gate of the FET M3 106 and the gate of the FET M4 108. In other words, both the gate of the FET M3 106 and the gate of the FET M4 108 are coupled together at the IN3 node 140j.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. The source of the FET M3 106 is located at the right of the gate strip 136 in the X direction. The drain of the FET M3 106 is located at the left of the gate strip 136 in the X direction.

Likewise, the source of the FET M6 103 is located at the right of the gate strip 132 in the X direction. The drain of the FET M6 103 is located at the left of the gate strip 132 in the X direction. The source of the FET M5 101 is located at the left of the gate strip 134 in the X direction. The drain of the FET M5 101 is located at the right of the gate strip 134 in the X direction. The source of the FET M4 108 is located at the left of the gate strip 136 in the X direction. The drain of the FET M4 108 is located at the right of the gate strip 136 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M3 106, and the FET M2 104 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M5 101, the FET M4 108, and the FET M6 103 through vertically extended contact structures 140n, 140o, 140p, and 140u as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M3 106, and the FET M2 104 through vertically extended contact structures 140d, 140e, 140f, and 140r as well as metal ring fingers of the metal ring 126 extending in the Y direction. The side 126c of the metal ring 126 is capable of connecting the sources and/or drains of the FET M5 101, the FET M4 108, and the FET M6 103 through vertically extended contact structures 140k, 140l, 140m, and 140t as well as metal ring fingers of the metal ring 126 extending in the Y direction. A vertically extended contact structure 140s is disposed over the side 126b of the metal ring 126 as the OUT node 140s. A vertically extended contact structure 140g is disposed over the side 126d of the metal ring 126 as the Fake_OUT node 140g. The OUT node 140s and the Fake_OUT node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j.

The contact structures 140a, 140b, 140c, 140d, 140e, 140f, 140g, 140h, 140i, 140j, 140k, 140l, 140m, 140n, 140o, 140p, 140q, 140r, 140s, 140t, and 140u (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140q, 140f, 140g, 140h, 140i, 140j, 140s, 140k, 140m, 140t, and 140o; the fake contact structures 140F include the contact structures 140b, 140c, 140d, 140e, 140r, 140l, 140n, 140p, and 140u.

Specifically, the sources of the FET M1 102 and the FET M3 106 are coupled to the Vdd because the contact structures 140a and 140q are real contact structures 140R. The drains of the FET M3 106 and the FET M2 104 are coupled to the OUT node 140s because the contact structure 140f is a real contact structure 140R. The sources of the FET M6 103 and the FET M5 101 are coupled to the Vss because the contact structure 140o is a real contact structure 140R. The drains of the FET M6 103 and the FET M5 101 are also coupled to the Fake_OUT node 140g because the contact structures 140k and 140m are real contact structures 140R. The drain of the FET M4 108 is coupled to the OUT node 140s because the contact structure 140t is a real contact structure 140R. As such, the circuit layout 894b can fulfil the logic operation of the circuit 894a.

Figures 13A, 13B:
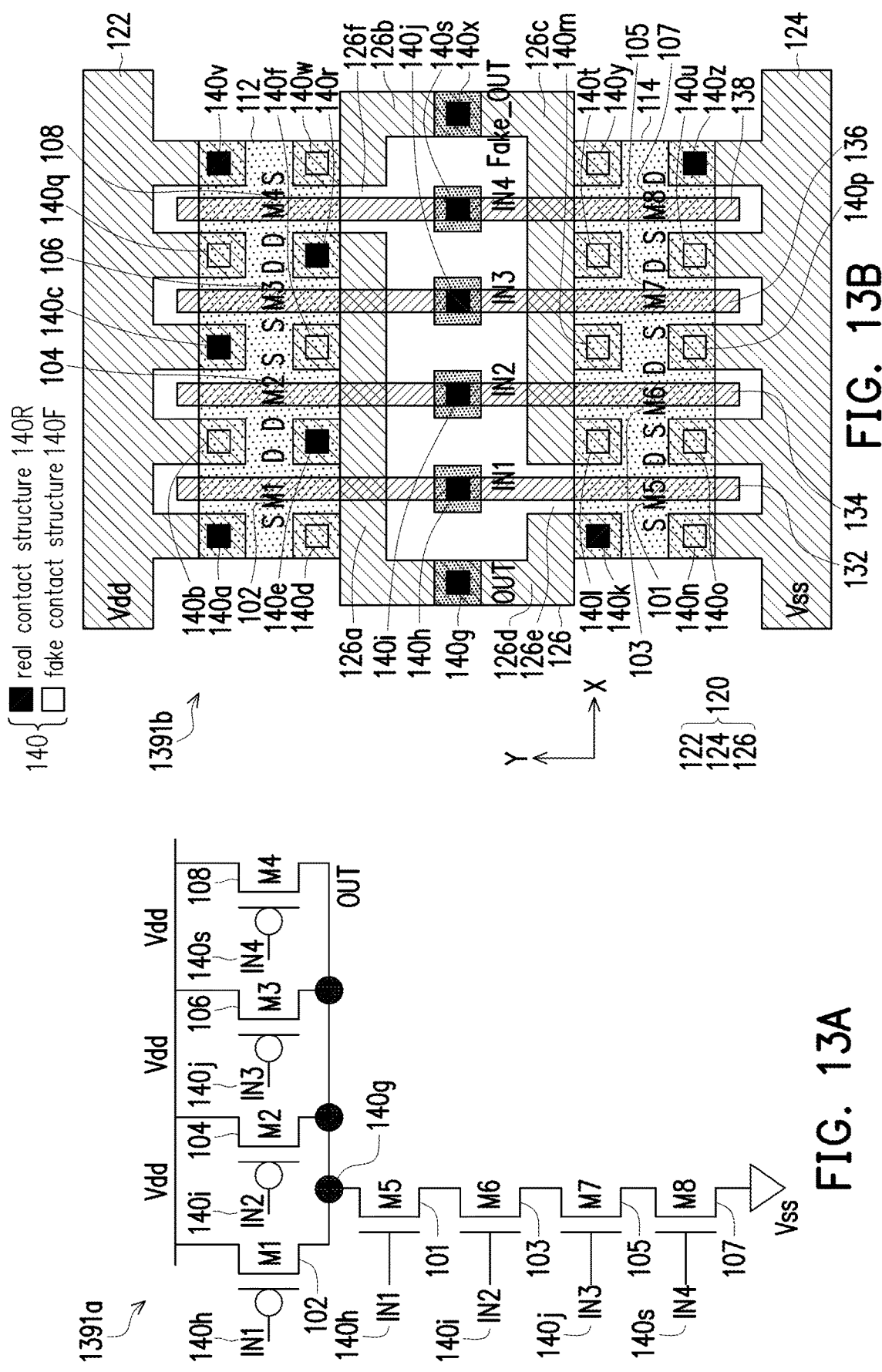
FIG. 13A is a circuit diagram of a NAND gate with four inputs in accordance with some embodiments.
FIGS. 13B and 13C are layout diagrams of the NAND gate of FIG. 13A.
Figure 13C:
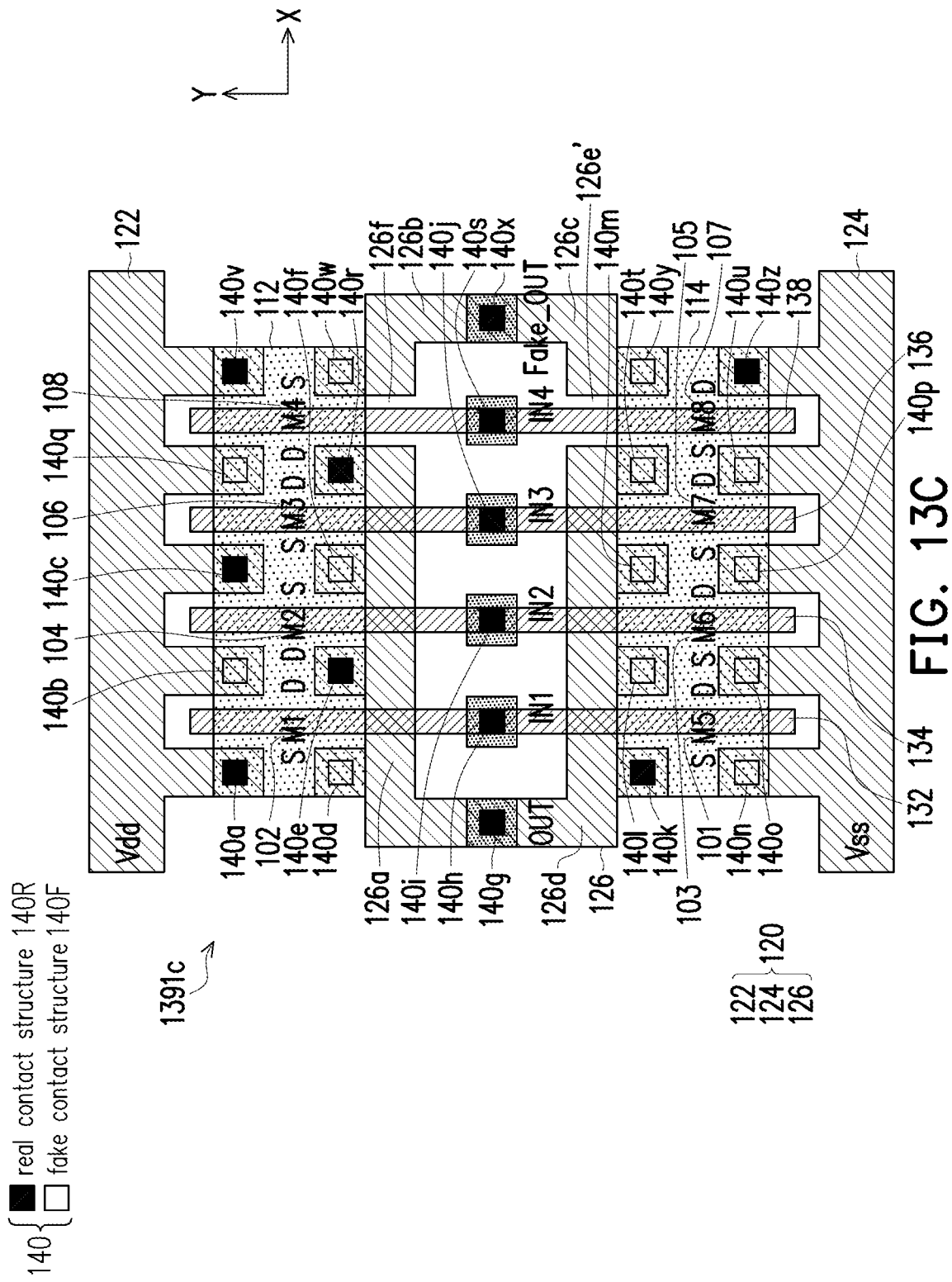
Figures 14A, 14B:
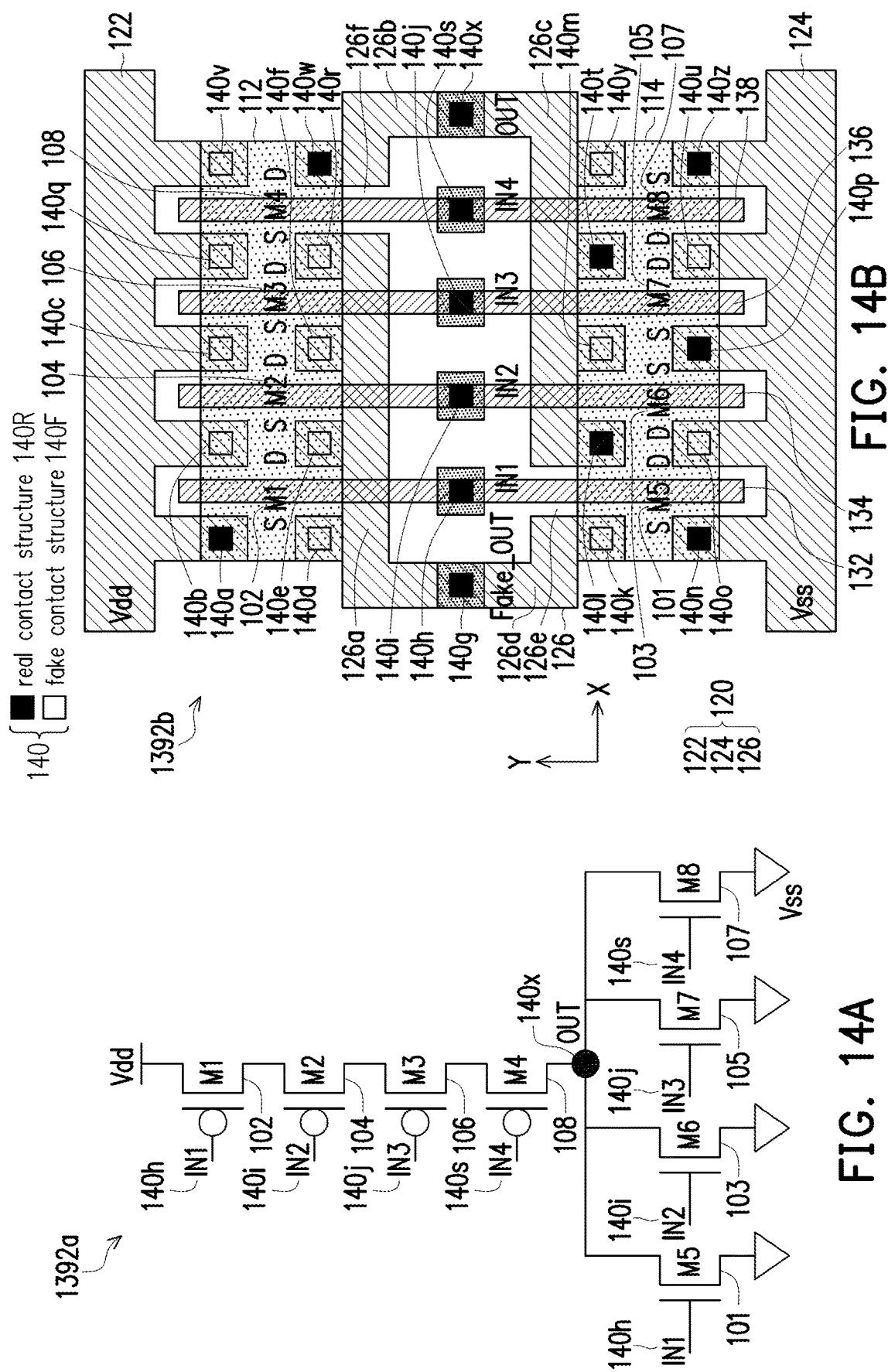
FIG. 14A is a circuit diagram of a NOR gate with four inputs in accordance with some embodiments.
FIGS. 14B and 15 are layout diagrams of the NOR gate of FIG. 14A.
Figure 15:
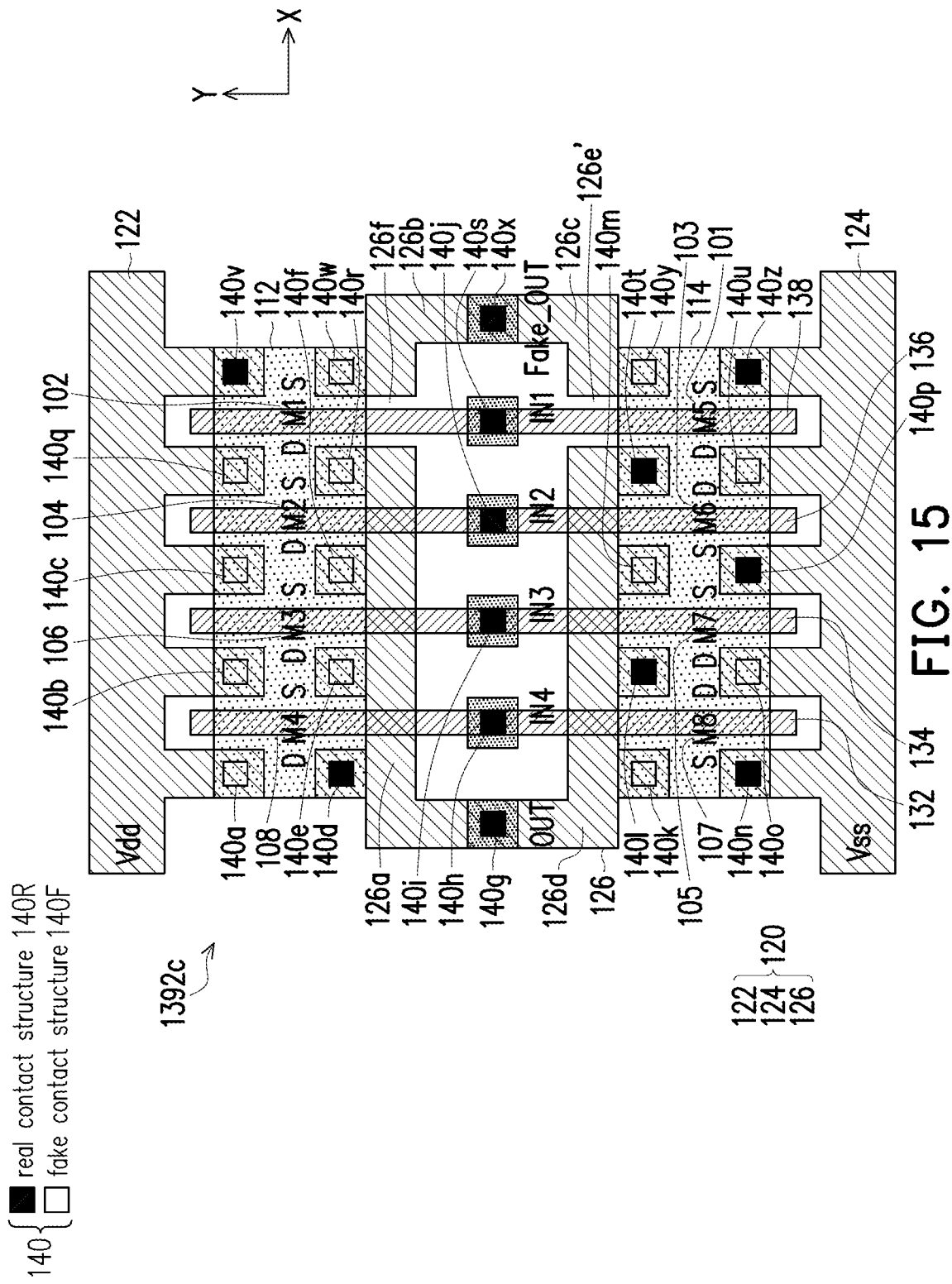

FIGS. 13A to 13C, FIGS. 14A to 14B, and FIG. 15 are diagrams illustrating semiconductor devices in accordance with some embodiments. Specifically, FIG. 13A is a circuit diagram of a NAND gate with four inputs in accordance with some embodiments. FIGS. 13B and 13C are layout diagrams of the NAND gate of FIG. 13A. FIG. 14A is a circuit diagram of a NOR gate with four inputs in accordance with some embodiments. FIGS. 14B and 15 are layout diagrams of the NOR gate of FIG. 14A. The layouts shown in FIG. 13B and FIG. 14B are indistinguishable from each other by using a combination of real contact structures and fake contact structures. The layouts shown in FIG. 13C and FIG. 15 are indistinguishable from each other by using a combination of real contact structures and fake contact structures. Additionally, the layouts shown in FIG. 13B and FIG. 13C are different versions of the same circuit of FIG. 13A; the layouts shown in FIG. 14B and FIG. 15 are different versions of the same circuit of FIG. 14A. As such, anti-RE camouflage can be realized.

Referring to FIG. 13A, a NAND gate 1391a with four inputs includes a p-type FET M1 102, a p-type FET M2 104, a p-type FET M3 106, a p-type FET M4 108, an n-type FET M5 101, an n-type FET M6 103, an n-type FET M7 105, and an n-type FET M8 107. In one example, the p-type FET M1 102, the p-type FET M2 104, the p-type FET M3 106, the p-type FET M4 108 are PMOS FETs, whereas the n-type FET M5 101, the n-type FET M6 103, the n-type FET M7 105, and the n-type FET M8 107 are NMOS FETs. In another example, the p-type FET M1 102, the p-type FET M2 104, the p-type FET M3 106, the p-type FET M4 108 are p-type FinFETs, whereas the n-type FET M5 101, the n-type FET M6 103, the n-type FET M7 105, and the n-type FET M8 107 are n-type FinFETs.

Sources of the FET M1 102, the FET M2 104, the FET M3 106, and the FET M4 108 are coupled to a first power supply (e.g., a Vdd). Drains of the FET M1 102, the FET M2 104, the FET M3 106, and the FET M4 108 are coupled together at an output ("OUT") node 140g. A drain of the FET M8 107 is coupled to a second power supply (e.g., a Vss). A source of the FET M8 107 is coupled to a drain of the FET M7 105. A source of the FET M7 105 is coupled to a drain of the FET M6 103. A source of the FET M6 103 is coupled to a drain of the FET M5 101. A source of the FET M5 101 is coupled to the OUT node 140g. Gates of the FET M1 102 and the FET M5 101 are coupled together at a first input ("IN1") node 140h. Gates of the FET M2 104 and the FET M6 103 are coupled together at a second input ("IN2") node 140i. Gates of the FET M3 106 and the FET M7 105 are coupled together at a third input ("IN3") node 140j. Gates of the FET M4 108 and the FET M8 107 are coupled together at a fourth input ("IN4") node 140s.

When the IN1 node 140h is at logical high, the IN2 node 140i is at logical high, the IN3 node 140j is at logical high, and the IN4 node 140s is at logical high, the OUT node 140g is at logical low. In other situations, the OUT node 140g is at logical high. Thus, the NAND gate 1391a implements a NAND logic operation.

Referring to FIG. 13B, a NAND gate layout 1391b includes, among other things, the FET M1 102, the FET M2 104, the FET M3 106, the FET M4 108, the FET M5 101, the FET M6 103, the FET M7 105, and the FET M8 107. The FET M1 102, the FET M2 104, the FET M3 106, and the FET M4 108 are disposed in a POD region 112. The FET M5 101, the FET M6 103, the FET M7 105, and the FET M8 107 are disposed in a NOD region 114. Four gate strips 132, 134, 136, and 138 extend in a Y direction and are disposed over both the POD region 112 and the NOD region 114. The gate strip 132 serves as both the gate of the FET M1 102 and the gate of the FET M5 101. In other words, both the gate of the FET M1 102 and the gate of the FET M5 101 are coupled together at the IN1 node 140h. The gate strip 134 serves as both the gate of the FET M2 104 and the gate of the FET M6 103. In other words, both the gate of the FET M2 104 and the gate of the FET M6 103 are coupled together at the IN2 node 140i. The gate strip 136 serves as both the gate of the FET M3 106 and the gate of the FET M7 105. In other words, both the gate of the FET M3 106 and the gate of the FET M7 105 are coupled together at the IN3 node 140j. The gate strip 138 serves as both the gate of the FET M4 108 and the gate of the FET M8 107. In other words, both the gate of the FET M4 108 and the gate of the FET M8 107 are coupled together at the IN4 node 140s.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. The source of the FET M3 106 is located at the left of the gate strip 136 in the X direction. The drain of the FET M3 106 is located at the right of the gate strip 136 in the X direction. The source of the FET M4 108 is located at the right of the gate strip 138 in the X direction. The drain of the FET M4 108 is located at the left of the gate strip 138 in the X direction.

Likewise, the source of the FET M5 101 is located at the left of the gate strip 132 in the X direction. The drain of the FET M5 101 is located at the right of the gate strip 132 in the X direction. The source of the FET M6 103 is located at the left of the gate strip 134 in the X direction. The drain of the FET M6 103 is located at the right of the gate strip 134 in the X direction. The source of the FET M7 105 is located at the left of the gate strip 136 in the X direction. The drain of the FET M7 105 is located at the right of the gate strip 136 in the X direction. The source of the FET M8 107 is located at the left of the gate strip 138 in the X direction. The drain of the FET M8 107 is located at the right of the gate strip 138 in the X direction.

A metal track 122, a metal track 124, and a metal ring 126 are disposed in a metal layer 120 over the POD region 112, the NOD region 114, and the gate strips 132, 134, 136, and 138. The metal track 122 is capable of providing the Vdd to the sources and/or drains of the FET M1 102, the FET M2 104, the FET M3 106, and the FET M4 108 through vertically extended contact structures 140a, 140b, 140c, 140q, and 140v as well as metal track fingers of the metal track 122 extending in the Y direction. The vertical direction is perpendicular to the X-Y plane. The metal track 124 is capable of providing the Vss to the sources and/or drains of the FET M8 107, the FET M7 105, the FET M6 103, and the FET M5 101 through vertically extended contact structures 140n, 140o, 140p, 140u, and 140z as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M2 104, the FET M3 106, and the FET M4 108 through vertically extended contact structures 140d, 140e, 140f, 140r, and 140w as well as metal ring fingers of the metal ring 126 extending in the Y direction. The side 126c of the metal ring 126 is capable of connecting the sources and/or drains of the FET M5 101, the FET M6 103, the FET M7 105, and the FET M8 107 through vertically extended contact structures 140k, 140l, 140m, 140t, and 140y as well as metal ring fingers of the metal ring 126 extending in the Y direction. A vertically extended contact structure 140x is disposed over the side 126b of the metal ring 126 as a Fake_OUT node 140x. A vertically extended contact structure 140g is disposed over the side 126d of the metal ring 126 as the OUT node 140g. The OUT node 140g and the Fake_OUT node 140x are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j. A vertically extended contact structure 140s is disposed over the gate strip 138 as the IN4 node 140s.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, and 140z (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140c, 140v, 140e, 140r, 140g, 140h, 140i, 140j, 140s, 140x, 140k, and 140z; the fake contact structures 140F include the contact structures 140*b*, 140*q*, 140*d*, 140*f*, 140*w*, 140*l*, 140*m*, 140*t*, 140*y*, 140*n*, 140*o*, 140*p*, and 140*u*.

Specifically, the sources of the FET M1 102, the FET M2 104, the FET M3 106, and the FET M4 108 are coupled to the Vdd because the contact structures 140*a*, 140*c*, and 140*v* are real contact structures 140R. The drains of the FET M1 102, the FET M2 104, the FET M3 106, and the FET M4 108 are coupled together to the OUT node 140*g* because the contact structures 140*e* and 140*r* are real contact structures 140R. The source of the FET M5 101 is also coupled to the OUT node 140*g* because the contact structure 140*k* is a real contact structure 140R. The drain of the FET M8 107 is coupled to the Vss because the contact structure 140*z* is a real contact structure 140R. As such, the NAND gate layout 1391*b* can fulfil the NAND logic operation of the NAND gate 1391*a*. Additionally, since the contact structures 140*w*, 140*l*, 140*m*, 140*t*, and 140*y* are fake contact structures 140F, the Fake_OUT node 140*x* does not have a real output signal.

Referring to FIG. 13C, a NAND gate layout 1391*c* includes, among other things, the FET M1 102, the FET M2 104, the FET M3 106, the FET M4 108, the FET M5 101, the FET M6 103, the FET M7 105, and the FET M8 107. The NAND gate layout 1391*c* of FIG. 13C is the same as the NAND gate layout 1391*b* of FIG. 13B except the location of the opening 126*e'* at the side 126*c* of the metal ring 126. Specifically, the opening 126*e'* is between the contact structures 140*t* and 140*y* in the X direction, while the opening 126*e* is between the contact structures 140*k* and 140*l* in the X direction. As such, both the NAND gate layout 1391*b* and the NAND gate layout 1391*c* can fulfil the NAND logic operation of the NAND gate 1391*a*. In other words, the NAND gate layout 1391*b* and the NAND gate layout 1391*c* are different versions of the NAND gate 1391*a*. As such, anti-RE camouflage can be realized.

Referring to FIG. 14A, a NOR gate 1392*a* with four inputs includes a p-type FET M1 102, a p-type FET M2 104, a p-type FET M3 106, a p-type FET M4 108, an n-type FET M5 101, an n-type FET M6 103, an n-type FET M7 105, and an n-type FET M8 107. In one example, the p-type FET M1 102, the p-type FET M2 104, the p-type FET M3 106, and the p-type FET M4 108 are PMOS FETs, whereas the n-type FET M5 101, the n-type FET M6 103, the n-type FET M7 105, and the n-type FET M8 107 are NMOS FETs. In another example, the p-type FET M1 102, the p-type FET M2 104, the p-type FET M3 106, and the p-type FET M4 108 are p-type FinFETs, whereas the n-type FET M5 101, the n-type FET M6 103, the n-type FET M7 105, and the n-type FET M8 107 are n-type FinFETs.

Sources of the FET M5 101, the FET M6 103, the FET M7 105, and the FET M8 107 are coupled to a second power supply (e.g., a Vss). Drains of the FET M5 101, the FET M6 103, the FET M7 105, and the FET M8 107 are coupled together at an output ("OUT") node 140*x*. A source of the FET M1 102 is coupled to a first power supply (e.g., a Vdd). A drain of the FET M1 102 is coupled to a source of the FET M2 104. A drain of the FET M2 104 is coupled to a source of the FET M3 106. A drain of the FET M3 106 is coupled to a source of the FET M4 108. A drain of the FET M4 108 is coupled to the OUT node 140*x*. Gates of the FET M1 102 and the FET M5 101 are coupled together at a first input ("IN1") node 140*h*. Gates of the FET M2 104 and the FET M6 103 are coupled together at a second input ("IN2") node 140*i*. Gates of the FET M3 106 and the FET M7 105 are coupled together at a third input ("IN3") node 140*j*. Gates of the FET M4 108 and the FET M8 107 are coupled together at a fourth input ("IN4") node 140*s*.

When the IN1 node 140*h* is at logical low, the IN2 node 140*i* is at logical low, the IN3 node 140*j* is at logical low, and the IN4 node 140*s* is at logical low, the OUT node 140*x* is at logical high. In other situations, the OUT node 140*x* is at logical low. Thus, the NOR gate 1392*a* implements a NOR logic operation.

Referring to FIG. 14B, a NOR gate layout 1392*b* includes, among other things, the FET M1 102, the FET M2 104, the FET M3 106, the FET M4 108, the FET M5 101, the FET M6 103, the FET M7 105, and the FET M8 107. The FET M1 102, the FET M2 104, the FET M3 106, and the FET M4 108 are disposed in a POD region 112. The FET M5 101, the FET M6 103, the FET M7 105, and the FET M8 107 are disposed in a NOD region 114. Four gate strips 132, 134, 136, and 138 extend in a Y direction and are disposed over both the POD region 112 and the NOD region 114. The gate strip 132 serves as both the gate of the FET M1 102 and the gate of the FET M5 101. In other words, both the gate of the FET M1 102 and the gate of the FET M5 101 are coupled together at the IN1 node 140*h*. The gate strip 134 serves as both the gate of the FET M2 104 and the gate of the FET M6 103. In other words, both the gate of the FET M2 104 and the gate of the FET M6 103 are coupled together at the IN2 node 140*i*. The gate strip 136 serves as both the gate of the FET M3 106 and the gate of the FET M7 105. In other words, both the gate of the FET M3 106 and the gate of the FET M7 105 are coupled together at the IN3 node 140*j*. The gate strip 138 serves as both the gate of the FET M4 108 and the gate of the FET M8 107. In other words, both the gate of the FET M4 108 and the gate of the FET M8 107 are coupled together at the IN4 node 140*s*.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. The source of the FET M3 106 is located at the left of the gate strip 136 in the X direction. The drain of the FET M3 106 is located at the right of the gate strip 136 in the X direction. The source of the FET M4 108 is located at the left of the gate strip 138 in the X direction. The drain of the FET M4 108 is located at the right of the gate strip 138 in the X direction.

Likewise, the source of the FET M5 101 is located at the left of the gate strip 132 in the X direction. The drain of the FET M5 101 is located at the right of the gate strip 132 in the X direction. The source of the FET M6 103 is located at the right of the gate strip 134 in the X direction. The drain of the FET M6 103 is located at the left of the gate strip 134 in the X direction. The source of the FET M7 105 is located at the left of the gate strip 136 in the X direction. The drain of the FET M7 105 is located at the right of the gate strip 136 in the X direction. The source of the FET M8 107 is located at the right of the gate strip 138 in the X direction. The drain of the FET M8 107 is located at the left of the gate strip 138 in the X direction.

A metal track 122, a metal track 124, and a metal ring 126 are disposed in a metal layer 120 over the POD region 112, the NOD region 114, and the gate strips 132, 134, 136, and 138. The metal track 122 is capable of providing the Vdd to the sources and/or drains of the FET M1 102, the FET M2 104, the FET M3 106, and the FET M4 108 through vertically extended contact structures 140*a*, 140*b*, 140*c*, 140*q*, and 140*v* as well as metal track fingers of the metal track 122 extending in the Y direction. The vertical direction is perpendicular to the X-Y plane. The metal track 124 is capable of providing the Vss to the sources and/or drains of the FET M8 107, the FET M7 105, the FET M6 103, and the FET M5 101 through vertically extended contact structures 140n, 140o, 140p, 140u, and 140z as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M2 104, the FET M3 106, and the FET M4 108 through vertically extended contact structures 140d, 140e, 140f, 140r, and 140w as well as metal ring fingers of the metal ring 126 extending in the Y direction. The side 126c of the metal ring 126 is capable of connecting the sources and/or drains of the FET M5 101, the FET M6 103, the FET M7 105, and the FET M8 107 through vertically extended contact structures 140k, 140l, 140m, 140t, and 140y as well as metal ring fingers of the metal ring 126 extending in the Y direction. A vertically extended contact structure 140x is disposed over the side 126b of the metal ring 126 as the OUT node 140x. A vertically extended contact structure 140g is disposed over the side 126d of the metal ring 126 as a Fake_OUT node 140g. The OUT node 140x and the Fake_OUT node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j. A vertically extended contact structure 140s is disposed over the gate strip 138 as the IN4 node 140s.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, and 140z (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140w, 140g, 140h, 140i, 140j, 140s, 140x, 140l, 140t, 140n, 140p, and 140z; the fake contact structures 140F include the contact structures 140b, 140c, 140q, 140v, 140d, 140e, 140f, 140r, 140k, 140m, 140y, 140o, and 140u.

The source of the FET M1 102 is coupled to the Vdd because the contact structure 140a is a real contact structure 140R. The drain of the FET M4 108 is coupled to the OUT node 140x because the contact structure 140w is a real contact structure 140R. The sources of the FET M5 101, the FET M6 103, the FET M7 105, and the FET M8 107 are coupled to the Vss because the contact structures 140n, 140p, and 140z are real contact structures 140R. The drains of the FET M5 101, the FET M6 103, the FET M7 105, and the FET M8 107 are coupled together to the OUT node 140x because the contact structures 140l and 140t are real contact structures 140R. As such, the NOR gate layout 1392b can fulfil the NOR logic operation of the NOR gate 1392a. Additionally, since the contact structures 140d, 140e, 140f, 140r, and 140k are fake contact structures 140F, the Fake_OUT node 140g does not have a real output signal.

Referring to FIG. 15, a NOR gate layout 1392c includes, among other things, the FET M1 102, the FET M2 104, the FET M3 106, the FET M4 108, the FET M5 101, the FET M6 103, the FET M7 105, and the FET M8 107. The NOR gate layout 1392c of FIG. 15 is the same as the NOR gate layout 1392b of FIG. 14B except the location of the opening 126e' at the side 126c of the metal ring 126 as well as the locations of the FET M1 102, the FET M2 104, the FET M3 106, the FET M4 108, the FET M5 101, the FET M6 103, the FET M7 105, the FET M8 107, the IN1 node 140s, the IN2 node 140j, the IN3 node 140i, and the IN4 node 140h. Specifically, the opening 126e' is between the contact structures 140t and 140y in the X direction, while the opening 126e is between the contact structures 140k and 140l in the X direction. As such, both the NOR gate layout 1392b and the NOR gate layout 1392c can fulfil the NOR logic operation of the NOR gate 1392a. In other words, the NOR gate layout 1392b and the NOR gate layout 1392c are different versions of the NOR gate 1392a. As such, anti-RE camouflage can be realized.

Figure 16B:
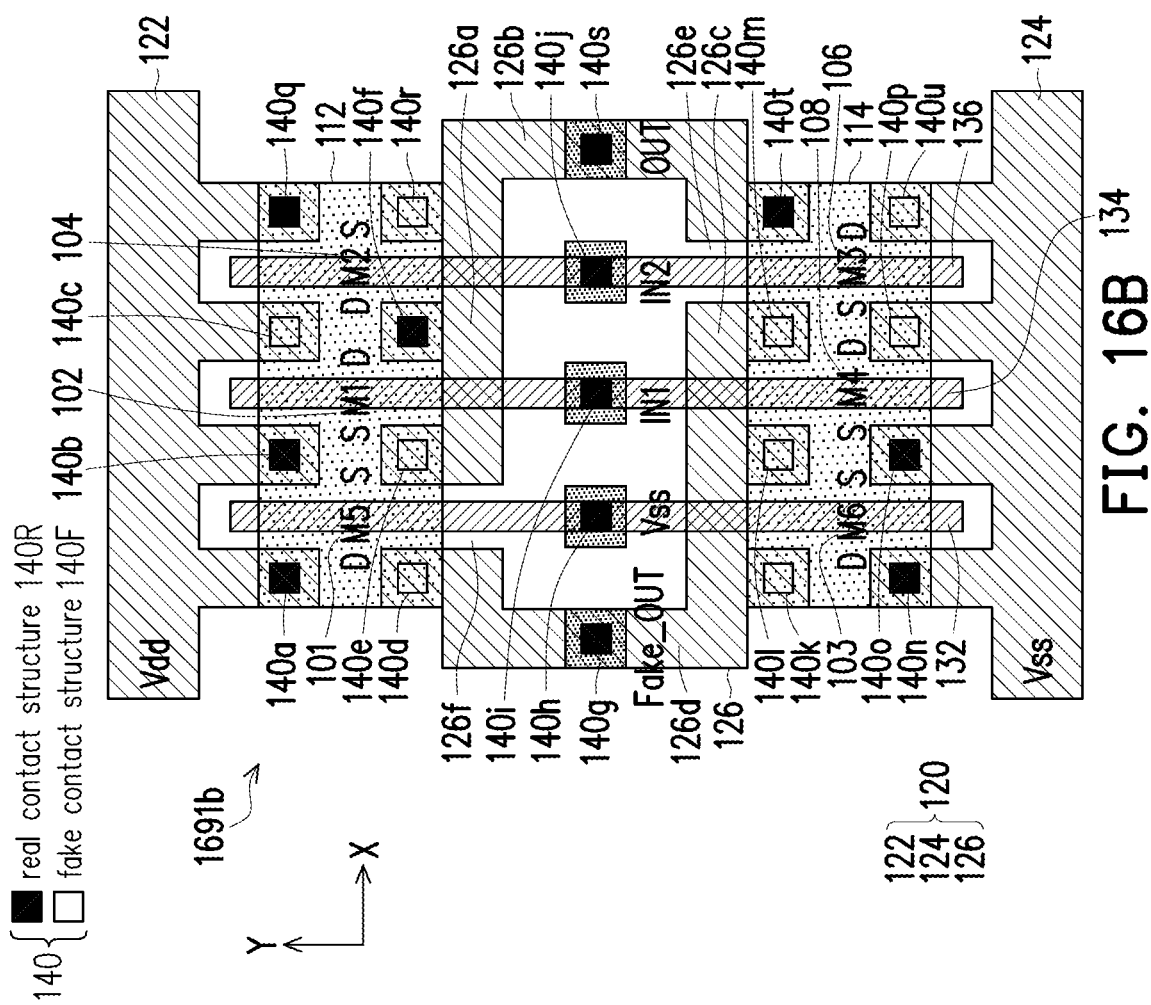
FIG. 16B is a layout diagram of the NAND gate of FIG. 16A.
Figure 16A:
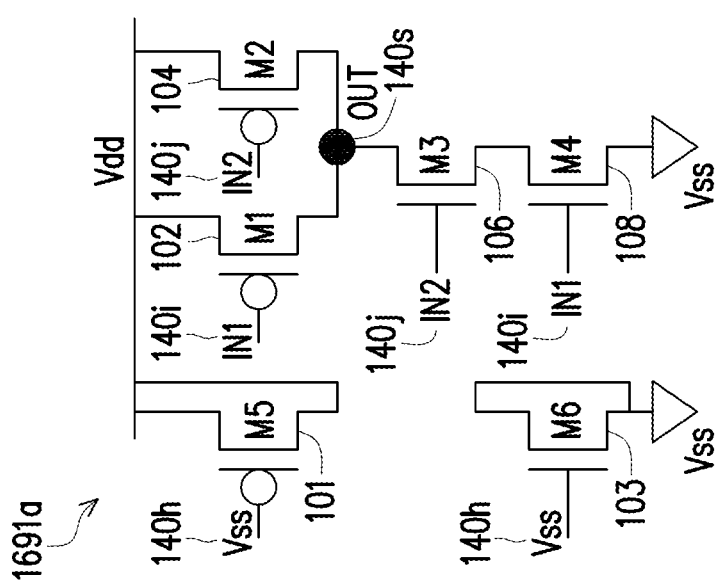
FIG. 16A is a circuit diagram of a NAND gate with two inputs in accordance with some embodiments.
Figure 17B:
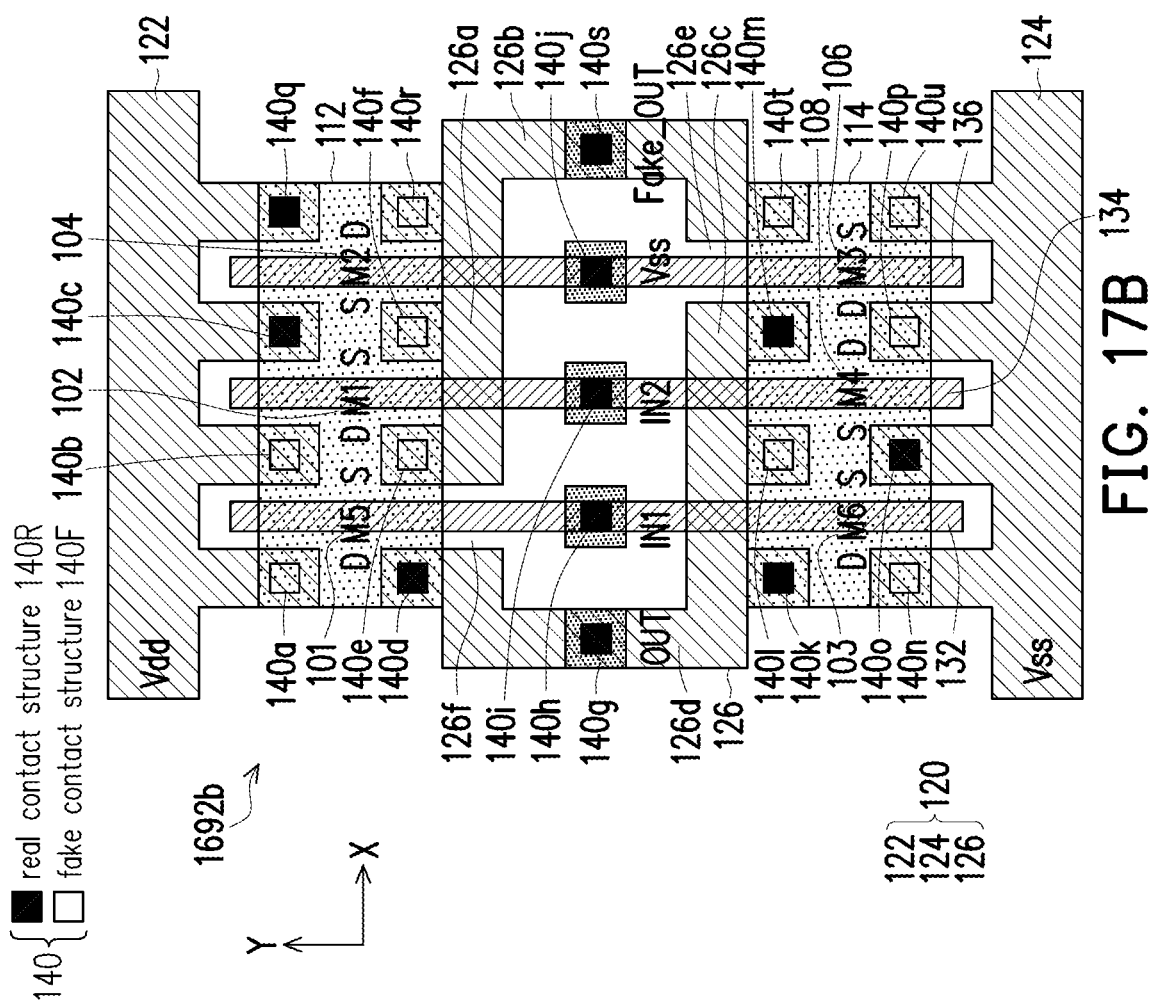
FIG. 17B is a layout diagram of the NOR gate of FIG. 17A.
Figure 17A:
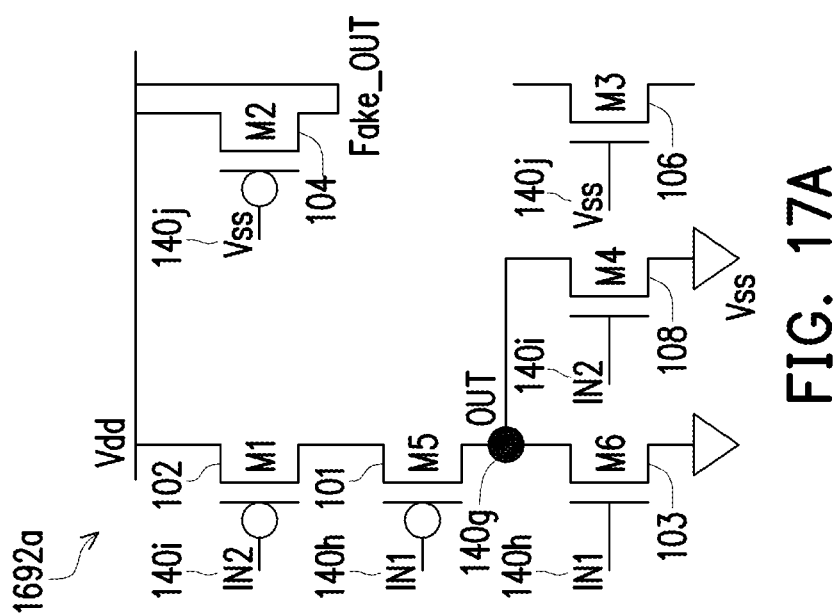
FIG. 17A is a circuit diagram of a NOR gate with two inputs in accordance with some embodiments.

FIGS. 16A to 16B, FIGS. 17A to 17B, and FIGS. 18A to 18B are diagrams illustrating semiconductor devices in accordance with some embodiments. Specifically, FIG. 16A is a circuit diagram of a NAND gate with two inputs in accordance with some embodiments. FIG. 16B is a layout diagram of the NAND gate of FIG. 16A. FIG. 17A is a circuit diagram of a NOR gate with two inputs in accordance with some embodiments. FIG. 17B is a layout diagram of the NOR gate of FIG. 17A. FIG. 18A is a circuit diagram of an inverter in accordance with some embodiments. FIG. 18B is a layout diagram of the inverter of FIG. 18A. The layouts shown in FIG. 16B, FIG. 17B, and FIG. 18B are indistinguishable from each other by using a combination of real contact structures and fake contact structures. Dummy FETs are used to confuse people who want to conduct reverse engineering. As such, anti-RE camouflage can be realized.

Referring to FIG. 16A, a NAND gate 1691a with two inputs includes a p-type FET M1 102, a p-type FET M2 104, an n-type FET M3 106, and an n-type FET M4 108. The NAND gate 1691a further includes a p-type FET M5 101 and an n-type FET M6 103 for anti-RE. In one example, the p-type FET M1 102, the p-type FET M2 104, and the p-type FET M5 101 are PMOS FETs, whereas the n-type FET M3 106, the n-type FET M4 108, and the n-type FET M6 103 are NMOS FETs. In another example, the p-type FET M1 102, the p-type FET M2 104, and the p-type FET M5 101 are p-type FinFETs, whereas the n-type FET M3 106, the n-type FET M4 108, and the n-type FET M6 103 are n-type FinFETs.

Sources of the FET M1 102 and the FET M2 104 are coupled to a first power supply (e.g., a Vdd). Drains of the FET M1 102 and the FET M2 104 are coupled together at an output ("OUT") node 140s. A source of the FET M4 108 is coupled to a second power supply (e.g., a Vss). A drain of the FET M4 108 is coupled to a source of the FET M3 106. A drain of the FET M3 106 is coupled to the OUT node 140s. Additionally, both a drain and a source of the FET M5 101 are coupled to the Vdd. Both a drain and a source of the FET M6 103 are coupled to the Vss. In other words, both the FET M5 101 and the FET M6 103 are shorted. As such, both the FET M5 101 and the FET M6 103 are dummy FETs and have no impact on the operation of the NAND gate 1691a. Gates of the FET M1 102 and the FET M4 108 are coupled together at a first input ("IN1") node 140i. Gates of the FET M2 104 and the FET M3 106 are coupled together at a second input ("IN2") node 140*j*. Gates of the FET M5 101 and the FET M6 103 are coupled together at a Vss input ("Vss") node 140*h*.

When the IN1 node 140*i* is at logical low and the IN2 node 140*j* is at logical low, the OUT node 140*s* is at logical high. When the IN1 node 140*i* is at logical low and the IN2 node 140*j* is at logical high, the OUT node 140*s* is at logical high. When the IN1 node 140*i* is at logical high and the IN2 node 140*j* is at logical low, the OUT node 140*s* is at logical high. When the IN1 node 140*i* is at logical high and the IN2 node 140*j* is at logical high, the OUT node 140*s* is at logical low. Thus, the NAND gate 1691*a* implements a NAND logic operation.

Referring to FIG. 16B, a NAND gate layout 1691*b* includes, among other things, the FET M1 102, the FET M2 104, the FET M3 106, and the FET M4 108. The NAND gate 1691*b* further includes the FET M5 101 and the FET M6 103 for anti-RE. The FET M1 102, the FET M2 104, and the FET M5 101 are disposed in a POD region 112. The FET M3 106, the FET M4 108, and the FET M6 103 are disposed in a NOD region 114. Three gate strips 132, 134, and 136 extend in a Y direction and are disposed over both the POD region 112 and the NOD region 114. The gate strip 134 serves as both the gate of the FET M1 102 and the gate of the FET M4 108. In other words, both the gate of the FET M1 102 and the gate of the FET M4 108 are coupled together at the IN1 node 140*i*. The gate strip 136 serves as both the gate of the FET M2 104 and the gate of the FET M3 106. In other words, both the gate of the FET M2 104 and the gate of the FET M3 106 are coupled together at the IN2 node 140*j*. The gate strip 132 serves as both the gate of the FET M5 101 and the gate of the FET M6 103. In other words, both the gate of the FET M5 101 and the gate of the FET M6 103 are coupled together at the Vss node 140*h*.

The source of the FET M1 102 is located at the left of the gate strip 134 in an X direction. In this illustrated example, the X direction is perpendicular to the Y direction. The drain of the FET M1 102 is located at the right of the gate strip 134 in the X direction. The source of the FET M2 104 is located at the right of the gate strip 136 in the X direction. The drain of the FET M2 104 is located at the left of the gate strip 136 in the X direction. The source of the FET M5 101 is located at the right of the gate strip 132 in the X direction. The drain of the FET M5 101 is located at the left of the gate strip 132 in the X direction.

Likewise, the source of the FET M4 108 is located at the left of the gate strip 134 in the X direction. The drain of the FET M4 108 is located at the right of the gate strip 134 in the X direction. The source of the FET M3 106 is located at the left of the gate strip 136 in the X direction. The drain of the FET M3 106 is located at the right of the gate strip 136 in the X direction. The source of the FET M6 103 is located at the right of the gate strip 132 in the X direction. The drain of the FET M6 103 is located at the left of the gate strip 132 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M2 104, and the FET M5 101 through vertically extended contact structures 140*a*, 140*b*, 140*c*, and 140*q* as well as metal track fingers of the metal track 122 extending in the X direction. The vertical direction is perpendicular to the X-Y plane. The metal track 124 is capable of providing the Vss to the sources and/or drains of the FET M3 106, the FET M4 108, and the FET M6 103 through vertically extended contact structures 140*n*, 140*o*, 140*p*, and 140*u* as well as metal track fingers of the metal track 124 extending in the Y direction.

In the illustrated example, the metal ring 126 has a rectangular shape and includes four sides 126*a*, 126*b*, 126*c*, and 126*d*. The metal ring 126 has an opening 126*e* at the side 126*c* and an opening 126*f* at the side 126*a*. In other words, the metal ring 126 are broken into two half rings. It should be noted that the metal ring 126 may have other shapes. The side 126*a* of the metal ring 126 is capable of connecting the sources and/or drains of the FET M1 102, the FET M2 104, and the FET M5 101 through vertically extended contact structures 140*d*, 140*e*, 140*f*, and 140*r* as well as metal ring fingers of the metal ring 126 extending in the Y direction. The side 126*c* of the metal ring 126 is capable of connecting the sources and/or drains of the FET M3 106, the FET M4 108, and the FET M6 103 through vertically extended contact structures 140*k*, 140*l*, 140*m*, and 140*t* as well as metal ring fingers of the metal ring 126 extending in the Y direction. A vertically extended contact structure 140*s* is disposed over the side 126*b* of the metal ring 126 as the OUT node 140*s*. A vertically extended contact structure 140*g* is disposed over the side 126*d* of the metal ring 126 as a Fake_OUT node 140*g*. The OUT node 140*s* and the Fake_OUT node 140*g* are separated from each other and indistinguishable from each other for RE protection.

A vertically extended contact structure 140*h* is disposed over the gate strip 132 as the Vss node 140*h*. A vertically extended contact structure 140*i* is disposed over the gate strip 134 as the IN1 node 140*i*. A vertically extended contact structure 140*j* is disposed over the gate strip 136 as the IN2 node 140*j*.

The contact structures 140*a*, 140*b*, 140*c*, 140*d*, 140*e*, 140*f*, 140*g*, 140*h*, 140*i*, 140*j*, 140*k*, 140*l*, 140*m*, 140*n*, 140*o*, 140*p*, 140*q*, 140*r*, 140*s*, 140*t*, and 140*u* (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*a*, 140*b*, 140*q*, 140*f*, 140*g*, 140*h*, 140*i*, 140*j*, 140*s*, 140*t*, 140*n*, and 140*o*; the fake contact structures 140F include the contact structures 140*c*, 140*d*, 140*e*, 140*r*, 140*k*, 140*l*, 140*m*, 140*p*, and 140*u*.

Specifically, the sources of the FET M1 102 and the FET M2 104 are coupled to the Vdd because the contact structures 140*b* and 140*q* are real contact structures 140R. The drains of the FET M1 102 and the FET M2 104 are coupled together to the OUT node 140*s* because the contact structure 140*f* is a real contact structure 140R. The drain of the FET M3 106 is also coupled to the OUT node 140*s* because the contact structure 140*t* is a real contact structure 140R. The source of the FET M4 108 is coupled to the Vss because the contact structure 140*o* is a real contact structure 140R. As such, the NAND gate layout 1691*b* can fulfil the NAND logic operation of the NAND gate 1691*a*. Moreover, the FET M5 101 is dummy FET because both the contact structures 140*a* and 140*b* are real contact structures 140R. The FET M6 103 is dummy FET because both the contact structures 140*n* and 140*o* are real contact structures 140R. Additionally, since the contact structures 140*d*, 140*k*, 140*l*, and 140*m* are fake contact structures 140F, the Fake_OUT node 140*g* does not have a real output signal.

Referring to FIG. 17A, a NOR gate 1692*a* with two inputs includes a p-type FET M1 102, a p-type FET M5 101, an n-type FET M4 108, and an n-type FET M6 103. The NOR gate 1692*a* further includes a p-type FET M2 104 and an n-type FET M3 106 for anti-RE. In one example, the p-type FET M1 102, the p-type FET M5 101, and the p-type FET M2 104 are PMOS FETs, whereas the n-type FET M4 108, the n-type FET M6 103, and the n-type FET M3 106 are NMOS FETs. In another example, the p-type FET M1 102, the p-type FET M5 101, and the p-type FET M2 104 are p-type FinFETs, whereas the n-type FET M4 108, the n-type FET M6 103, and the n-type FET M3 106 are n-type FinFETs.

A source of the FET M1 102 is coupled to a first power supply (e.g., a Vdd). A drain of the FET M1 102 is coupled to a source of the FET M5 101. A drain of the FET M5 101 is coupled to an output ("OUT") node 140g. Sources of the FET M4 108 and the FET M6 103 are coupled to a second power supply (e.g., a Vss). Drains of the FET M4 108 and the FET M6 103 are coupled to the OUT node 140g. Additionally, both a drain and a source of the FET M2 104 are coupled to the Vdd. Both a drain and a source of the FET M3 106 are not connected (i.e., floating). In other words, the FET M2 104 is shorted. As such, both the FET M2 104 and the FET M3 106 are dummy FETs and have no impact on the operation of the NOR gate 1692a. Gates of the FET M5 101 and the FET M6 103 are coupled together at a first input ("IN1") node 140h. Gates of the FET M1 102 and the FET M4 108 are coupled together at a second input ("IN2") node 140i. Gates of the FET M2 104 and the FET M3 106 are coupled together at a Vss input ("Vss") node 140j.

When the IN1 node 140h is at logical low and the IN2 node 140i is at logical low, the OUT node 140j is at logical high. When the IN1 node 140h is at logical low and the IN2 node 140i is at logical high, the OUT node 140j is at logical low. When the IN1 node 140h is at logical high and the IN2 node 140i is at logical low, the OUT node 140j is at logical low. When the IN1 node 140h is at logical high and the IN2 node 140i is at logical high, the OUT node 140j is at logical low. Thus, the NOR gate 1692a implements a NOR logic operation.

Referring to FIG. 17B, a NOR gate layout 1692b includes, among other things, the FET M1 102, the FET M5 101, the FET M4 108, and the FET M6 103. The NOR gate layout 1692b further includes the FET M2 104 and the FET M3 106 for anti-RE. The FET M1 102, the FET M5 101, and the FET M2 104 are disposed in a POD region 112. The FET M4 108, the FET M6 103, and the FET M3 106 are disposed in a NOD region 114. Three gate strips 132, 134, and 136 extend in a Y direction and are disposed over both the POD region 112 and the NOD region 114. The gate strip 132 serves as both the gate of the FET M5 101 and the gate of the FET M6 103. In other words, both the gate of the FET M5 101 and the gate of the FET M6 103 are coupled together at the IN1 node 140h. The gate strip 134 serves as both the gate of the FET M1 102 and the gate of the FET M4 108. In other words, both the gate of the FET M1 102 and the gate of the FET M4 108 are coupled together at the IN2 node 140i. The gate strip 136 serves as both the gate of the FET M2 104 and the gate of the FET M3 106. In other words, both the gate of the FET M2 104 and the gate of the FET M3 106 are coupled together at the Vss node 140j.

The source of the FET M5 101 is located at the right of the gate strip 132 in an X direction. In this illustrated example, the X direction is perpendicular to the Y direction. The drain of the FET M5 101 is located at the left of the gate strip 132 in the X direction. The source of the FET M1 102 is located at the right of the gate strip 134 in the X direction. The drain of the FET M1 102 is located at the left of the gate strip 134 in the X direction. The source of the FET M2 104 is located at the left of the gate strip 136 in the X direction. The drain of the FET M2 104 is located at the right of the gate strip 136 in the X direction.

Likewise, the source of the FET M6 103 is located at the right of the gate strip 132 in the X direction. The drain of the FET M6 103 is located at the left of the gate strip 132 in the X direction. The source of the FET M4 108 is located at the left of the gate strip 134 in the X direction. The drain of the FET M4 108 is located at the right of the gate strip 134 in the X direction. The source of the FET M3 106 is located at the right of the gate strip 136 in the X direction. The drain of the FET M3 106 is located at the left of the gate strip 136 in the X direction, or vice versa.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M5 101, and the FET M2 104 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M4 108, the FET M6 103, and the FET M3 106 through vertically extended contact structures 140n, 140o, 140p, and 140u as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M5 101, and the FET M2 104 through vertically extended contact structures 140d, 140e, 140f, and 140r as well as metal ring fingers of the metal ring 126 extending in the Y direction. The side 126c of the metal ring 126 is capable of connecting the sources and/or drains of the FET M4 108, the FET M6 103, and the FET M3 106 through vertically extended contact structures 140k, 140l, 140m, and 140t as well as metal ring fingers of the metal ring 126 extending in the Y direction. A vertically extended contact structure 140s is disposed over the side 126b of the metal ring 126 as a Fake_OUT node 140s. A vertically extended contact structure 140g is disposed over the side 126d of the metal ring 126 as the OUT node 140g. The OUT node 140g and the Fake_OUT node 140s are separated from each other and indistinguishable from each other for RE protection.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the Vss node 140j.

The contact structures 140a, 140b, 140c, 140d, 140e, 140f, 140g, 140h, 140i, 140j, 140k, 140l, 140m, 140n, 140o, 140p, 140q, 140r, 140s, 140t, and 140u (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140c, 140q, 140d, 140g, 140h, 140i, 140j, 140s, 140k, 140m, and 140o; the fake contact structures 140F include the contact structures 140a, 140b, 140e, 140f, 140r, 140l, 140t, 140n, 140p, and 140u.

Specifically, the source of the FET M1 102 is coupled to the Vdd because the contact structure 140c is a real contact structure 140R. The drain of the FET M5 101 is coupled to the OUT node 140g because the contact structure 140d is a real contact structure 140R. The drains of the FET M4 108 and the FET M6 103 are also coupled to the OUT node 140g because the contact structures 140k and 140m are real contact structures 140R. The sources of the FET M4 108 and the FET M6 103 are coupled to the Vss because the contact structure 140o is a real contact structure 140R. As such, the NOR gate layout 1692b can fulfil the NOR logic operation of the NOR gate 1692a. Moreover, the FET M2 104 is a dummy FET because both the contact structures 140c and 140q are real contact structures 140R. The FET M3 106 is a dummy FET because both the contact structures 140p and 140u are fake contact structures 140F. Additionally, since the contact structures 140e, 140f, 140r, and 140t are fake contact structures 140F, the Fake_OUT node 140s does not have a real output signal.

Referring to FIG. 18A, an inverter 1693a includes a p-type FET M5 101, a p-type FET M1 102, an n-type FET M6 103, and an n-type FET M4 108. The inverter 1693a further includes a p-type FET M2 104 and an n-type FET M3 106 for anti-RE. In one example, the p-type FET M5 101, the p-type FET M1 102, and the p-type FET M2 104 are PMOS FETs, whereas the n-type FET M6 103, the n-type FET M4 108, and the n-type FET M3 106 are NMOS FETs. In another example, the p-type FET M5 101, the p-type FET M1 102, and the p-type FET M2 104 are p-type FinFETs, whereas the n-type FET M6 103, the n-type FET M4 108, and the n-type FET M3 106 are n-type FinFETs.

A source of the FET M5 101 is coupled to a first power supply (e.g., a Vdd). A drain of the FET M5 101 is coupled to an output ("OUT") node 140s. A source of the FET M1 102 is coupled to the Vdd. A drain of the FET M1 102 is coupled to the OUT node 140s. A source of the FET M6 103 is coupled to a second power supply (e.g., a Vss). A drain of the FET M6 103 is coupled to another output ("OUT") node 140g. A source of the FET M4 108 is coupled to the Vss. A drain of the FET M4 108 is coupled to the OUT node 140g. The FET M3 106 is coupled between the OUT node 140s and the OUT node 140g. A gate of the FET M3 106 is coupled to the Vdd. As such, the FET M3 106 is on, and the OUT node 140s and the OUT node 140g are connected. A source of the FET M2 104 is coupled to the Vdd. A drain of the FET M2 104 is not connected (i.e., floating). A gate of the FET M2 104 is coupled to the Vdd. As such, the FET M2 104 is off, and the FET M2 104 is a dummy FET and has no impact on the operation of the inverter 1693a. Gates of the FET M5 101 and the FET M6 103 are coupled together at a first input ("IN1") node 140h. Gates of the FET M1 102 and the FET M4 108 are coupled together at a second input (also called "IN1") node 140i. Gates of the FET M2 104 and the FET M3 106 are coupled together at a Vdd input ("Vdd") node 140j.

When the IN1 nodes 140h and 140i are at logical low, the OUT node 140j is at logical high. When the IN1 nodes 140h and 140i are at logical high, the OUT node 140j is at logical low. Thus, the inverter 1693a implements a NOT logic operation.

Referring to FIG. 18B, an inverter layout 1693b includes, among other things, the FET M5 101, the FET M6 103, the FET M1 102, and the FET M4 108. The inverter layout 1693b further includes the FET M2 104 and the FET M3 106 for anti-RE. The FET M5 101, the FET M1 102, and the FET M2 104 are disposed in a POD region 112. The FET M6 103, the FET M4 108, and the FET M3 106 are disposed in a NOD region 114. Three gate strips 132, 134, and 136 extend in a Y direction and are disposed over both the POD region 112 and the NOD region 114. The gate strip 132 serves as both the gate of the FET M5 101 and the gate of the FET M6 103. In other words, both the gate of the FET M5 101 and the gate of the FET M6 103 are coupled together at the IN1 node 140h. The gate strip 134 serves as both the gate of the FET M1 102 and the gate of the FET M4 108. In other words, both the gate of the FET M1 102 and the gate of the FET M4 108 are coupled together at the IN1 node 140i. The gate strip 136 serves as both the gate of the FET M2 104 and the gate of the FET M3 106. In other words, both the gate of the FET M2 104 and the gate of the FET M3 106 are coupled together at the Vdd node 140j.

The source of the FET M5 101 is located at the left of the gate strip 132 in an X direction. In this illustrated example, the X direction is perpendicular to the Y direction. The drain of the FET M5 101 is located at the right of the gate strip 132 in the X direction. The source of the FET M1 102 is located at the right of the gate strip 134 in the X direction. The drain of the FET M1 102 is located at the left of the gate strip 134 in the X direction. The source of the FET M2 104 is located at the right of the gate strip 136 in the X direction. The drain of the FET M2 104 is located at the left of the gate strip 136 in the X direction.

Likewise, the source of the FET M6 103 is located at the right of the gate strip 132 in the X direction. The drain of the FET M6 103 is located at the left of the gate strip 132 in the X direction. The source of the FET M4 108 is located at the left of the gate strip 134 in the X direction. The drain of the FET M4 108 is located at the right of the gate strip 134 in the X direction. The source of the FET M3 106 is located at the left of the gate strip 136 in the X direction. The drain of the FET M3 106 is located at the right of the gate strip 136 in the X direction, or vice versa.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M5 101, the FET M1 102, and the FET M2 104 through vertically extended contact structures 140a, 140b, 140c, and 140q as well as metal track fingers of the metal track 122 extending in the Y direction. The vertical direction is perpendicular to the X-Y plane. The metal track 124 is capable of providing the Vss to the sources and/or drains of the FET M6 103, the FET M4 108, and the FET M3 106 through vertically extended contact structures 140n, 140o, 140p, and 140u as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M5 101, the FET M1 102, and the FET M2 104 through vertically extended contact structures 140d, 140e, 140f, and 140r as well as metal ring fingers of the metal ring 126 extending in the Y direction. The side 126c of the metal ring 126 is capable of connecting the sources and/or drains of the FET M6 103, the FET M4 108, and the FET M3 106 through vertically extended contact structures 140k, 140l, 140m, and 140t as well as metal ring fingers of the metal ring 126 extending in the Y direction. A vertically extended contact structure 140s is disposed over the side 126b of the metal ring 126 as the OUT node 140s. A vertically extended contact structure 140g is disposed over the side 126d of the metal ring 126 as the OUT node 140g. The OUT node 140g and the OUT node 140s are connected through the FET M3 106 as mentioned above.

A vertically extended contact structure 140h is disposed over the gate strip 132 as the IN1 node 140h. A vertically extended contact structure 140i is disposed over the gate strip 134 as the other IN1 node 140i. A vertically extended contact structure 140j is disposed over the gate strip 136 as the Vdd node 140j.

The contact structures 140a, 140b, 140c, 140d, 140e, 140f, 140g, 140h, 140i, 140j, 140k, 140l, 140m, 140n, 140o, 140p, 140q, 140r, 140s, 140t, and 140u (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140c, 140e, 140g, 140h, 140i, 140j, 140s, 140k, 140m, 140t, and 140o; the fake contact structures 140F include the contact structures 140b, 140q, 140d, 140f, 140r, 140l, 140n, 140p, and 140u.

Specifically, the sources of the FET M5 101 and the FET M1 102 are coupled to the Vdd because the contact structures 140a and 140c are real contact structures 140R. The drains of the FET M5 101 and the FET M1 102 are coupled to the OUT node 140s because the contact structure 140e is a real contact structure 140R. The drains of the FET M6 103 and the FET M4 108 are coupled to the OUT node 140g because the contact structures 140k and 140m are real contact structures 140R. The sources of the FET M6 103 and the FET M4 108 are coupled to the Vss because the contact structure 140o is a real contact structure 140R. As such, the inverter layout 1693b can fulfil the NOT logic operation of the inverter 1693a. Moreover, the FET M2 104 is a dummy FET because both the contact structures 140q and 140r are fake contact structures 140F. The gate of the FET M3 106 is coupled to the Vdd. As such, the FET M3 106 is on, and the OUT node 140s and the OUT node 140g are connected.

Figure 19B:
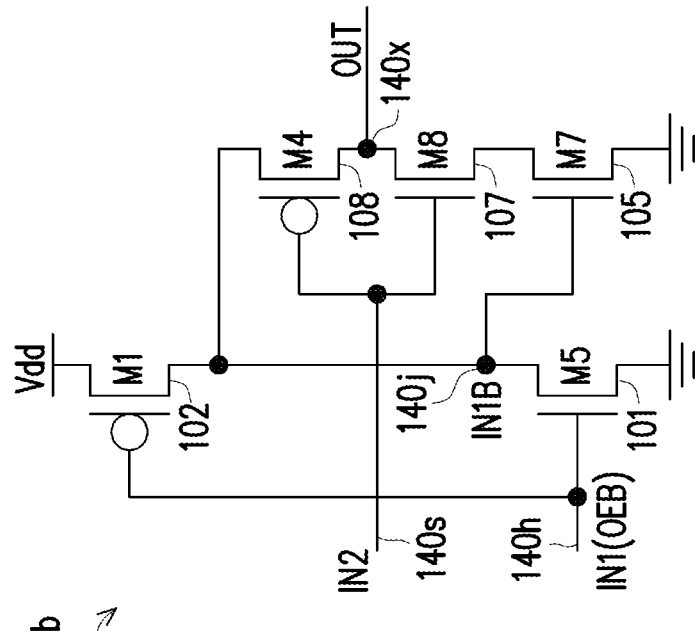
FIG. 19B is an equivalent circuit of the circuit diagram of FIG. 19A.
Figure 19A:
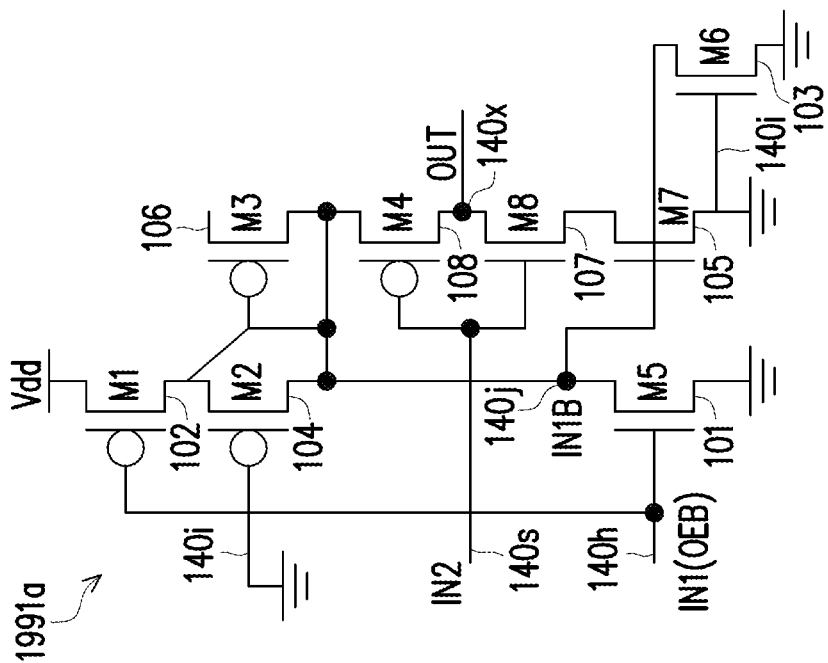
FIG. 19A is a circuit diagram of a tri-state inverter in accordance with some embodiments.
Figure 19C:
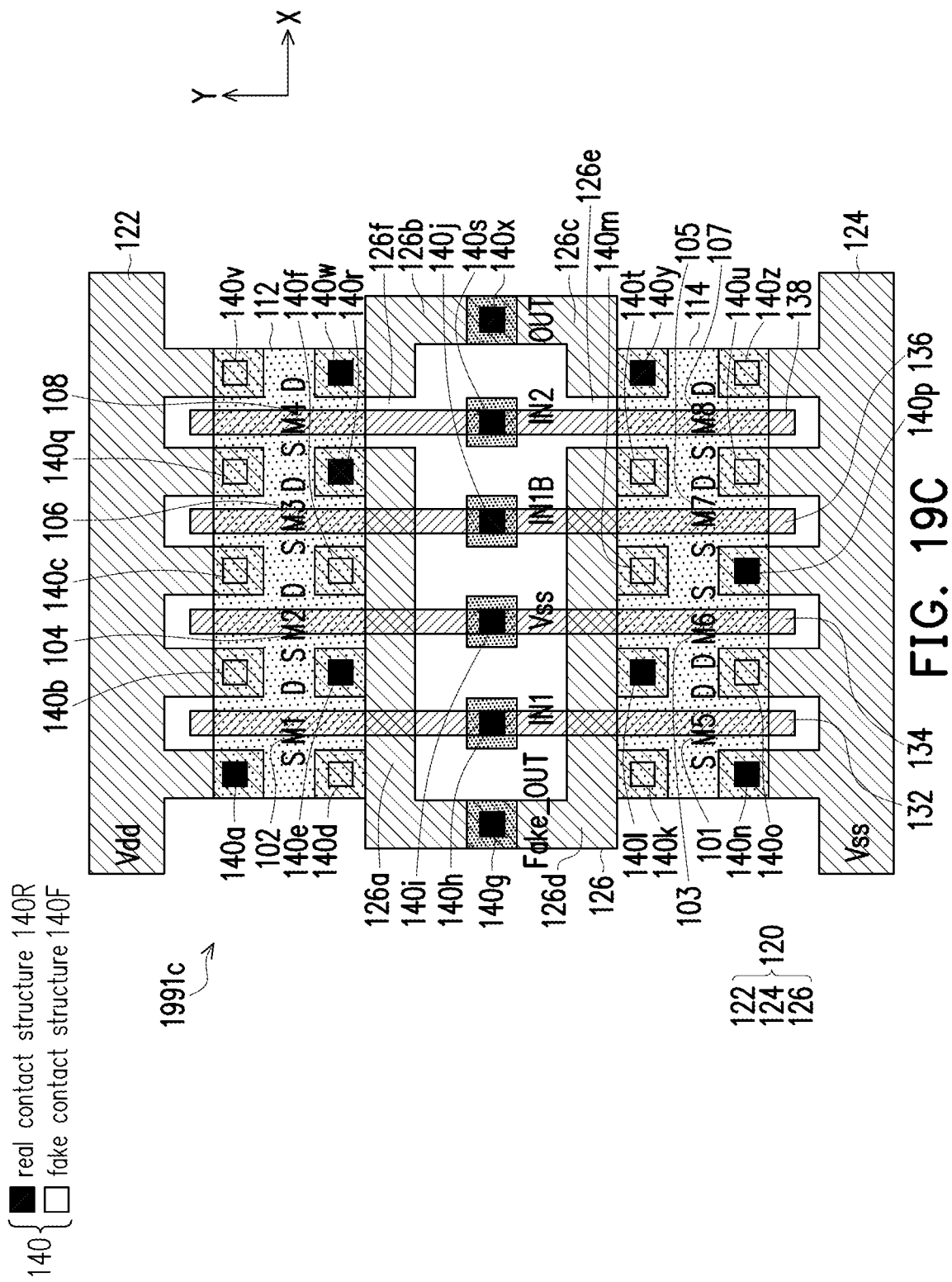
FIG. 19C is a layout diagram of the tri-state inverter of FIG. 19A.
Figures 20A, 20B:
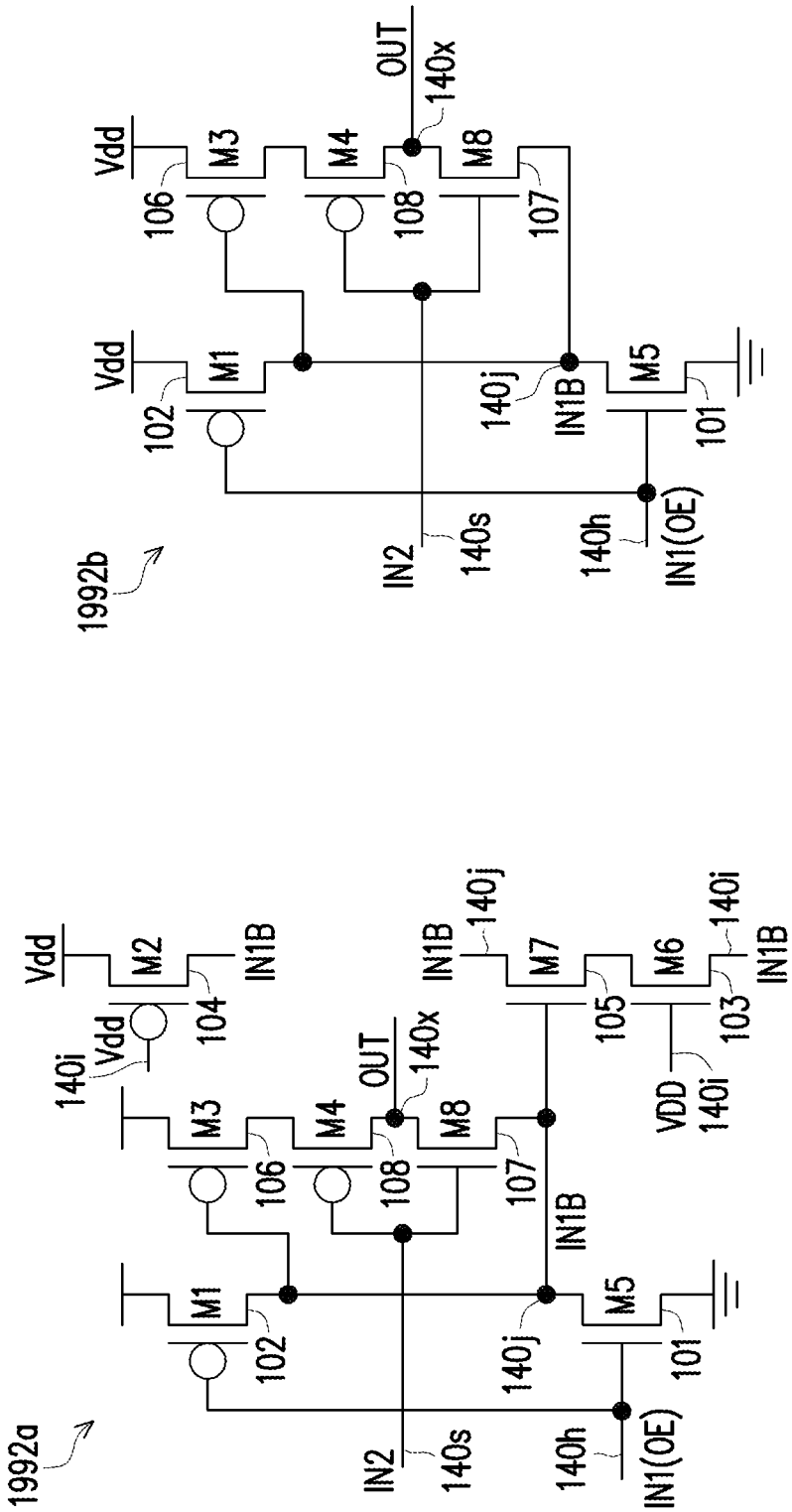
FIG. 20A is a circuit diagram of another tri-state inverter in accordance with some embodiments.
FIG. 20B is an equivalent circuit of the circuit diagram of FIG. 20A.
Figure 21:
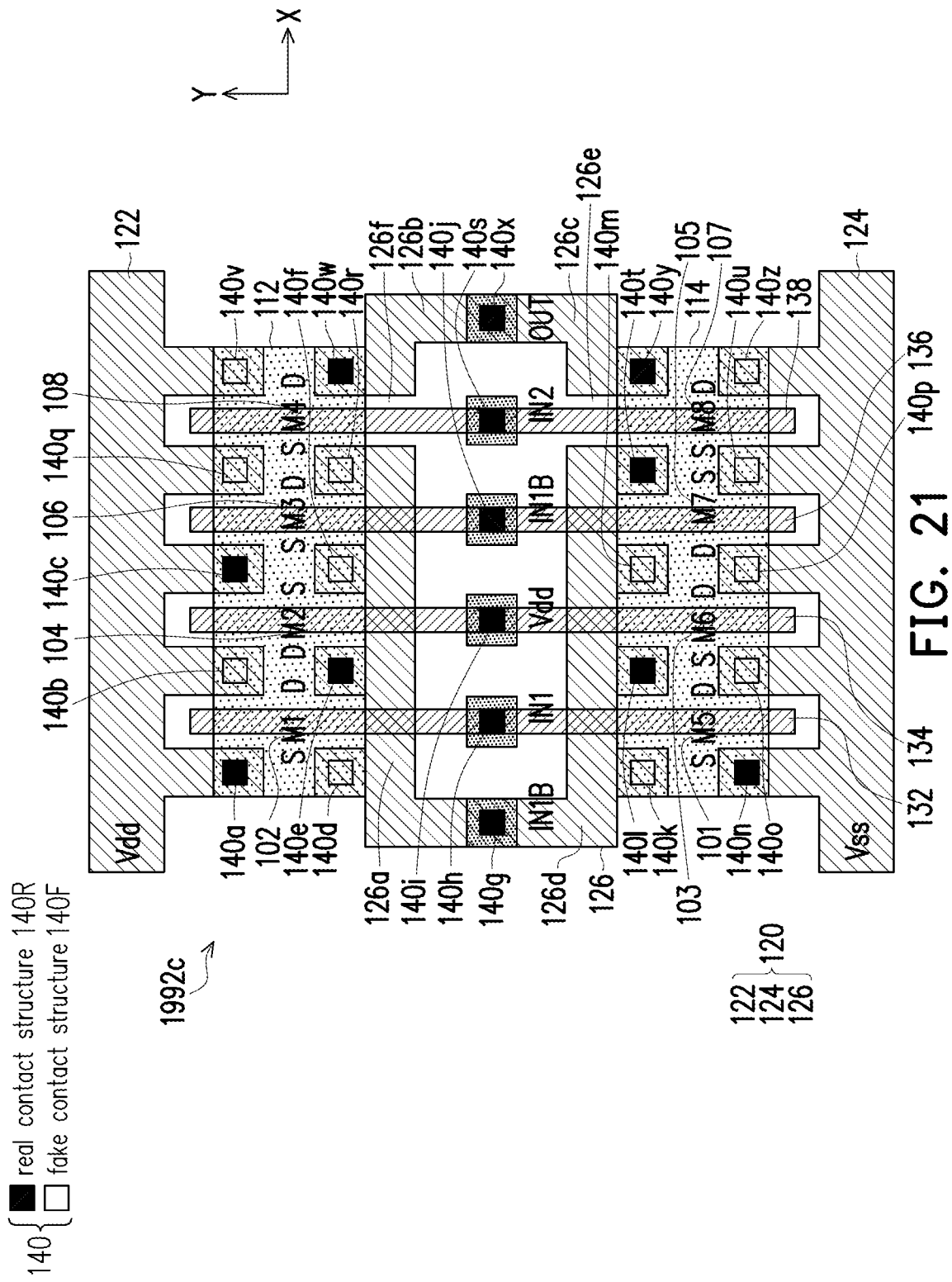
FIG. 21 is a layout diagram of the tri-state inverter of FIG. 20A.

FIGS. 19A to 19C, FIGS. 20A to 20B, and FIG. 21 are diagrams illustrating semiconductor devices in accordance with some embodiments. Specifically, FIG. 19A is a circuit diagram of a tri-state inverter in accordance with some embodiments. FIG. 19B is an equivalent circuit of the circuit diagram of FIG. 19A. FIG. 19C is a layout diagram of the tri-state inverter of FIG. 19A. FIG. 20A is a circuit diagram of another tri-state inverter in accordance with some embodiments. FIG. 20B is an equivalent circuit of the circuit diagram of FIG. 20A. FIG. 21 is a layout diagram of the tri-state inverter of FIG. 20A. The layouts shown in FIG. 19C and FIG. 21 are indistinguishable from each other by using a combination of real contact structures and fake contact structures. Dummy FETs are used to confuse people who want to conduct reverse engineering. As such, anti-RE camouflage can be realized.

Referring to FIG. 19A, a tri-state inverter 1991a includes a p-type FET M1 102, a p-type FET M2 104, a p-type FET M3 106, a p-type FET M4 108, an n-type FET M5 101, an n-type FET M6 103, an n-type FET M7 105, and an n-type FET M8 107. In one example, the p-type FET M1 102, the p-type FET M2 104, the p-type FET M3 106, and the p-type FET M4 108 are PMOS FETs, whereas the n-type FET M5 101, the n-type FET M6 103, the n-type FET M7 105, and the n-type FET M8 107 are NMOS FETs. In another example, the p-type FET M1 102, the p-type FET M2 104, the p-type FET M3 106, and the p-type FET M4 108 are p-type FinFETs, whereas the n-type FET M5 101, the n-type FET M6 103, the n-type FET M7 105, and the n-type FET M8 107 are n-type FinFETs.

Gates of the FET M2 104 and the FET M6 103 are coupled to a ground node 140i. As such, the FET M2 104 is turned on and the FET M6 103 is turned off. A source of the FET M3 106 is not connected (i.e., floating). Therefore, the tri-state inverter 1991a is equivalent to the equivalent circuit diagram 1991b of FIG. 19B.

Referring to FIG. 19B, the tri-state inverter 1991b includes a pair of FETs: the FET M4 108 and the FET M8 107. Gates of the FET M4 108 and the FET M8 107 are coupled to a second input ("IN2") node 140s. A drain of the FET M4 108 is coupled to a drain of the FET M8 107 at an output ("OUT") node 140x. A source of the FET M4 108 is connected to the drain of the FET M1 102 at a first input bar ("IN1B") node 140j. A source of the FET M1 102 is coupled to a first power supply (e.g., a Vdd). A source of the FET M8 107 is coupled to a drain of the FET M7 105. A source of the FET M7 105 is coupled to ground. Gates of the FET M1 102 and the FET M5 101 are coupled to a first input ("IN1") node 140h. The IN1 node 140h is an output enable bar ("OEB") node. A source of the FET M5 101 is coupled to ground. A drain of the FET M5 101 is coupled to a gate of the FET M7 105 at the IN1B node 140j.

When the IN1 node 140h is at logical high, the FET M5 101 is turned on and the FET M1 102 is turned off. As such, the voltage at the IN1B node 140j is pulled to ground and therefore is at logical low. Therefore, the FET M7 105 is turned off and the output is disconnected (i.e., the so-called high-Z state, which adds to logical high and logical low as a third state Z of the tri-state inverter 1991a).

When the IN1 node 140h is at logical low, the FET M5 101 is turned off and the FET M1 102 is turned on. As such, the voltage at the IN1B node 140j is pulled to the Vdd and therefore is at logical high. Therefore, the FET M7 105 is turned on and the output signal at the OUT node 140x is a complement of the second input signal at the IN2 node 140s. Thus, the tri-state inverter 1991a implements a NOT logic operation with OEB.

Referring to FIG. 19C, a tri-state inverter layout 1991c includes, among other things, the FET M1 102, the FET M2 104, the FET M3 106, the FET M4 108, the FET M5 101, the FET M6 103, the FET M7 105, and the FET M8 107. The FET M1 102, the FET M2 104, the FET M3 106, and the FET M4 108 are disposed in a POD region 112. The FET M5 101, the FET M6 103, the FET M7 105, and the FET M8 107 are disposed in a NOD region 114. Four gate strips 132, 134, 136, and 138 extend in a Y direction and are disposed over both the POD region 112 and the NOD region 114. The gate strip 132 serves as both the gate of the FET M1 102 and the gate of the FET M5 101. In other words, both the gate of the FET M1 102 and the gate of the FET M5 101 are coupled together at the IN1 node 140h. The gate strip 134 serves as both the gate of the FET M2 104 and the gate of the FET M6 103. In other words, both the gate of the FET M2 104 and the gate of the FET M6 103 are coupled together at the Vss node 140i. The gate strip 136 serves as both the gate of the FET M3 106 and the gate of the FET M7 105. In other words, both the gate of the FET M3 106 and the gate of the FET M7 105 are coupled together at the IN1B node 140j. The gate strip 138 serves as both the gate of the FET M4 108 and the gate of the FET M8 107. In other words, both the gate of the FET M4 108 and the gate of the FET M8 107 are coupled together at the IN2 node 140s.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. The source of the FET M3 106 is located at the left of the gate strip 136 in the X direction. The drain of the FET M3 106 is located at the right of the gate strip 136 in the X direction. The source of the FET M4 108 is located at the left of the gate strip 138 in the X direction. The drain of the FET M4 108 is located at the right of the gate strip 138 in the X direction.

Likewise, the source of the FET M5 101 is located at the left of the gate strip 132 in an X direction. The drain of the FET M5 101 is located at the right of the gate strip 132 in the X direction. The source of the FET M6 103 is located at the right of the gate strip 134 in the X direction. The drain of the FET M6 103 is located at the left of the gate strip 134 in the X direction. The source of the FET M7 105 is located at the left of the gate strip 136 in the X direction. The drain of the FET M7 105 is located at the right of the gate strip 136 in the X direction. The source of the FET M8 107 is located at the left of the gate strip 138 in the X direction. The drain of the FET M8 107 is located at the right of the gate strip 138 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M2 104, the FET M3 106, and the FET M4 108 through vertically extended contact structures 140a, 140b, 140c, 140q, and 140v as well as metal track fingers of the metal track 122 extending in the Y direction. The vertical direction is perpendicular to the X-Y plane. The metal track 124 is capable of providing the Vss (here, Vss is ground) to the sources and/or drains of the FET M5 101, the FET M6 103, the FET M7 105, and the FET M8 107 through vertically extended contact structures 140n, 140o, 140p, 140u, and 140z as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M2 104, the FET M3 106, and the FET M4 108 through vertically extended contact structures 140d, 140e, 140f, 140r, and 140w as well as metal ring fingers of the metal ring 126 extending in the Y direction. The side 126c of the metal ring 126 is capable of connecting the sources and/or drains of the FET M5 101, the FET M6 103, the FET M7 105, and the FET M8 107 through vertically extended contact structures 140k, 140l, 140m, 140t, and 140y as well as metal ring fingers of the metal ring 126 extending in the Y direction. A vertically extended contact structure 140x is disposed over the side 126b of the metal ring 126 as the OUT node 140x. A vertically extended contact structure 140g is disposed over the side 126d of the metal ring 126 as a Fake_OUT node 140g. The side 126c is connected to the IN1B node 140j. Therefore, the Fake_OUT node 140g and the IN1B node 140j are connected. The OUT node 140x and the Fake_OUT node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the Vss node 140i. A vertically extended contact structure 140j is disposed over the gate strip 136 as the IN1B node 140j. A vertically extended contact structure 140s is disposed over the gate strip 138 as the IN2 node 140s.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, and 140z (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140e, 140r, 140w, 140g, 140h, 140i, 140j, 140s, 140x, 140l, 140y, 140n, and 140p; the fake contact structures 140F include the contact structures 140b, 140c, 140q, 140v, 140d, 140f, 140k, 140m, 140t, 140o, 140u, and 140z.

Specifically, the source of the FET M1 102 is coupled to the Vdd because the contact structure 140a is a real contact structure 140R. The drains of the FET M1 102 and the FET M3 106 are coupled together to the IN1B node 140j because the contact structures 140e and 140r are real contact structures 140R. The drains of the FET M5 101 and the FET M6 103 are also coupled to the IN1B node 140j because the contact structure 140l is a real contact structure 140R. The sources of the FET M5 101, the FET M6 103, and the FET M7 105 are coupled to the Vss (here, Vss is ground) because the contact structures 140n and 140p are real contact structures 140R. The drains of the FET M4 108 and the FET M8 107 are coupled to the OUT node 140x because the contact structures 140w and 140y are real contact structures 140R. As such, the tri-state inverter layout 1991c can fulfil the NOT logic operation with OEB of the tri-state inverter 1991a. Moreover, the FET M2 104, the FET M3 106, and the FET M6 103 are dummy FETs as explained above.

Referring to FIG. 20A, a tri-state inverter 1992a includes a p-type FET M1 102, a p-type FET M3 106, a p-type FET M4 108, a p-type FET M2 104, an n-type FET M8 107, an n-type FET M5 101, an n-type FET M6 103, and an n-type FET M7 105. In one example, the p-type FET M1 102, the p-type FET M3 106, the p-type FET M4 108, and the p-type FET M2 104 are PMOS FETs, whereas the n-type FET M8 107, the n-type FET M5 101, the n-type FET M6 103, and the n-type FET M7 105 are NMOS FETs. In another example, the p-type FET M1 102, the p-type FET M3 106, the p-type FET M4 108, and the p-type FET M2 104 are p-type FinFETs, whereas the n-type FET M8 107, the n-type FET M5 101, the n-type FET M6 103, and the n-type FET M7 105 are n-type FinFETs.

Gates of the FET M2 104 and the FET M6 103 are coupled to a first power supply (e.g., a Vdd) node 140i. As such, the FET M4 104 is turned off and the FET M6 103 is turned on. A source of the FET M2 104 is coupled to the Vdd. A drain of the FET M2 104 is coupled to a first input bar ("IN1B") node 140j. Sources of the FET M6 103 and the FET M7 105 are coupled the IN1B node 140j. Drains of the FET M6 103 and the FET M7 105 are coupled together. Therefore, the tri-state inverter 1992a is equivalent to the equivalent circuit diagram 1992b of FIG. 19B.

Referring to FIG. 20B, the tri-state inverter 1992b includes a pair of FETs: the FET M4 108 and the FET M8 107. Gates of the FET M4 108 and the FET M8 107 are coupled to a second input ("IN2") node 140s. A drain of the FET M4 108 is coupled to a drain of the FET M8 107 at an output ("OUT") node 140x. A source of the FET M8 107 is coupled to a drain of the FET M5 101 at the IN1B node 140j. A source of the FET M5 101 is coupled to ground. A source of the FET M4 108 is coupled to a drain of the FET M3 106. A source of the FET M3 106 is coupled to the Vdd. Gates of the FET M1 102 and the FET M5 101 are coupled to a first input ("IN1") node 140h. The IN1 node 140h is an output enable ("OE") node. A source of the FET M1 102 is coupled to the Vdd. A drain of the FET M1 102 is coupled to a gate of the FET M3 106 at the IN1B node 140j.

When the IN1 node 140h is at logical high, the FET M5 101 is turned on and the FET M1 102 is turned off. As such, the voltage at the IN1B node 140j is pulled to ground and therefore is at logical low. Therefore, the FET M3 106 is turned on and the output signal at the OUT node 140x is a complement of the second input signal at the IN2 node 140s.

When the IN1 node 140h is at logical low, the FET M5 101 is turned off and the FET M1 102 is turned on. As such, the voltage at the IN1B node 140j is pulled to the Vdd and therefore is at logical high. Therefore, the FET M3 106 is turned off and the output is disconnected (i.e., the so-called high-Z state, which adds to logical high and logical low as a third state Z of the tri-state inverter 1992a). Thus, the tri-state inverter 1992a implements a NOT logic operation with OE.

Referring to FIG. 21, a tri-state inverter layout 1992c includes, among other things, the FET M1 102, the FET M3 106, the FET M4 108, the FET M2 104, the FET M8 107, the FET M5 101, the FET M6 103, and the FET M7 105. The FET M1 102, the FET M3 106, the FET M4 108, and the FET M2 104 are disposed in a POD region 112. The FET M8 107, the FET M5 101, the FET M6 103, and the FET M7 105 are disposed in a NOD region 114. Four gate strips 132, 134, 136, and 138 extend in a Y direction and are disposed over both the POD region 112 and the NOD region 114. The gate strip 132 serves as both the gate of the FET M1 102 and the gate of the FET M5 101. In other words, both the gate of the FET M1 102 and the gate of the FET M5 101 are coupled together at the IN1 node 140h. The gate strip 134 serves as both the gate of the FET M2 104 and the gate of the FET M6 103. In other words, both the gate of the FET M2 104 and the gate of the FET M6 103 are coupled together at the Vdd node 140i. The gate strip 136 serves as both the gate of the FET M3 106 and the gate of the FET M7 105. In other words, both the gate of the FET M3 106 and the gate of the FET M7 105 are coupled together at the IN1B node 140j. The gate strip 138 serves as both the gate of the FET M4 108 and the gate of the FET M8 107. In other words, both the gate of the FET M4 108 and the gate of the FET M8 107 are coupled together at the IN2 node 140s.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. The source of the FET M3 106 is located at the left of the gate strip 136 in the X direction. The drain of the FET M3 106 is located at the right of the gate strip 136 in the X direction. The source of the FET M4 108 is located at the left of the gate strip 138 in the X direction. The drain of the FET M4 108 is located at the right of the gate strip 138 in the X direction.

Likewise, the source of the FET M5 101 is located at the left of the gate strip 132 in an X direction. The drain of the FET M5 101 is located at the right of the gate strip 132 in the X direction. The source of the FET M6 103 is located at the left of the gate strip 134 in the X direction. The drain of the FET M6 103 is located at the right of the gate strip 134 in the X direction. The source of the FET M7 105 is located at the right of the gate strip 136 in the X direction. The drain of the FET M7 105 is located at the left of the gate strip 136 in the X direction. The source of the FET M8 107 is located at the left of the gate strip 138 in the X direction. The drain of the FET M8 107 is located at the right of the gate strip 138 in the X direction.

A metal track 122, a metal track 124, and a metal ring 126 are disposed in a metal layer 120 over the POD region 112, the NOD region 114, and the gate strips 132, 134, and 136. The metal track 122 is capable of providing the Vdd to the sources and/or drains of the FET M1 102, the FET M3 106, the FET M4 108, and the FET M2 104 through vertically extended contact structures 140a, 140b, 140c, 140q, and 140v as well as metal track fingers of the metal track 122 extending in the Y direction. The vertical direction is perpendicular to the X-Y plane. The metal track 124 is capable of providing the Vss (here, Vss is ground) to the sources and/or drains of the FET M8 107, the FET M5 101, the FET M6 103, and the FET M7 105 through vertically extended contact structures 140n, 140o, 140p, 140u, and 140z as well as metal track fingers of the metal track 124 extending in the Y direction.

In the illustrated example, the metal ring 126 has a rectangular shape and includes four sides 126a, 126b, 126c, and 126d. The metal ring 126 has an opening 126e at the side 126c and an opening 126f at the side 126a. In other words, the metal ring 126 are broken into two half rings. It should be noted that the metal ring 126 may have other shapes. The side 126a of the metal ring 126 is capable of connecting the sources and/or drains of the FET M1 102, the FET M3 106, the FET M4 108, and the FET M2 104 through vertically extended contact structures 140d, 140e, 140f, 140r, and 140w as well as metal ring fingers of the metal ring 126 extending in the Y direction. The side 126c of the metal ring 126 is capable of connecting the sources and/or drains of the FET M8 107, the FET M5 101, the FET M6 103, and the FET M7 105 through vertically extended contact structures 140k, 140l, 140m, 140t, and 140y as well as metal ring fingers of the metal ring 126 extending in the Y direction. A vertically extended contact structure 140x is disposed over the side 126b of the metal ring 126 as the OUT node 140x. A vertically extended contact structure 140g is disposed over the side 126d of the metal ring 126 as another IN1B node 140g. The side 126c is connected to the IN1B node 140j. Therefore, the IN1B node 140g and the IN1B node 140j are connected. The OUT node 140x and the IN1B node 140g are separated from each other and indistinguishable from each other for RE protection.

A vertically extended contact structure 140h is disposed over the gate strip 132 as the IN1 node 140h. A vertically extended contact structure 140i is disposed over the gate strip 134 as the Vdd node 140i. A vertically extended contact structure 140j is disposed over the gate strip 136 as the IN1B node 140j. A vertically extended contact structure 140s is disposed over the gate strip 138 as the IN2 node 140s.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, and 140z (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140*a*, 140*c*, 140*e*, 140*w*, 140*g*, 140*h*, 140*i*, 140*j*, 140*s*, 140*x*, 140*l*, 140*t*, 140*y*, and 140*n*; the fake contact structures 140F include the contact structures 140*b*, 140*q*, 140*v*, 140*d*, 140*f*, 140*r*, 140*k*, 140*m*, 140*o*, 140*p*, 140*u*, and 140*z*.

Specifically, the sources of the FET M1 102 and the FET M3 106 are coupled to the Vdd because the contact structures 140*a* and 140*c* are real contact structures 140R. The drain of the FET M1 102 is coupled to the IN1B node 140*j* because the contact structure 140*e* is a real contact structure 140R. The drain of the FET M5 101 is also coupled to the IN1B node 140*j* because the contact structure 140*l* is a real contact structure 140R. The source of the FET M5 101 is coupled to the Vss (here, Vss is ground) because the contact structure 140*n* is a real contact structure 140R. The drains of the FET M4 108 and the FET M8 107 are coupled to the OUT node 140*x* because the contact structures 140*w* and 140*y* are real contact structures 140R. As such, the tri-state inverter layout 1992*c* can fulfil the NOT logic operation with OE of the tri-state inverter 1992*a*. Moreover, the FET M2 104, the FET M6 103, and the FET M7 105 are dummy FETs as explained above.

Figure 22A:
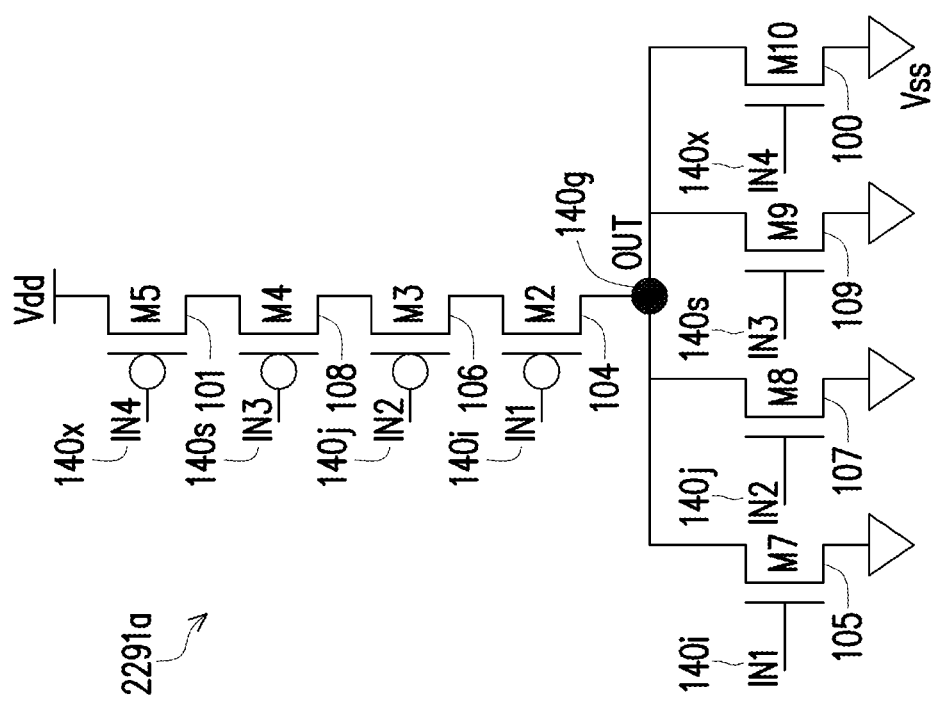
FIG. 22A is a circuit diagram of a NOR gate with four inputs in accordance with some embodiments.
Figure 22B:
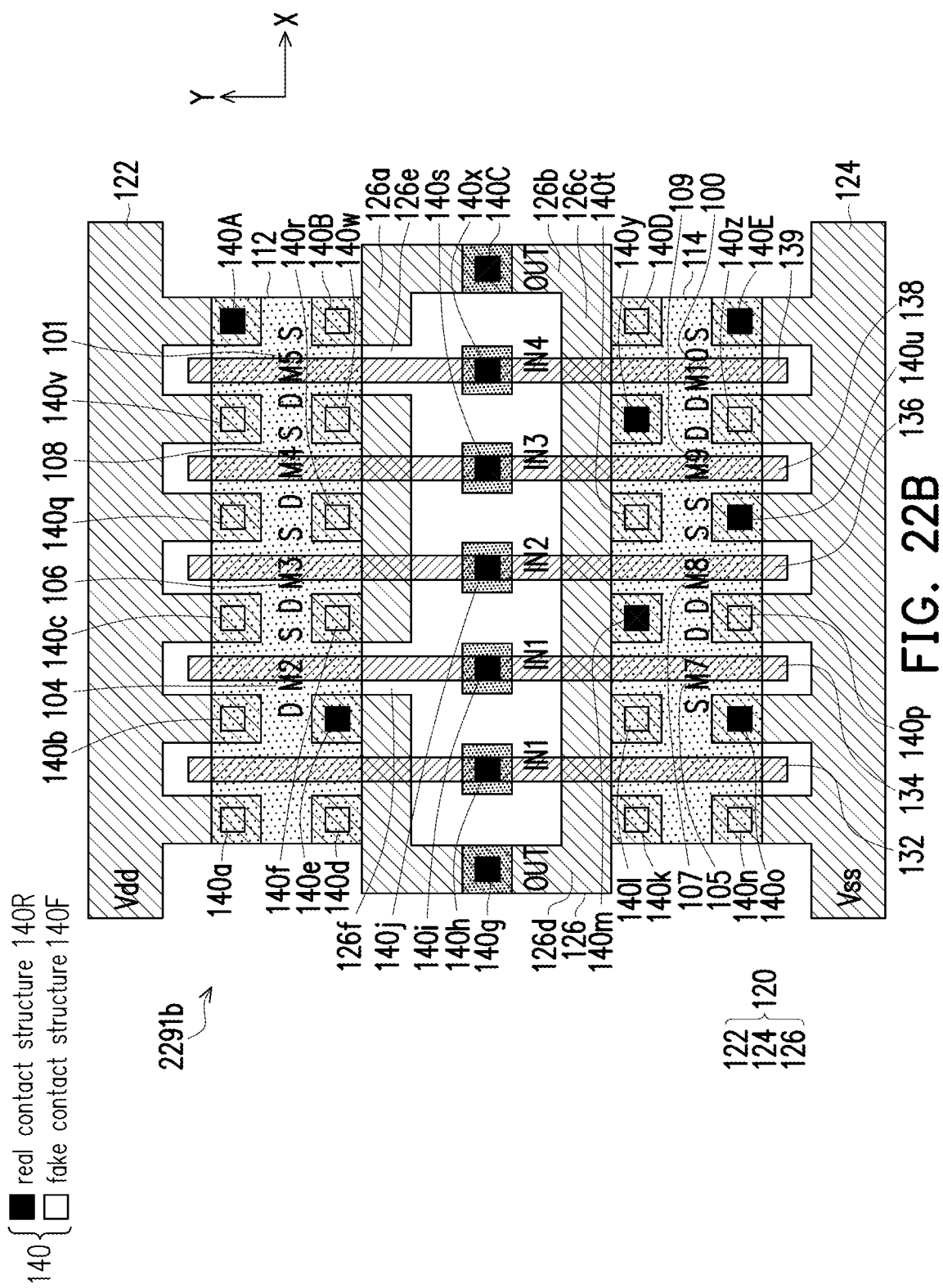
FIG. 22B is a layout diagram of the NOR gate of FIG. 22A.
Figure 23A:
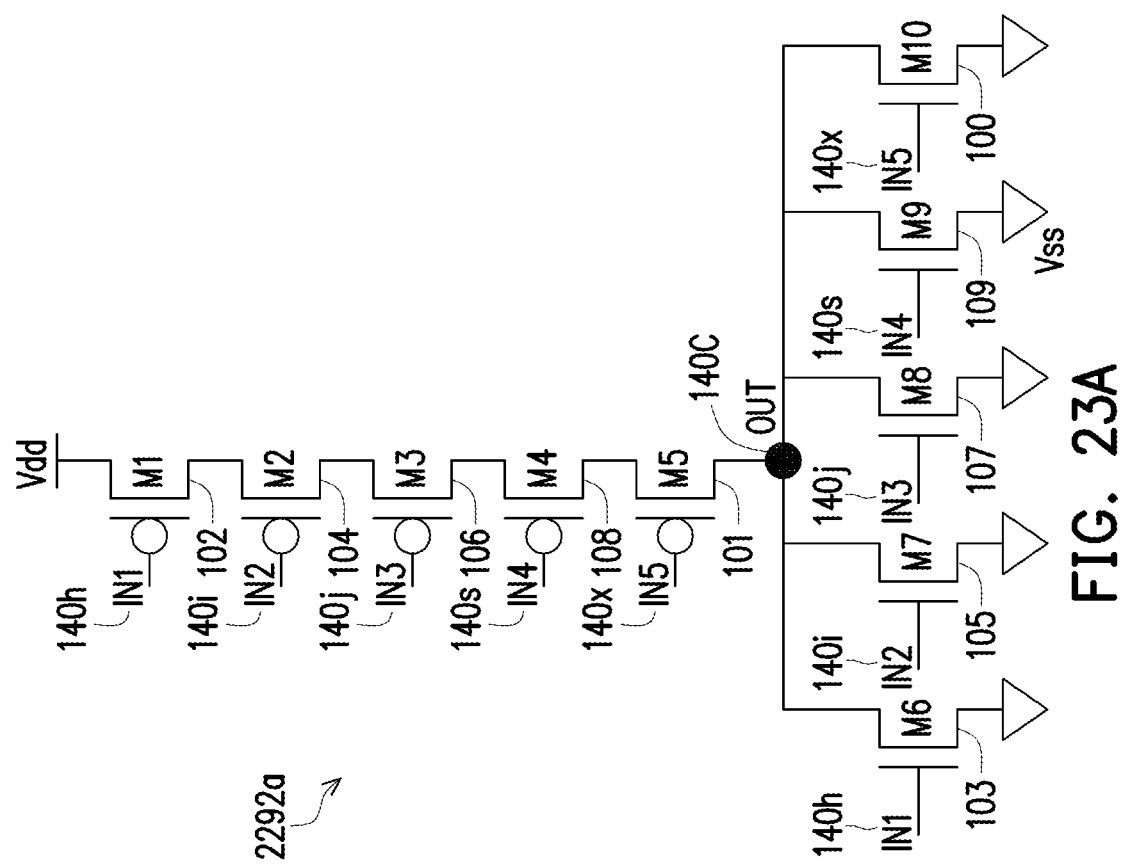
FIG. 23A is a circuit diagram of a NOR gate with five inputs in accordance with some embodiments.
Figure 23B:
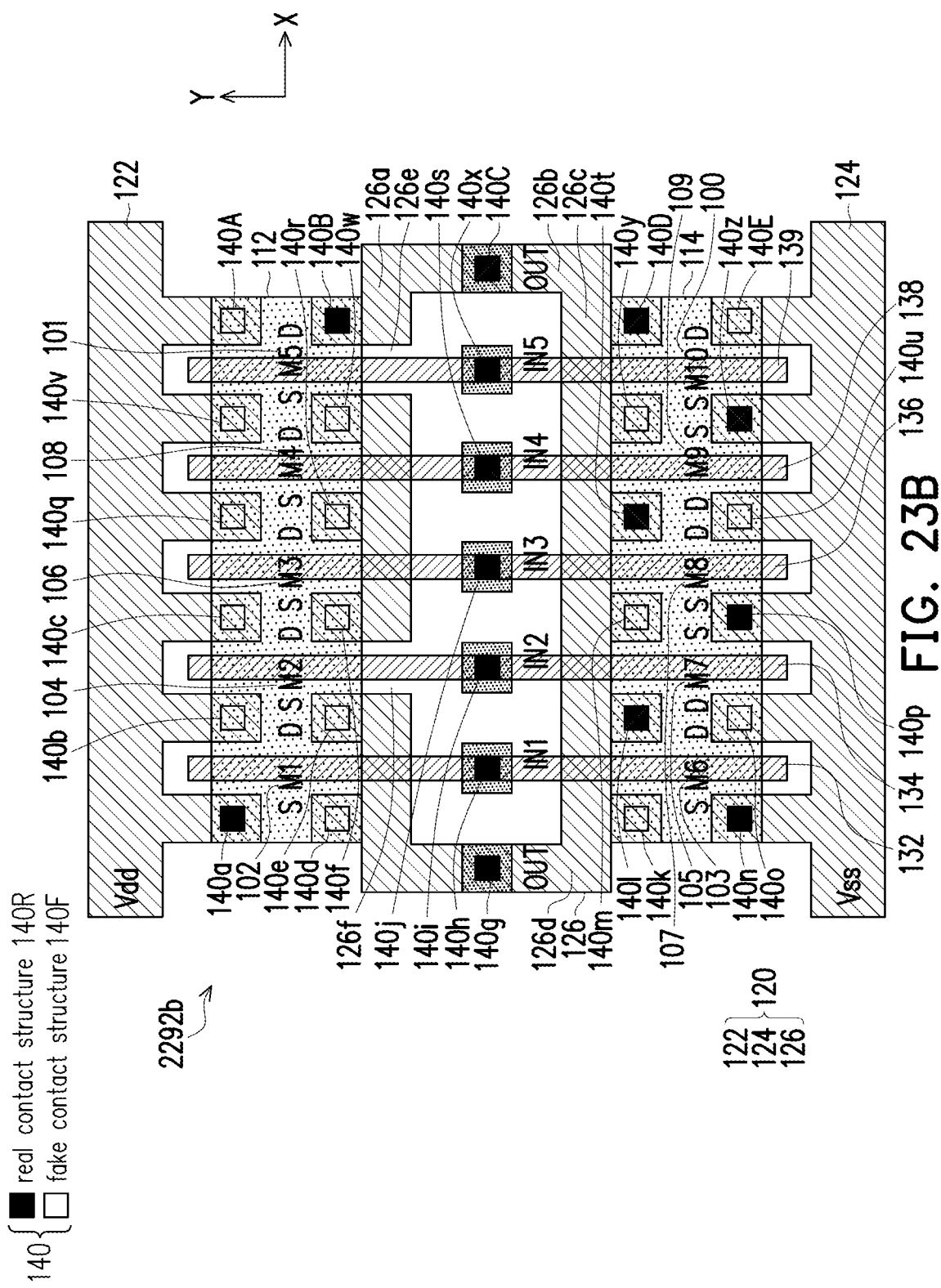
FIG. 23B is a layout diagram of the NOR gate of FIG. 23A.
Figure 24B:
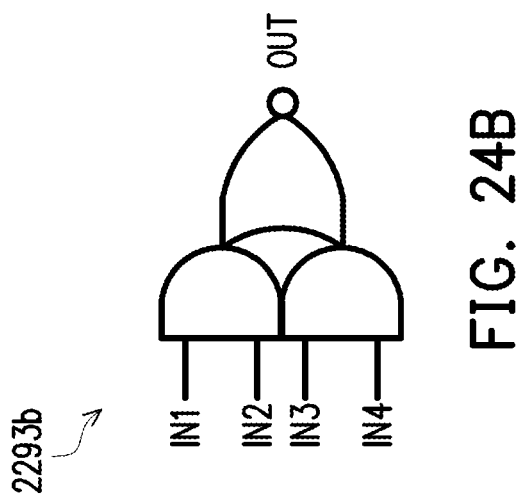
FIG. 24B is a logical gate equivalent of the circuit of FIG. 24A.
Figure 24A:
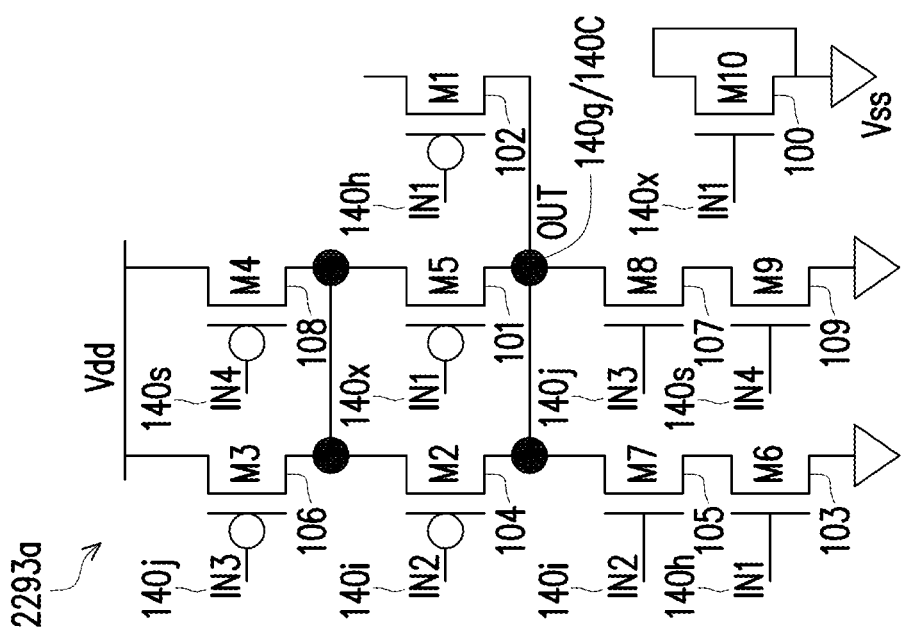
FIG. 24A is a circuit diagram of a circuit in accordance with some embodiments.
Figure 24C:
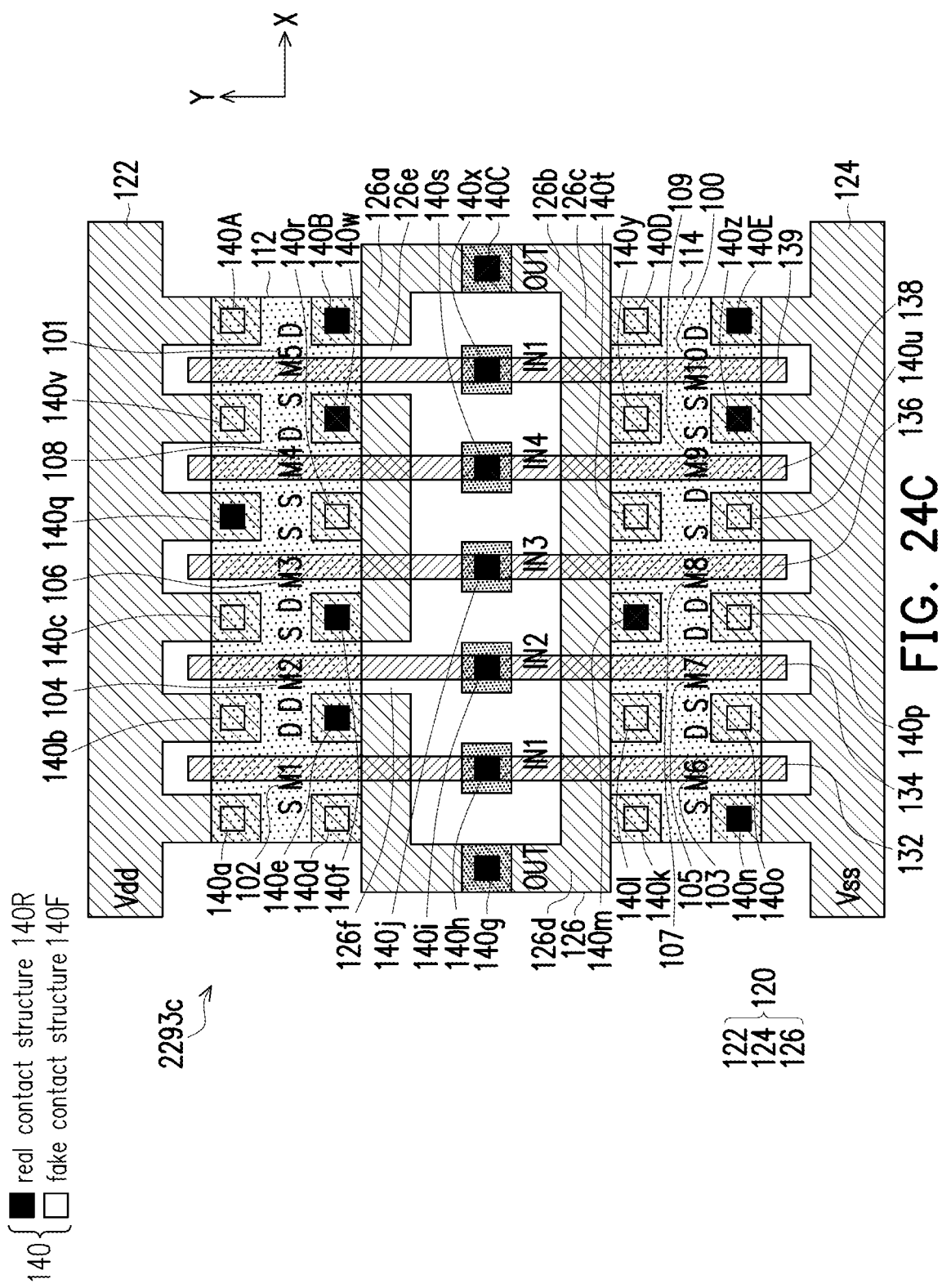
FIG. 24C is a layout diagram of the circuit of FIG. 24A.
Figure 25B:
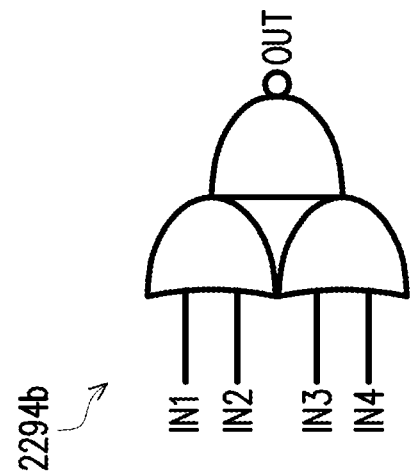
FIG. 25B is a logical gate equivalent of the circuit of FIG. 25A.
Figure 25A:
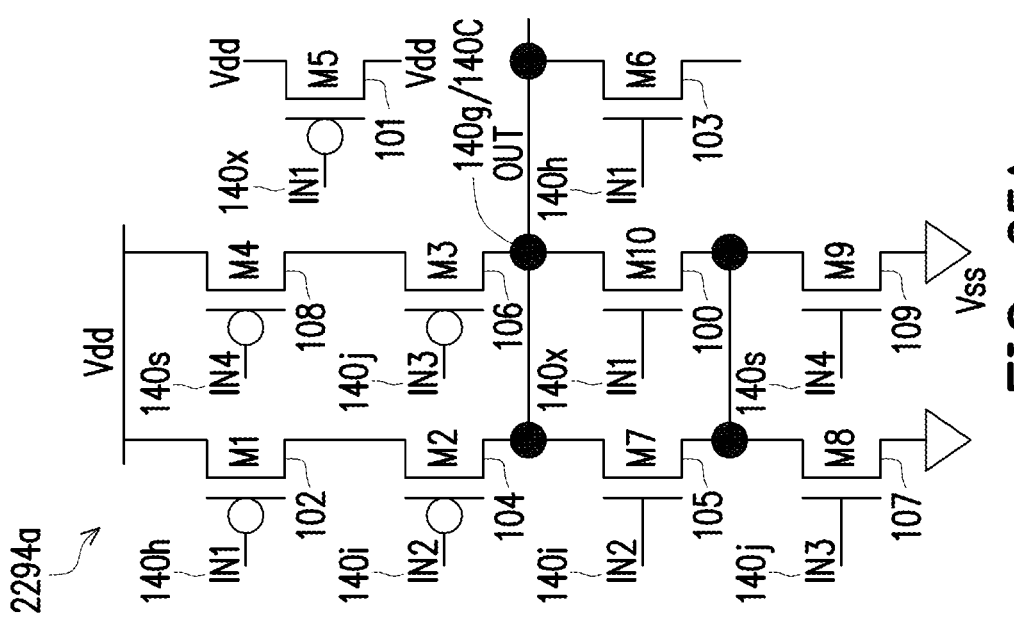
FIG. 25A is a circuit diagram of a circuit in accordance with some embodiments.
Figure 26:
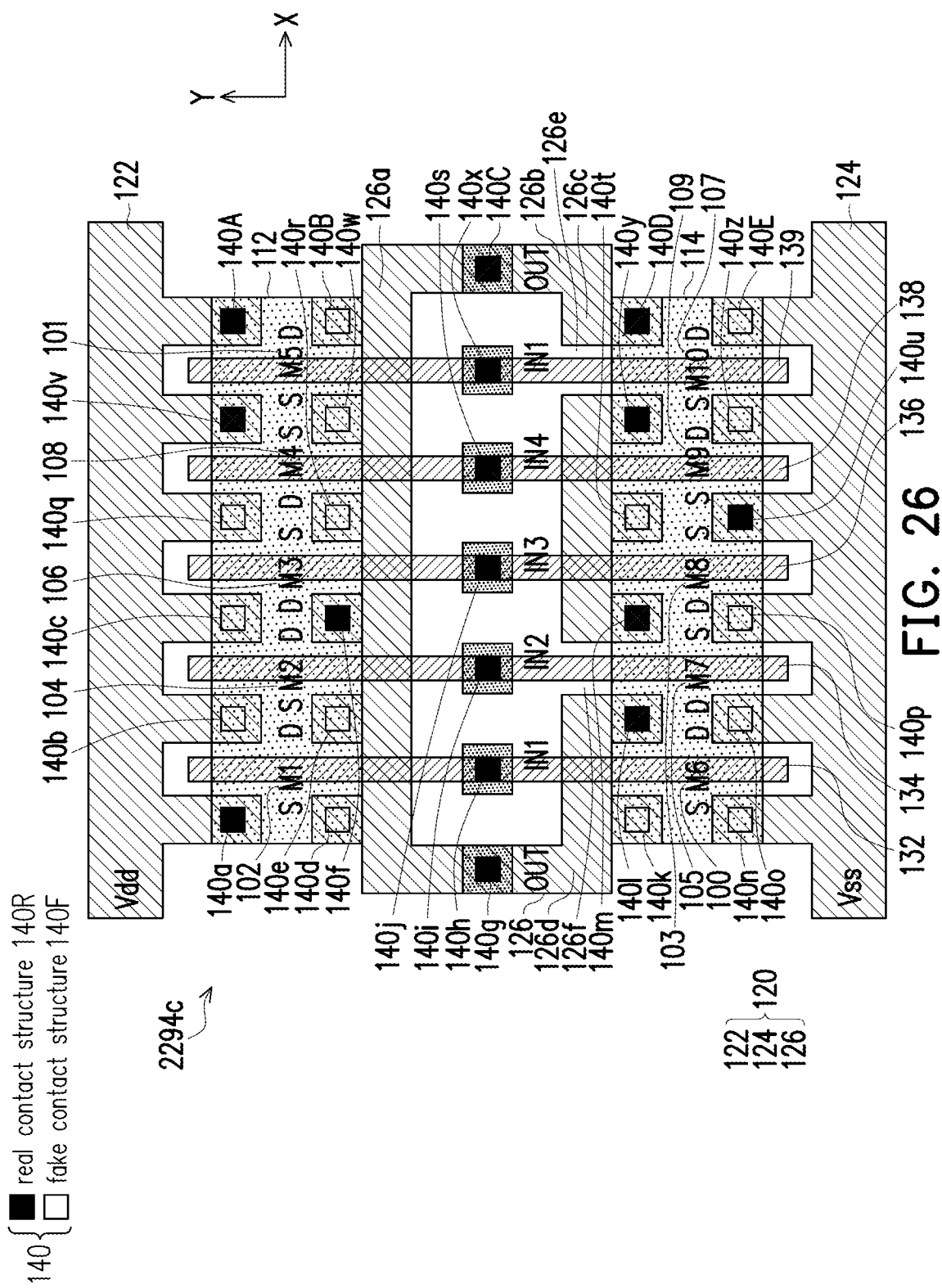
FIG. 26 is a layout diagram of the circuit of FIG. 25A.

FIGS. 22A to 22B, FIGS. 23A to 23B, FIGS. 24A to 24C, FIGS. 25A to 25B, and FIG. 26 are diagrams illustrating semiconductor devices in accordance with some embodiments. Specifically, FIG. 22A is a circuit diagram of a NOR gate with four inputs in accordance with some embodiments. FIG. 22B is a layout diagram of the NOR gate of FIG. 22A. FIG. 23A is a circuit diagram of a NOR gate with five inputs in accordance with some embodiments. FIG. 23B is a layout diagram of the NOR gate of FIG. 23A. FIG. 24A is a circuit diagram of a circuit in accordance with some embodiments. FIG. 24B is a logical gate 2293*b* equivalent of the circuit of FIG. 24A. FIG. 24C is a layout diagram of the circuit of FIG. 24A. FIG. 25A is a circuit diagram of a circuit in accordance with some embodiments. FIG. 25B is a logical gate 2294*b* equivalent of the circuit of FIG. 25A. FIG. 26 is a layout diagram of the circuit of FIG. 25A. The layouts shown in FIG. 22B, FIG. 23B, and FIG. 24C are indistinguishable from each other by using a combination of real contact structures and fake contact structures. Dummy FETs are used to confuse people who want to conduct reverse engineering. Some inputs can be added without affecting the logic function of the circuit. As such, anti-RE camouflage can be realized.

Referring to FIG. 22A, a NOR gate 2291*a* with four inputs includes a p-type FET M5 101, a p-type FET M4 108, a p-type FET M3 106, a p-type FET M2 104, an n-type FET M7 105, an n-type FET M8 107, an n-type FET M9 109, and an n-type FET M10 100. In one example, the p-type FET M5 101, the p-type FET M4 108, the p-type FET M3 106, and the p-type FET M2 104 are PMOS FETs, whereas the n-type FET M7 105, the n-type FET M8 107, the n-type FET M9 109, and the n-type FET M10 100 are NMOS FETs. In another example, the p-type FET M5 101, the p-type FET M4 108, the p-type FET M3 106, and the p-type FET M2 104 are p-type FinFETs, whereas the n-type FET M7 105, the n-type FET M8 107, the n-type FET M9 109, and the n-type FET M10 100 are n-type FinFETs.

A source of the FET M5 101 is coupled to a first power supply (e.g., a Vdd). A drain of the FET M5 101 is coupled to a source of the FET M4 108. A drain of the FET M4 108 is coupled to a source of the FET M3 106. A drain of the FET M3 106 is coupled to a source of the FET M2 104. A drain of the FET M2 104 is coupled to an output ("OUT") node 140*g*. Sources of the FET M7 105, the FET M8 107, the FET M9 109, and the FET M10 100 are coupled together to a second power supply (e.g., a Vss). Drains of the FET M7 105, the FET M8 107, the FET M9 109, and the FET M10 100 are coupled together at the OUT node 140*g*. Gates of the FET M5 101 and the FET M10 100 are coupled together at a fourth input ("IN4") node 140*x*. Gates of the FET M4 108 and the FET M9 109 are coupled together at a third input ("IN3") node 140*s*. Gates of the FET M3 106 and the FET M8 107 are coupled together at a second input ("IN2") node 140*j*. Gates of the FET M2 104 and the FET M7 105 are coupled together at a first input ("IN1") node 140*i*.

When the IN1 node 140*i* is at logical low, the IN2 node 140*j* is at logical low, the IN3 node 140*s* is at logical low, and the IN4 node 140*x* is at logical low, the OUT node 140*g* is at logical high. In all other situations, the OUT node 140*g* is at logical low. Thus, the NOR gate 2291*a* implements a NOR logic operation.

Referring to FIG. 22B, a NOR gate layout 2291*b* includes, among other things, the FET M5 101, the FET M4 108, the FET M3 106, the FET M2 104, the FET M7 105, the FET M8 107, the FET M9 109, and the FET M10 100. The FET M5 101, the FET M4 108, the FET M3 106, and the FET M2 104 are disposed in a POD region 112. The FET M7 105, the FET M8 107, the FET M9 109, and the FET M10 100 are disposed in a NOD region 114. Five gate strips 132, 134, 136, 138, and 139 extend in a Y direction and are disposed over both the POD region 112 and the NOD region 114. The gate strip 132 does not serve as the gate of any FET. The gate strip 134 serves as both the gate of the FET M2 104 and the gate of the FET M7 105. In other words, both the gate of the FET M2 104 and the gate of the FET M7 105 are coupled together at the IN1 node 140*i*. The gate strip 136 serves as both the gate of the FET M3 106 and the gate of the FET M8 107. In other words, both the gate of the FET M3 106 and the gate of the FET M8 107 are coupled together at the IN2 node 140*j*. The gate strip 138 serves as both the gate of the FET M4 108 and the gate of the FET M9 109. In other words, both the gate of the FET M4 108 and the gate of the FET M9 109 are coupled together at the IN3 node 140*s*. The gate strip 139 serves as both the gate of the FET M5 101 and the gate of the FET M10 100. In other words, both the gate of the FET M5 101 and the gate of the FET M10 100 are coupled together at the IN4 node 140*x*.

The source of the FET M5 101 is located at the right of the gate strip 139 in an X direction. In this illustrated example, the X direction is perpendicular to the Y direction. The drain of the FET M5 101 is located at the left of the gate strip 139 in the X direction. The source of the FET M4 108 is located at the right of the gate strip 138 in the X direction. The drain of the FET M4 108 is located at the left of the gate strip 138 in the X direction. The source of the FET M3 106 is located at the right of the gate strip 136 in the X direction. The drain of the FET M3 106 is located at the left of the gate strip 136 in the X direction. The source of the FET M2 104 is located at the right of the gate strip 134 in the X direction. The drain of the FET M2 104 is located at the left of the gate strip 134 in the X direction.

Likewise, the source of the FET M10 100 is located at the right of the gate strip 139 in an X direction. The drain of the FET M10 100 is located at the left of the gate strip 139 in the X direction. The source of the FET M9 109 is located at the left of the gate strip 138 in the X direction. The drain of the FET M9 109 is located at the right of the gate strip 138 in the X direction. The source of the FET M8 107 is located at the right of the gate strip 136 in the X direction. The drain of the FET M8 107 is located at the left of the gate strip 136 in the X direction. The source of the FET M7 105 is located at the left of the gate strip 134 in the X direction. The drain of the FET M7 105 is located at the right of the gate strip 134 in the X direction.

A metal track 122, a metal track 124, and a metal ring 126 are disposed in a metal layer 120 over the POD region 112, the NOD region 114, and the gate strips 132, 134, 136, 138, and 139. The metal track 122 is capable of providing the Vdd to the sources and/or drains of the FET M5 101, the FET M4 108, the FET M3 106, and the FET M2 104 through vertically extended contact structures 140b, 140c, 140q, 140v, and 140A as well as metal track fingers of the metal track 122 extending in the Y direction. The vertical direction is perpendicular to the X-Y plane. The metal track 124 is capable of providing the Vss to the sources and/or drains of the FET M7 105, the FET M8 107, the FET M9 109, and the FET M10 100 through vertically extended contact structures 140o, 140p, 140u, 140z, and 140E as well as metal track fingers of the metal track 124 extending in the Y direction.

In the illustrated example, the metal ring 126 has a rectangular shape and includes four sides 126a, 126b, 126c, and 126d. The metal ring 126 has two openings 126e and 126f at the side 126a. It should be noted that the metal ring 126 may have other shapes. The side 126a of the metal ring 126 is capable of connecting the sources and/or drains of the FET M5 101, the FET M4 108, the FET M3 106, and the FET M2 104 through vertically extended contact structures 140e, 140f, 140r, 140w, and 140B as well as metal ring fingers of the metal ring 126 extending in the Y direction. The side 126c of the metal ring 126 is capable of connecting the sources and/or drains of the FET M7 105, the FET M8 107, the FET M9 109, and the FET M10 100 through vertically extended contact structures 140l, 140m, 140t, 140y, and 140D as well as metal ring fingers of the metal ring 126 extending in the Y direction. A vertically extended contact structure 140C is disposed over the side 126b of the metal ring 126 as one OUT node 140C. A vertically extended contact structure 140g is disposed over the side 126d of the metal ring 126 as another OUT node 140g. The OUT node 140C and the OUT node 140g are connected.

A vertically extended contact structure 140i is disposed over the gate strip 134 as the IN1 node 140i. A vertically extended contact structure 140j is disposed over the gate strip 136 as the IN2 node 140j. A vertically extended contact structure 140s is disposed over the gate strip 138 as the IN3 node 140s. A vertically extended contact structure 140x is disposed over the gate strip 139 as the IN 4 node 140x.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, 140z, 140A, 140B, 140C, 140D, and 140E (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140A, 140e, 140g, 140h, 140i, 140j, 140s, 140x, 140C, 140m, 140y, 140o, 140u, and 140E; the fake contact structures 140F include the contact structures 140a, 140b, 140c, 140q, 140v, 140d, 140f, 140r, 140w, 140B, 140k, 140l, 140t, 140D, 140n, 140p, and 140z.

Specifically, the source of the FET M5 101 is coupled to the Vdd because the contact structure 140A is a real contact structure 140R. The drain of the FET M2 104 is coupled to the OUT node 140g because the contact structure 140e is a real contact structure 140R. The drains of the FET M7 105, the FET M8 107, the FET M9 109, and the FET M10 100 are also coupled to the OUT node 140g because the contact structures 140m and 140y are real contact structures 140R. The source of the FET M7 105, the FET M8 107, the FET M9 109, and the FET M10 100 are coupled to the Vss because the contact structures 140o, 140u, and 140E are real contact structures 140R. As such, the NOR gate layout 2291b can fulfil the NOR logic operation of the NOR gate 2291a.

Referring to FIG. 23A, a NOR gate 2292a with five inputs includes a p-type FET M1 102, a p-type FET M2 104, a p-type FET M3 106, a p-type FET M4 108, a p-type FET M5 101, an n-type FET M6 103, an n-type FET M7 105, an n-type FET M8 107, an n-type FET M9 109, and an n-type FET M10 100. In one example, the p-type FET M1 102, the p-type FET M2 104, the p-type FET M3 106, the p-type FET M4 108, and the p-type FET M5 101 are PMOS FETs, whereas the n-type FET M6 103, the n-type FET M7 105, the n-type FET M8 107, the n-type FET M9 109, and the n-type FET M10 100 are NMOS FETs. In another example, the p-type FET M1 102, the p-type FET M2 104, the p-type FET M3 106, the p-type FET M4 108, and the p-type FET M5 101 are p-type FinFETs, whereas the n-type FET M6 103, the n-type FET M7 105, the n-type FET M8 107, the n-type FET M9 109, and the n-type FET M10 100 are n-type FinFETs.

A source of the FET M1 102 is coupled to a first power supply (e.g., a Vdd). A drain of the FET M1 102 is coupled to a source of the FET M2 104. A drain of the FET M2 104 is coupled to a source of the FET M3 106. A drain of the FET M3 106 is coupled to a source of the FET M4 108. A drain of the FET M4 108 is coupled to a source of the FET M5 101. A drain of the FET M5 101 is coupled to an output ("OUT") node 140C. Sources of the FET M6 103, the FET M7 105, the FET M8 107, the FET M9 109, and the FET M10 100 are coupled together to a second power supply (e.g., a Vss). Drains of the FET M6 103, the FET M7 105, the FET M8 107, the FET M9 109, and the FET M10 100 are coupled together at the OUT node 140C. Gates of the FET M1 102 and the FET M6 103 are coupled together at a first input ("IN1") node 140h. Gates of the FET M2 104 and the FET M7 105 are coupled together at a second input ("IN2") node 140i. Gates of the FET M3 106 and the FET M8 107 are coupled together at a third input ("IN3") node 140j. Gates of the FET M4 108 and the FET M9 109 are coupled together at a fourth input ("IN4") node 140s. Gates of the FET M5 101 and the FET M10 100 are coupled together at a fifth input ("IN5") node 140x.

When the IN1 node 140h is at logical low, the IN2 node 140i is at logical low, the IN3 node 140j is at logical low, the IN4 node 140s is at logical low, and the IN5 node 140x is at logical low, the OUT node 140C is at logical high. In all other situations, the OUT node 140C is at logical low. Thus, the NOR gate 2292a implements a NOR logic operation.

Referring to FIG. 23B, a NOR gate layout 2292b includes, among other things, the FET M1 102, the FET M2 104, the FET M3 106, the FET M4 108, the FET M5 101, the FET M6 103, the FET M7 105, the FET M8 107, the FET M9 109, and the FET M10 100. The FET M1 102, the FET M2 104, the FET M3 106, the FET M4 108, and the FET M5 101 are disposed in a POD region 112. The FET M6 103, the FET M7 105, the FET M8 107, the FET M9 109, and the FET M10 100 are disposed in a NOD region 114. Five gate strips 132, 134, 136, 138, and 139 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140h. The gate strip 134 serves as both the gate of the FET M2 104 and the gate of the FET M7 105. In other words, both the gate of the FET M2 104 and the gate of the FET M7 105 are coupled together at the IN2 node 140i. The gate strip 136 serves as both the gate of the FET M3 106 and the gate of the FET M8 107. In other words, both the gate of the FET M3 106 and the gate of the FET M8 107 are coupled together at the IN3 node 140j. The gate strip 138 serves as both the gate of the FET M4 108 and the gate of the FET M9 109. In other words, both the gate of the FET M4 108 and the gate of the FET M9 109 are coupled together at the IN4 node 140s. The gate strip 139 serves as both the gate of the FET M5 101 and the gate of the FET M10 100. In other words, both the gate of the FET M5 101 and the gate of the FET M10 100 are coupled together at the IN5 node 140x.

The source of the FET M1 102 is located at the left of the gate strip 132 in an X direction. In this illustrated example, the X direction is perpendicular to the Y direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. The source of the FET M3 106 is located at the left of the gate strip 136 in the X direction. The drain of the FET M3 106 is located at the right of the gate strip 136 in the X direction. The source of the FET M4 108 is located at the left of the gate strip 138 in the X direction. The drain of the FET M4 108 is located at the right of the gate strip 138 in the X direction. The source of the FET M5 101 is located at the left of the gate strip 139 in the X direction. The drain of the FET M5 101 is located at the right of the gate strip 139 in the X direction.

Likewise, the source of the FET M6 103 is located at the left of the gate strip 132 in an X direction. The drain of the FET M6 103 is located at the right of the gate strip 132 in the X direction. The source of the FET M7 105 is located at the right of the gate strip 134 in the X direction. The drain of the FET M7 105 is located at the left of the gate strip 134 in the X direction. The source of the FET M8 107 is located at the left of the gate strip 136 in the X direction. The drain of the FET M8 107 is located at the right of the gate strip 136 in the X direction. The source of the FET M9 109 is located at the right of the gate strip 138 in the X direction. The drain of the FET M9 109 is located at the left of the gate strip 138 in the X direction. The source of the FET M10 100 is located at the left of the gate strip 139 in the X direction. The drain of the FET M10 100 is located at the right of the gate strip 139 in the X direction.

A metal track 122, a metal track 124, and a metal ring 126 are disposed in a metal layer 120 over the POD region 112, the NOD region 114, and the gate strips 132, 134, 136, 138, and 139. The metal track 122 is capable of providing the Vdd to the sources and/or drains of the FET M1 102, the FET M2 104, the FET M3 106, the FET M4 108, the FET M5 101 through vertically extended contact structures 140a, 140b, 140c, 140q, 140v, and 140A as well as metal track fingers of the metal track 122 extending in the Y direction. The vertical direction is perpendicular to the X-Y plane. The metal track 124 is capable of providing the Vss to the sources and/or drains of the FET M6 103, the FET M7 105, the FET M8 107, the FET M9 109, and the FET M10 100 through vertically extended contact structures 140n, 140o, 140p, 140u, 140z, and 140E as well as metal track fingers of the metal track 124 extending in the Y direction.

In the illustrated example, the metal ring 126 has a rectangular shape and includes four sides 126a, 126b, 126c, and 126d. The metal ring 126 has two openings 126e and 126f at the side 126a. It should be noted that the metal ring 126 may have other shapes. The side 126a of the metal ring 126 is capable of connecting the sources and/or drains of the FET M1 102, the FET M2 104, the FET M3 106, the FET M4 108, and the FET M5 101 through vertically extended contact structures 140d, 140e, 140f, 140r, 140w, and 140B as well as metal ring fingers of the metal ring 126 extending in the Y direction. The side 126c of the metal ring 126 is capable of connecting the sources and/or drains of the FET M6 103, the FET M7 105, the FET M8 107, the FET M9 109, and the FET M10 100 through vertically extended contact structures 140k, 140l, 140m, 140t, 140y, and 140D as well as metal ring fingers of the metal ring 126 extending in the Y direction. A vertically extended contact structure 140C is disposed over the side 126b of the metal ring 126 as one OUT node 140C. A vertically extended contact structure 140g is disposed over the side 126d of the metal ring 126 as another OUT node 140g. The OUT node 140C and the OUT node 140g are connected.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j. A vertically extended contact structure 140s is disposed over the gate strip 138 as the IN4 node 140s. A vertically extended contact structure 140x is disposed over the gate strip 139 as the IN5 node 140x.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, 140z, 140A, 140B, 140C, 140D, and 140E (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140B, 140g, 140h, 140i, 140j, 140s, 140x, 140C, 140l, 140t, 140D, 140n, 140p, and 140z; the fake contact structures 140F include the contact structures 140b, 140c, 140q, 140v, 140A, 140d, 140e, 140f, 140r, 140w, 140k, 140m, 140y, 140o, 140u, and 140E.

Specifically, the source of the FET M1 102 is coupled to the Vdd because the contact structure 140a is a real contact structure 140R. The drain of the FET M5 101 is coupled to the OUT node 140C because the contact structure 140B is a real contact structure 140R. The drains of the FET M6 103, the FET M7 105, the FET M8 107, the FET M9 109, and the FET M10 100 are also coupled to the OUT node 140C because the contact structures 140l, 140t, and 140D are real contact structures 140R. The sources of the FET M6 103, the FET M7 105, the FET M8 107, the FET M9 109, and the FET M10 100 are coupled to the Vss because the contact structures 140n, 140p, and 140z are real contact structures 140R. As such, the NOR gate layout 2292b can fulfil the NOR logic operation of the NOR gate 2292a.

Referring to FIG. 24A, a circuit 2293a includes a p-type FET M3 106, a p-type FET M4 108, a p-type FET M2 104, a p-type FET M5 101, a p-type FET M1 102, an n-type FET M6 103, an n-type FET M7 105, an n-type FET M8 107, an n-type FET M9 109, and an n-type FET M10 100. In one example, the p-type FET M3 106, the p-type FET M4 108, the p-type FET M2 104, the p-type FET M5 101, and the p-type FET M1 102 are PMOS FETs, whereas the n-type FET M6 103, the n-type FET M7 105, the n-type FET M8 107, the n-type FET M9 109, and the n-type FET M10 100 are NMOS FETs. In another example, the p-type FET M3

106, the p-type FET M4 108, the p-type FET M2 104, the p-type FET M5 101, and the p-type FET M1 102 are p-type FinFETs, whereas the n-type FET M6 103, the n-type FET M7 105, the n-type FET M8 107, the n-type FET M9 109, and the n-type FET M10 100 are n-type FinFETs.

Sources of the FET M3 106 and the FET M4 108 are coupled to a first power supply (e.g., a Vdd). Drains of the FET M3 106 and the FET M4 108 are coupled together. A drain of the FET M3 106 is coupled to a source of the FET M2 104. A drain of the FET M4 108 is coupled to a source of the FET M5 101. Drains of the FET M2 104 and the FET M5 101 are coupled to an output ("OUT") node 140$g$/140C. Sources of the FET M6 103 and the FET M9 109 are coupled together to a second power supply (e.g., a Vss). A drain of the FET M6 103 is coupled to a source of the FET M7 105. A drain of the FET M9 109 is coupled to a source of the FET M8 107. Drains of the FET M7 105 and the FET M8 107 are coupled to the OUT node 140$g$/140C. Both a source and a drain of the FET M10 100 are coupled to the Vss. A drain of the FET M1 102 is coupled to the OUT node 140$g$/140C. A source of the FET M1 102 is not connected (i.e., floating). As such, the FET M1 102 and the FET M10 100 are dummy FETs and have no impact on the operation of the circuit 2293$a$. Gates of the FET M1 102 and the FET M6 103 are coupled together at a first input ("IN1") node 140$h$. Gates of the FET M2 104 and the FET M7 105 are coupled together at a second input ("IN2") node 140$i$. Gates of the FET M3 106 and the FET M8 107 are coupled together at a third input ("IN3") node 140$j$. Gates of the FET M4 108 and the FET M9 109 are coupled together at a fourth input ("IN4") node 140$s$. Gates of the FET M5 101 and the FET M10 100 are coupled together at another first input ("IN1") node 140$x$.

When the IN1 node 140$h$/140$x$ is at logical high and the IN2 node 140$i$ is at logical high, the OUT node 140$g$/140C is at logical low regardless of the signals at the IN3 node 140$j$ and the IN4 node 140$s$. When the IN3 node 140$j$ is at logical high and the IN4 node 140$s$ is at logical high, the OUT node 140$g$/140C is at logical low regardless of the signals at the IN1 node 140$h$/140$x$ and the IN2 node 140$i$. In all other situations, the OUT node 140$g$/140C is at logical high. Thus, the circuit 2293$a$ implements a logic operation ("AND plus NOR") as shown in FIG. 24B.

Referring to FIG. 24C, a circuit layout 2293$c$ includes, among other things, the FET M3 106, the FET M4 108, the FET M2 104, the FET M5 101, the FET M1 102, the FET M6 103, the FET M7 105, the FET M8 107, the FET M9 109, and the FET M10 100. The FET M3 106, the FET M4 108, the FET M2 104, the FET M5 101, and the FET M1 102 are disposed in a POD region 112. The FET M6 103, the FET M7 105, the FET M8 107, the FET M9 109, and the FET M10 100 are disposed in a NOD region 114. Five gate strips 132, 134, 136, 138, and 139 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140$h$. The gate strip 134 serves as both the gate of the FET M2 104 and the gate of the FET M7 105. In other words, both the gate of the FET M2 104 and the gate of the FET M7 105 are coupled together at the IN2 node 140$i$. The gate strip 136 serves as both the gate of the FET M3 106 and the gate of the FET M8 107. In other words, both the gate of the FET M3 106 and the gate of the FET M8 107 are coupled together at the IN3 node 140$j$. The gate strip 138 serves as both the gate of the FET M4 108 and the gate of the FET M9 109. In other words, both the gate of the FET M4 108 and the gate of the FET M9 109 are coupled together at the IN4 node 140$s$. The gate strip 139 serves as both the gate of the FET M5 101 and the gate of the FET M10 100. In other words, both the gate of the FET M5 101 and the gate of the FET M10 100 are coupled together at the IN1 node 140$x$.

The source of the FET M1 102 is located at the left of the gate strip 132 in an X direction. The drain of the FET M1 102 is located at the right of the gate strip 132 in the X direction. The source of the FET M2 104 is located at the right of the gate strip 134 in the X direction. The drain of the FET M2 104 is located at the left of the gate strip 134 in the X direction. The source of the FET M3 106 is located at the right of the gate strip 136 in the X direction. The drain of the FET M3 106 is located at the left of the gate strip 136 in the X direction. The source of the FET M4 108 is located at the left of the gate strip 138 in the X direction. The drain of the FET M4 108 is located at the right of the gate strip 138 in the X direction. The source of the FET M5 101 is located at the left of the gate strip 139 in the X direction. The drain of the FET M5 101 is located at the right of the gate strip 139 in the X direction.

Likewise, the source of the FET M6 103 is located at the left of the gate strip 132 in an X direction. The drain of the FET M6 103 is located at the right of the gate strip 132 in the X direction. The source of the FET M7 105 is located at the left of the gate strip 134 in the X direction. The drain of the FET M7 105 is located at the right of the gate strip 134 in the X direction. The source of the FET M8 107 is located at the right of the gate strip 136 in the X direction. The drain of the FET M8 107 is located at the left of the gate strip 136 in the X direction. The source of the FET M9 109 is located at the right of the gate strip 138 in the X direction. The drain of the FET M9 109 is located at the left of the gate strip 138 in the X direction. The source of the FET M10 100 is located at the left of the gate strip 139 in the X direction. The drain of the FET M10 100 is located at the right of the gate strip 139 in the X direction.

A metal track 122, a metal track 124, and a metal ring 126 are disposed in a metal layer 120 over the POD region 112, the NOD region 114, and the gate strips 132, 134, 136, 138, and 139. The metal track 122 is capable of providing the Vdd to the sources and/or drains of the FET M3 106, the FET M4 108, the FET M2 104, the FET M5 101, the FET M1 102 through vertically extended contact structures 140$a$, 140$b$, 140$c$, 140$q$, 140$v$, and 140A as well as metal track fingers of the metal track 122 extending in the Y direction. The vertical direction is perpendicular to the X-Y plane. The metal track 124 is capable of providing the Vss to the sources and/or drains of the FET M6 103, the FET M7 105, the FET M8 107, the FET M9 109, and the FET M10 100 through vertically extended contact structures 140$n$, 140$o$, 140$p$, 140$u$, 140$z$, and 140E as well as metal track fingers of the metal track 124 extending in the Y direction.

In the illustrated example, the metal ring 126 has a rectangular shape and includes four sides 126$a$, 126$b$, 126$c$, and 126$d$. The metal ring 126 has two openings 126$e$ and 126$f$ at the side 126$a$. It should be noted that the metal ring 126 may have other shapes. The side 126$a$ of the metal ring 126 is capable of connecting the sources and/or drains of the FET M3 106, the FET M4 108, the FET M2 104, the FET M5 101, and the FET M1 102 through vertically extended contact structures 140$d$, 140$e$, 140$f$, 140$r$, 140$w$, and 140B as well as metal ring fingers of the metal ring 126 extending in the Y direction. The side 126$c$ of the metal ring 126 is capable of connecting the sources and/or drains of the FET M6 103, the FET M7 105, the FET M8 107, the FET M9 109, and the FET M10 100 through vertically extended contact structures 140k, 140l, 140m, 140t, 140y, and 140D as well as metal ring fingers of the metal ring 126 extending in the Y direction. A vertically extended contact structure 140C is disposed over the side 126b of the metal ring 126 as one OUT node 140C. A vertically extended contact structure 140g is disposed over the side 126d of the metal ring 126 as another OUT node 140g. The OUT node 140C and the OUT node 140g are connected.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j. A vertically extended contact structure 140s is disposed over the gate strip 138 as the IN4 node 140s. A vertically extended contact structure 140x is disposed over the gate strip 139 as the IN1 node 140x.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, 140z, 140A, 140B, 140C, 140D, and 140E (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140q, 140e, 140f, 140w, 140B, 140g, 140h, 140i, 140j, 140s, 140x, 140C, 140m, 140n, 140z, and 140E; the fake contact structures 140F include the contact structures 140a, 140b, 140c, 140v, 140A, 140d, 140r, 140k, 140l, 140t, 140y, 140D, 140o, 140p, and 140u.

Specifically, the sources of the FET M3 106 and the FET M4 108 are coupled to the Vdd because the contact structure 140q is a real contact structure 140R. The drains of the FET M3 106 and the FET M4 108 are connected because the contact structures 140f and 140w are real contact structures 140R. The drains of the FET M2 104, the FET M5 101, the FET M7 105, and the FET M8 107 are also coupled to the OUT node 140g/140C because the contact structures 140e, 140B, and 140m are real contact structures 140R. The sources of the FET M6 103 and the FET M9 109 are coupled to the Vss because the contact structures 140n and 140z are real contact structures 140R. The source and the drain of the FET M10 100 are coupled to the Vss because the contact structures 140z and 140E are real contact structures 140R. As such, the circuit layout 2293c can fulfil the logic operation of the circuit 2293a.

Referring to FIG. 25A, a circuit 2294a includes a p-type FET M1 102, a p-type FET M4 108, a p-type FET M2 104, a p-type FET M3 106, a p-type FET M5 101, an n-type FET M8 107, an n-type FET M7 105, an n-type FET M10 100, an n-type FET M9 109, and an n-type FET M6 103. In one example, the p-type FET M1 102, the p-type FET M4 108, the p-type FET M2 104, the p-type FET M3 106, and the p-type FET M5 101 are PMOS FETs, whereas the n-type FET M8 107, the n-type FET M7 105, the n-type FET M10 100, the n-type FET M9 109, and the n-type FET M6 103 are NMOS FETs. In another example, the p-type FET M1 102, the p-type FET M4 108, the p-type FET M2 104, the p-type FET M3 106, and the p-type FET M5 101 are p-type FinFETs, whereas the n-type FET M8 107, the n-type FET M7 105, the n-type FET M10 100, the n-type FET M9 109, and the n-type FET M6 103 are n-type FinFETs.

Sources of the FET M1 102 and the FET M4 108 are coupled to a first power supply (e.g., a Vdd). A drain of the FET M1 102 is coupled to a source of the FET M2 104. A drain of the FET M4 108 is coupled to a source of the FET M3 106. Drains of the FET M2 104 and the FET M3 106 are coupled to an output ("OUT") node 140g/140C. Sources of the FET M8 107 and the FET M9 109 are coupled together to a second power supply (e.g., a Vss). Drains of the FET M8 107 and the FET M9 109 are coupled together. A drain of the FET M8 107 is coupled to a source of the FET M7 105. A drain of the FET M9 109 is coupled to a source of the FET M10 100. Drains of the FET M7 105 and the FET M10 100 are coupled to the OUT node 140g/140C. Both a source and a drain of the FET M5 101 are coupled to the Vdd. A drain of the FET M6 103 is coupled to the OUT node 140g/140C. A source of the FET M6 103 is not connected (i.e., floating). As such, the FET M5 101 and the FET M6 103 are dummy FETs and have no impact on the operation of the circuit 2294a. Gates of the FET M1 102 and the FET M6 103 are coupled together at a first input ("IN1") node 140h. Gates of the FET M2 104 and the FET M7 105 are coupled together at a second input ("IN2") node 140i. Gates of the FET M3 106 and the FET M8 107 are coupled together at a third input ("IN3") node 140j. Gates of the FET M4 108 and the FET M9 109 are coupled together at a fourth input ("IN4") node 140s. Gates of the FET M5 101 and the FET M10 100 are coupled together at another first input ("IN1") node 140x.

When the IN1 node 140h/140x is at logical low and the IN2 node 140i is at logical low, the OUT node 140g/140C is at logical high regardless of the signals at the IN3 node 140j and the IN4 node 140s. When the IN3 node 140j is at logical low and the IN4 node 140s is at logical low, the OUT node 140g/140C is at logical high regardless of the signals at the IN1 node 140h/140x and the IN2 node 140i. In all other situations, the OUT node 140g/140C is at logical low. Thus, the circuit 2294a implements a logic operation ("OR plus NAND") as shown in FIG. 25B.

Referring to FIG. 26, a circuit layout 2294c includes, among other things, the FET M1 102, the FET M4 108, the FET M2 104, the FET M3 106, the FET M5 101, the FET M8 107, the FET M7 105, the FET M10 100, the FET M9 109, and the FET M6 103. The FET M1 102, the FET M4 108, the FET M2 104, the FET M3 106, and the FET M5 101 are disposed in a POD region 112. The FET M8 107, the FET M7 105, the FET M10 100, the FET M9 109, and the FET M6 103 are disposed in a NOD region 114. Five gate strips 132, 134, 136, 138, and 139 extend in a Y direction and are disposed over both the POD region 112 and the NOD region 114. The gate strip 132 serves as both the gate of the FET M1 102 and the gate of the FET M6 103. In other words, both the gate of the FET M1 102 and the gate of the FET M6 103 are coupled together at the IN1 node 140h. The gate strip 134 serves as both the gate of the FET M2 104 and the gate of the FET M7 105. In other words, both the gate of the FET M2 104 and the gate of the FET M7 105 are coupled together at the IN2 node 140i. The gate strip 136 serves as both the gate of the FET M3 106 and the gate of the FET M8 107. In other words, both the gate of the FET M3 106 and the gate of the FET M8 107 are coupled together at the IN3 node 140j. The gate strip 138 serves as both the gate of the FET M4 108 and the gate of the FET M9 109. In other words, both the gate of the FET M4 108 and the gate of the FET M9 109 are coupled together at the IN4 node 140s. The gate strip 139 serves as both the gate of the FET M5 101 and the gate of the FET M10 100. In other words, both the gate of the FET M5 101 and the gate of the FET M10 100 are coupled together at the IN1 node 140x.

The source of the FET M1 102 is located at the left of the gate strip 132 in an X direction. The drain of the FET M1 102 is located at the right of the gate strip 132 in the X direction. The source of the FET M2 104 is located at the left of the gate strip 134 in the X direction. The drain of the FET M2 104 is located at the right of the gate strip 134 in the X direction. The source of the FET M3 106 is located at the right of the gate strip 136 in the X direction. The drain of the FET M3 106 is located at the left of the gate strip 136 in the X direction. The source of the FET M4 108 is located at the right of the gate strip 138 in the X direction. The drain of the FET M4 108 is located at the left of the gate strip 138 in the X direction. The source of the FET M5 101 is located at the left of the gate strip 139 in the X direction. The drain of the FET M5 101 is located at the right of the gate strip 139 in the X direction.

Likewise, the source of the FET M6 103 is located at the left of the gate strip 132 in an X direction. The drain of the FET M6 103 is located at the right of the gate strip 132 in the X direction. The source of the FET M7 105 is located at the right of the gate strip 134 in the X direction. The drain of the FET M7 105 is located at the left of the gate strip 134 in the X direction. The source of the FET M8 107 is located at the right of the gate strip 136 in the X direction. The drain of the FET M8 107 is located at the left of the gate strip 136 in the X direction. The source of the FET M9 109 is located at the left of the gate strip 138 in the X direction. The drain of the FET M9 109 is located at the right of the gate strip 138 in the X direction. The source of the FET M10 100 is located at the left of the gate strip 139 in the X direction. The drain of the FET M10 100 is located at the right of the gate strip 139 in the X direction.

A metal track 122, a metal track 124, and a metal ring 126 are disposed in a metal layer 120 over the POD region 112, the NOD region 114, and the gate strips 132, 134, 136, 138, and 139. The metal track 122 is capable of providing the Vdd to the sources and/or drains of the FET M1 102, the FET M4 108, the FET M2 104, the FET M3 106, the FET M5 101 through vertically extended contact structures 140a, 140b, 140c, 140q, 140v, and 140A as well as metal track fingers of the metal track 122 extending in the Y direction. The vertical direction is perpendicular to the X-Y plane. The metal track 124 is capable of providing the Vss to the sources and/or drains of the FET M8 107, the FET M7 105, the FET M10 100, the FET M9 109, and the FET M6 103 through vertically extended contact structures 140n, 140o, 140p, 140u, 140z, and 140E as well as metal track fingers of the metal track 124 extending in the Y direction.

In the illustrated example, the metal ring 126 has a rectangular shape and includes four sides 126a, 126b, 126c, and 126d. The metal ring 126 has two openings 126e and 126f at the side 126c. It should be noted that the metal ring 126 may have other shapes. The side 126a of the metal ring 126 is capable of connecting the sources and/or drains of the FET M1 102, the FET M4 108, the FET M2 104, the FET M3 106, and the FET M5 101 through vertically extended contact structures 140d, 140e, 140f, 140r, 140w, and 140B as well as metal ring fingers of the metal ring 126 extending in the Y direction. The side 126c of the metal ring 126 is capable of connecting the sources and/or drains of the FET M8 107, the FET M7 105, the FET M10 100, the FET M9 109, and the FET M6 103 through vertically extended contact structures 140k, 140l, 140m, 140t, 140y, and 140D as well as metal ring fingers of the metal ring 126 extending in the Y direction. A vertically extended contact structure 140C is disposed over the side 126b of the metal ring 126 as one OUT node 140C. A vertically extended contact structure 140g is disposed over the side 126d of the metal ring 126 as another OUT node 140g. The OUT node 140C and the OUT node 140g are connected.

A vertically extended contact structure 140h is disposed over the gate strip 132 as the IN1 node 140h. A vertically extended contact structure 140i is disposed over the gate strip 134 as the IN2 node 140i. A vertically extended contact structure 140j is disposed over the gate strip 136 as the IN3 node 140j. A vertically extended contact structure 140s is disposed over the gate strip 138 as the IN4 node 140s. A vertically extended contact structure 140x is disposed over the gate strip 139 as the IN1 node 140x.

The contact structures 140a, 140b, 140c, 140d, 140e, 140f, 140g, 140h, 140i, 140j, 140k, 140l, 140m, 140n, 140o, 140p, 140q, 140r, 140s, 140t, 140u, 140v, 140w, 140x, 140y, 140z, 140A, 140B, 140C, 140D, and 140E (collectively as "140") can be classified into real contact structures 140R and fake contact structures 140F. The real contact structures 140R and the fake contact structures 140F are indistinguishable from each other for RE protection. In this illustrated example, the real contact structures 140R include the contact structures 140a, 140v, 140A, 140f, 140g, 140h, 140i, 140j, 140s, 140x, 140C, 140l, 140m, 140y, 140D, and 140u; the fake contact structures 140F include the contact structures 140b, 140c, 140q, 140d, 140e, 140r, 140w, 140B, 140k, 140t, 140n, 140o, 140p, 140z, and 140E.

Specifically, the sources of the FET M1 102 and the FET M4 108 are coupled to the Vdd because the contact structures 140a and 140v are real contact structures 140R. The drains of the FET M2 104 and the FET M3 106 are coupled to the OUT node 140g/140C because the contact structure 140f is a real contact structure 140R. The sources of the FET M8 107 and the FET M9 109 are coupled to the Vss because the contact structure 140u is a real contact structure 140R. The drains of the FET M7 105, the FET M10 100, and the FET M6 103 are coupled to the OUT node 140g/140C because the contact structures 140l and 140D are real contact structures 140R. The drains of the FET M8 107 and the FET M9 109 are connected because the contact structures 140m and 140y are real contact structures 140R. The source and the drain of the FET M5 101 are coupled to the Vss because the contact structures 140v and 140A are real contact structures 140R. As such, the circuit layout 2294c can fulfil the logic operation of the circuit 2294a.

Figure 27:
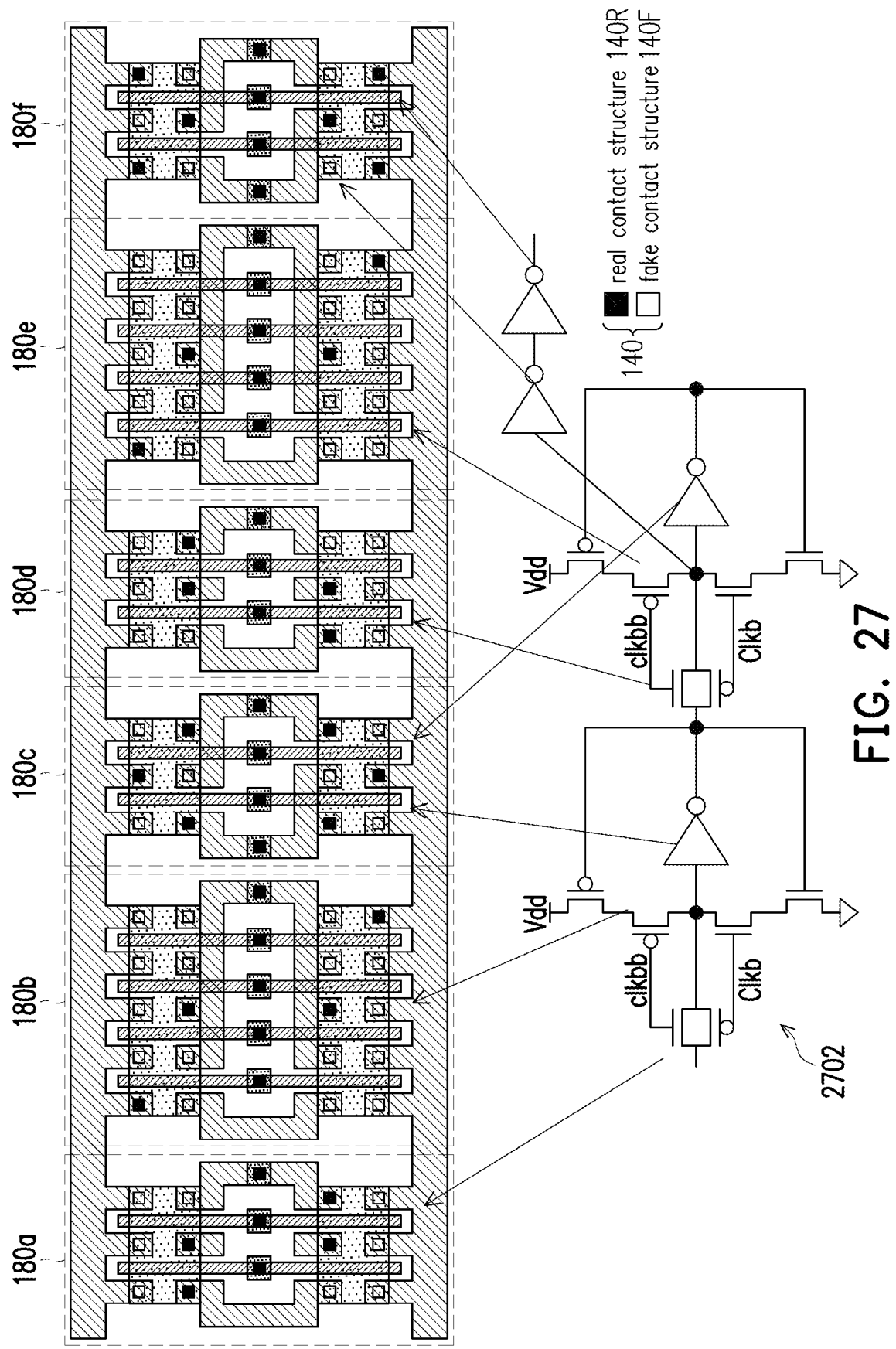
FIG. 27 is a diagram illustrating combining multiple cells in accordance with some embodiments.

FIG. 27 is a diagram illustrating combining multiple cells in accordance with some embodiments. As shown in FIG. 27, multiple cells 180a, 180b, 180c, 180d, 180e, and 180f are combined to be a single cell, which corresponds to a circuit 2702. The exemplary circuit 2702 is a D-flip flop circuit. It should be noted that other circuits may be fabricated by combining multiple cells. Each of the multiple cells 180a, 180b, 180c, 180d, 180e, and 180f may be one of those as shown above (e.g., the layout 191b as shown in FIG. 1C) anti-RE camouflage. For example, each of the multiple cells 180a, 180b, 180c, 180d, 180e, and 180f may have both real contact structures 140R and fake contact structures 140F indistinguishable from each other for RE protection. Combining multiple cells may achieve robust anti-RE camouflage.

Figure 28A:
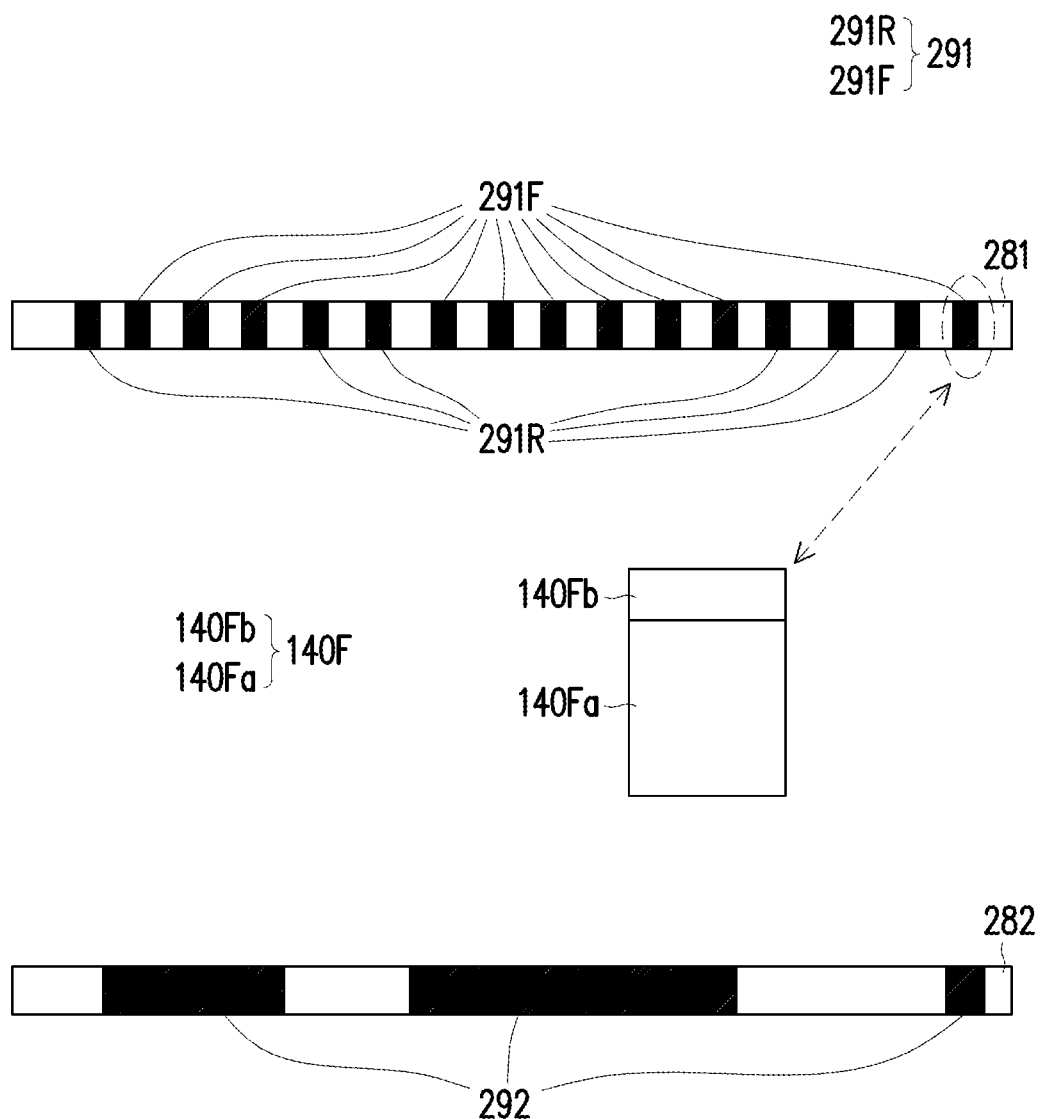
FIG. 28A is a diagram illustrating the fabrication of a real contact structure and a fake contact structure in accordance with some embodiments.
Figure 28B:
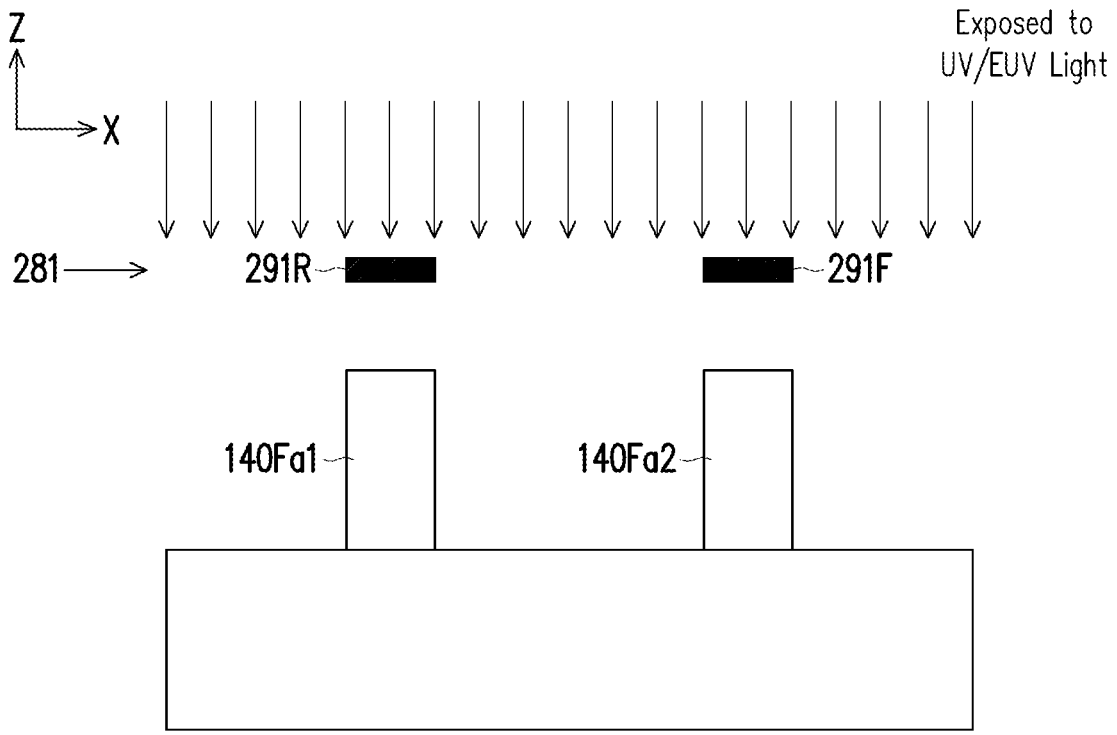
FIGS. 28B-D are cross sectional diagrams illustrating the fabrication of the real contact structure and the fake contact structures using the masks of FIG. 28A.
Figure 28C:
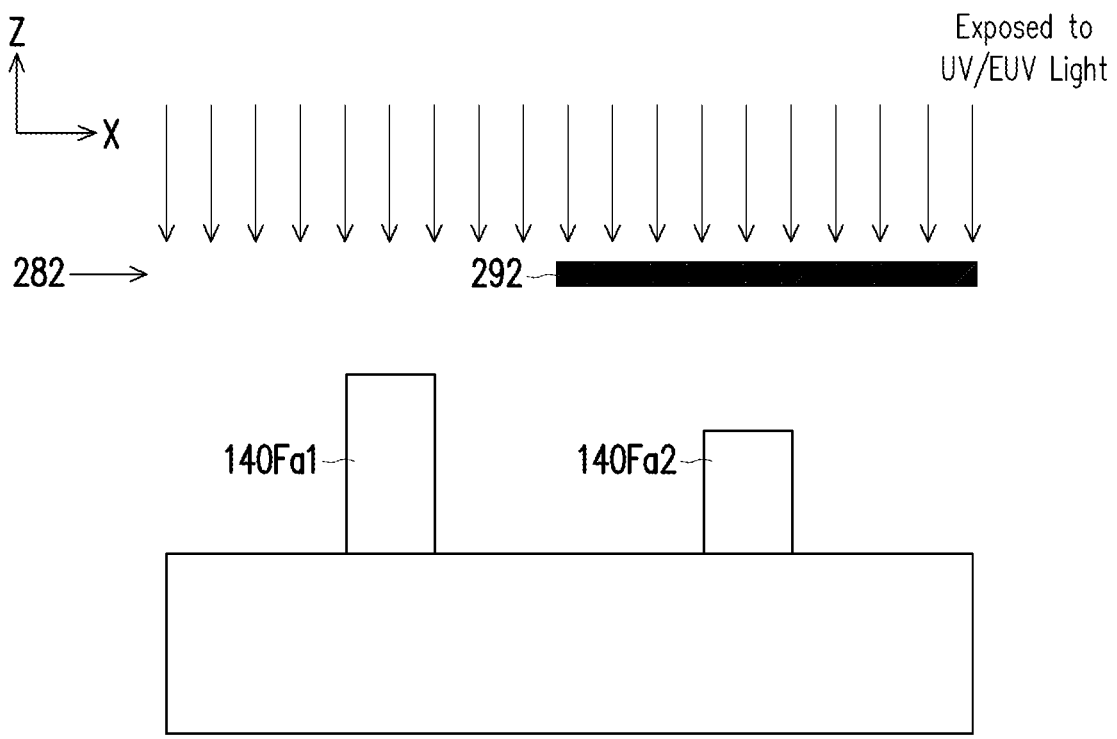
Figure 28D:
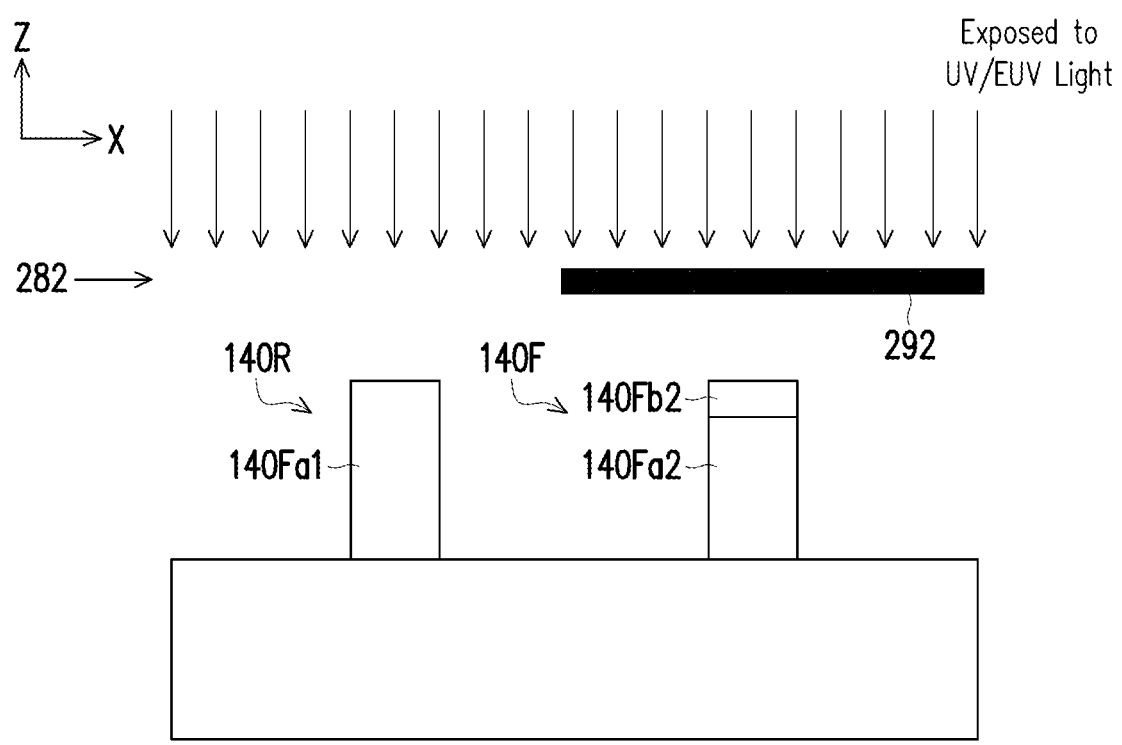

FIG. 28A is a diagram illustrating masks used in the fabrication of a real contact structure and a fake contact structure in accordance with some embodiments. FIGS. 28B-D are cross sectional diagrams illustrating the fabrication of the real contact structure and the fake contact structures using the masks of FIG. 28A. It should be noted that the focus of FIGS. 28A-D is the real contact structure and the fake contact structure, thus other components of the layout (e.g., gate strips, metal layers) are not shown. It should also be noted that the FIGS. 28B-D are for illustration purpose, sub-steps (e.g., cleaning, preparation, photoresist application, exposure, developing, etching, and photoresist removal) of a photolithography might be combined in one figure for simplicity. In the illustrated example, two masks 281 and 282 are used to fabricated a fake contact structure 140F. The first mask 281 has multiple contact cuts 291. Each contact cut 291 is a portion of the first mask that designate either a real contact structure 140R or a fake contact structure 140F for photolithography. The multiple contact cuts 291 can be classified into two categories: real contact cuts 291R and fake contact cuts 291F. The real contact cuts 291R designate real contact structures 140R. The fake contact cuts 291F designate fake contact structures 140F.

As shown in FIG. 28B, a first contact layer 140Fa1 and another first contact layer 140Fa2 can be deposited for both real contact structure 140R and fake contact structure 140F by using the first mask 281. The first contact layer 140Fa is electrically conductive. Specifically, the mask 281, which has a real contact cut 291R and a fake contact cut 291F, is used in a photolithography where a layer of photoresist not shown is exposed to ultraviolet (UV) or extreme ultraviolet (EUV) light depending on different technology nodes. The exposure to UV/EUV light causes a chemical change that allows some of the photoresist to be removed by a developer, therefore creating two openings for the real contact structure 140R and fake contact structure 140F. The first contact layer 140Fa1 and the first contact layer 140Fa2 are deposited in the openings for both real contact structure 140R and fake contact structure 140F.

The second mask 281 has multiple mask cuts 292. Each mask cut 292 designates a location where at least one fake contact cut 291F exists. Fake contact structures 140F can be singled out by using the second mask 282. A second contact layer 140Fb can be deposited above the first contact layer 140Fa (after etching of the first contact layer 140Fa) by using the second mask 282. The second contact layer 140Fb is electrically non-conductive, thus making the fake contact structures 140F electrically non-conductive. In other words, the second contact layer 140Fb insulates the first contact layer 140Fa for fake contact structures 140F. In one embodiment, the second contact layer 140Fb is a thin oxide layer fabricated through process such as vapor deposition. The thickness of the thin oxide layer 140Fb is thinner than that of the first contact layer 140Fa. The thickness of the thin oxide layer 140Fb may vary for different technology nodes (e.g., 14 nm, 10 nm, and 7 nm) and applications.

As shown in FIG. 28C, the first contact layer 140Fa2 is etched by using the second mask 282. Specifically, the mask 282, which has a contact cut 292, is used in a photolithography where a layer of photoresist not shown is exposed to UV/EUV light depending on different technology nodes. The exposure to UV/EUV light causes a chemical change that allows some of the photoresist to be removed by a developer, therefore creating an opening for the fake contact structure 140F. The first contact layer 140Fa2 is etched by a chemical agent since the first contact layer 140Fa2 is not protected by the photoresist. In one example, wet etching is employed. In another example, dry etching is employed. The etch depth may vary for different technology nodes and applications. In one example, the etch depth is 5% of the original height of the first contact layer 140Fa2 in the Z direction. In another example, the etch depth is 10% of the original height of the first contact layer 140Fa2 in the Z direction. In yet another example, the etch depth is 20% of the original height of the first contact layer 140Fa2 in the Z direction. In yet another example, the etch depth is 40% of the original height of the first contact layer 140Fa2 in the Z direction.

As shown in FIG. 28D, the second contact layer 140Fb2 is deposited over the etched first contact layer 140Fb1 optionally by using the second mask 282. Specifically, the mask 282, which has a contact cut 292, is used again in a photolithography where a layer of photoresist not shown is exposed to UV/EUV light depending on different technology nodes. The exposure to UV/EUV light causes a chemical change that allows some of the photoresist to be removed by a developer, therefore creating an opening for the fake contact structure 140F. The second contact layer 140Fb2 is deposited over the etched first contact layer 140Fb 1. The dielectric constant of the second contact layer 140Fb2 may vary for different technology nodes. The second contact layer 140Fb2 may be made of silicon oxide, silicon nitride, aluminum oxide, hafnium oxide, lanthanum oxide, other suitable dielectric materials, or combinations thereof for different technology nodes and applications.

It should be noted that FIGS. 28A-D are for illustration purpose, other fabrication processes may also be employed to fabricate real contact structures and fake contact structures.

In accordance with some disclosed embodiments, an integrated circuit layout is provided. The integrated circuit layout includes: a first active region having a first plurality of field effect transistors (FETs); and an interconnect contacting sources and drains of the first plurality of FETs in the first active region through a first set of contact structures. At least one of the first set of contact structures is electrically non-conductive.

In accordance with some disclosed embodiments, a method of fabricating an integrated circuit is provided. The method includes forming a plurality of FETs; forming a plurality of first contact structures in contact with sources, drains, and gates of the plurality of FETs, each of the plurality of first contact structures being electrically conductive; and forming a plurality of second contact structures in contact with the sources, the drains, and the gates of the plurality of FETs, each of the plurality of second contact structures being electrically non-conductive.

In accordance with further disclosed embodiments, an integrated circuit is provided. The integrated circuit includes a logic circuit including a plurality of FETs, an input terminal, and an output terminal, each of the plurality of FETs including a source, a drain, and a gate; a plurality of first contact structures in contact with the sources, the drains, and the gates of the plurality of FETs, each of the plurality of first contact structures being electrically conductive; and a plurality of second contact structures in contact with the sources, the drains, and the gates of the plurality of the FETs, each of the plurality of second contact structures being electrically non-conductive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit layout, comprising:
   a first active region having a first plurality of field effect transistors (FETs); and
   an interconnect contacting sources and drains of the first plurality of FETs in the first active region through a first set of contact structures;
   wherein at least one of the first set of contact structures is electrically non-conductive, and wherein the interconnect is a metal ring.

2. The integrated circuit layout of claim 1, further comprising:
   a second active region having a second plurality of FETs;
   wherein the interconnect contacts sources and drains of the second plurality of FETs in the second active region through a second set of contact structures, and at least one of the second set of contact structures is electrically non-conductive.

3. The integrated circuit layout of claim 2, wherein the first active region and the second active region are disposed in a first layer, the interconnect is disposed in a second layer, and the second layer is above the first layer.

4. The integrated circuit layout of claim 2, wherein the first set of contact structures and the second set of contact structures extend in a vertical direction.

5. The integrated circuit layout of claim 1, wherein the metal ring is a rectangular metal ring with four sides, and the first set of contact structures are in contact with a first side of the rectangular metal ring, and the second set of contact structures are in contact with a second side of the rectangular metal ring.

6. The integrated circuit layout of claim 5, wherein the first set of contact structures are in contact with the first side through a first set of metal fingers extending towards the first active region, and the second set of contact structures are in contact with the second side through a second set of metal fingers extending towards the second active region.

7. The integrated circuit layout of claim 2, wherein the first plurality of FETs in the first active region are p-type, and the second plurality of FETs in the second active region are n-type.

8. The integrated circuit layout of claim 2, further comprising:
   a first metal track contacting the sources and the drains of the first plurality of FETs in the first active region through a third set of contact structures; and
   a second metal track contacting the sources and the drains of the second plurality of FETs in the second active region through a fourth set of contact structures;
   wherein at least one of the third set of contact structures and the fourth set of contact structures is electrically non-conductive.

9. The integrated circuit layout of claim 8, wherein the first metal track is coupled to a first power supply and the second metal track is coupled to a second power supply.

10. A method of fabricating an integrated circuit, comprising:
    forming a plurality of FETs;
    forming a plurality of first contact structures in contact with sources, drains, and gates of the plurality of FETs, each of the plurality of first contact structures being electrically conductive; and
    forming a plurality of second contact structures in contact with the sources, the drains, and the gates of the plurality of FETs, each of the plurality of second contact structures being electrically non-conductive.

11. The method of claim 10, wherein forming a plurality of second contact structures comprises:
    forming a first contact layer for each of the second contact structures, the first contact layer being electrically conductive; and
    forming a second contact layer for each of the second contact structures, the second contact layer disposed above the first contact layer and being electrically non-conductive.

12. The method of claim 10, wherein the first contact structures are conductive vertical interconnect accesses (VIAs).

13. An integrated circuit, comprising:
    a logic circuit including a plurality of FETs, an input terminal, and an output terminal, each of the plurality of FETs including a source, a drain, and a gate;
    a plurality of first contact structures in contact with the sources, the drains, and the gates of the plurality of FETs, each of the plurality of first contact structures being electrically conductive; and
    a plurality of second contact structures in contact with the sources, the drains, and the gates of the plurality of FETs, each of the plurality of second contact structures being electrically non-conductive.

14. The integrated circuit of claim 13, wherein each of the plurality of second contact structures includes a first contact layer and a second contact layer disposed above the first contact layer, the first contact layer being electrically conductive and the second contact layer being electrically non-conductive.

15. The integrated circuit of claim 13, wherein at least one of the plurality of first contact structures is connected to the input terminal.

16. The integrated circuit of claim 13, wherein at least one of the plurality of first contact structures is connected to the output terminal.

17. The integrated circuit of claim 13, wherein the plurality of first contact structures are VIAs.

18. The integrated circuit of claim 13, further comprising:
    an interconnect contacting the plurality of first contact structures and the plurality of second contact structures.

19. The integrated circuit of claim 18, wherein the interconnect has a first piece and a second piece, and the first piece and the second piece are not electrically connected.

20. The integrated circuit of claim 19, wherein the first piece has a first node connected to the output terminal, and the second piece has a second node.

* * * * *